US007209388B2

(12) United States Patent  (10) Patent No.: US 7,209,388 B2
Kanda  (45) Date of Patent: Apr. 24, 2007

(54) SEMICONDUCTOR MEMORY DEVICE WITH MOS TRANSISTORS EACH HAVING FLOATING GATE AND CONTROL GATE

(75) Inventor: Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 11/169,633

(22) Filed: Jun. 30, 2005

(65) Prior Publication Data
US 2006/0092724 A1  May 4, 2006

(30) Foreign Application Priority Data
Nov. 1, 2004  (JP) ............................. 2004-318258

(51) Int. Cl.
*G11C 5/14* (2006.01)
(52) U.S. Cl. ........................... 365/185.09; 165/185.23; 165/200
(58) Field of Classification Search ................ 365/200, 365/185.09, 185.21, 185.05, 185.13, 185.23, 365/185.33
See application file for complete search history.

(56) References Cited
U.S. PATENT DOCUMENTS
5,574,729 A * 11/1996 Kinoshita et al. ........... 365/200
5,896,328 A * 4/1999 Tanizaki et al. ........... 365/225.7
5,949,737 A * 9/1999 Casper et al. ............ 365/233.5
6,525,989 B2 * 2/2003 Mizugaki et al. ........ 365/233.5

FOREIGN PATENT DOCUMENTS
JP   7-37398   2/1995
JP   9-16468   1/1997

OTHER PUBLICATIONS
Wei-Hua Liu, et al., "A 2-Transistor Source-select (2TS) Flash EEPROM for 1.8V-Only Applications", Non-Volatile Semiconductor Memory Workshop 4.1, 1997, pp. 1-3.

* cited by examiner

*Primary Examiner*—Anh Phung
*Assistant Examiner*—Hien N Nguyen
(74) *Attorney, Agent, or Firm*—Oblon, Spivak, McClelland, Maier & Neustadt, P.C.

(57) ABSTRACT

A semiconductor memory device includes a row address transition detector. The semiconductor memory device remedies a fault by replacing a column in a memory cell array with a redundancy bit line. The row address transition detector detects a change in a row address signal for selecting the row direction of the memory cell array. Only when a change in the row address signal is detected by the row address transition detector, the redundancy bit line is sensed.

20 Claims, 55 Drawing Sheets

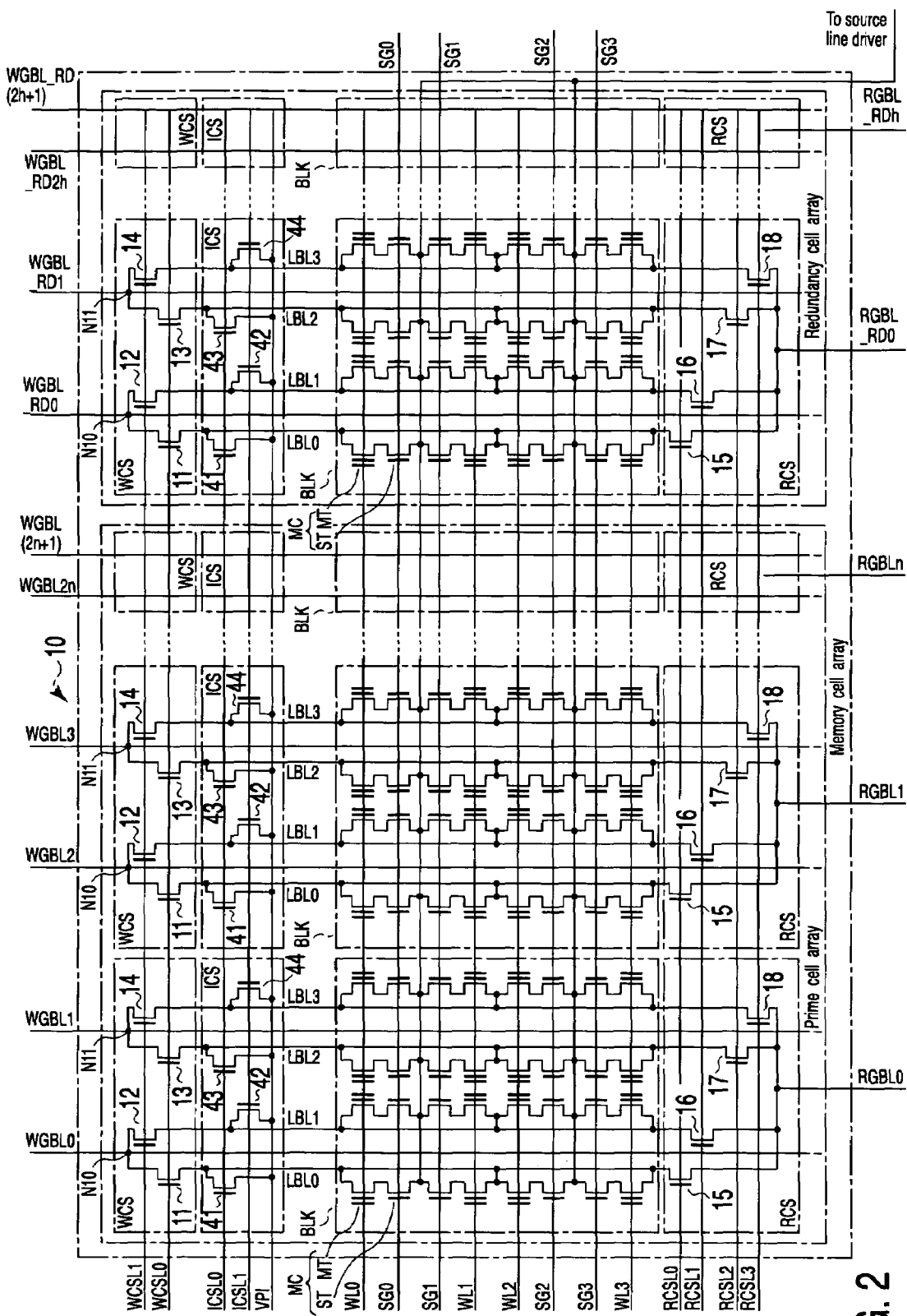
F I G. 2

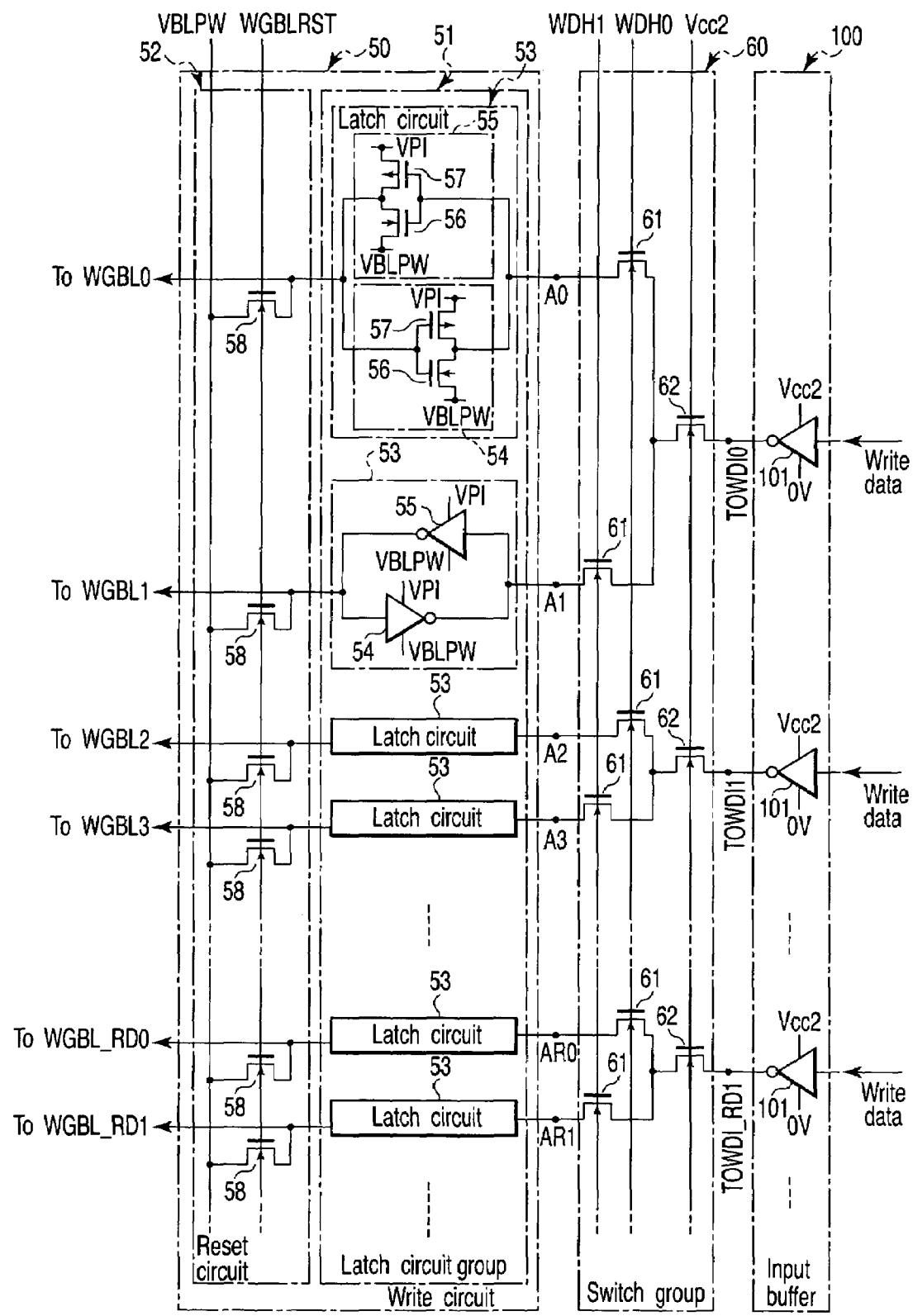
F I G. 3

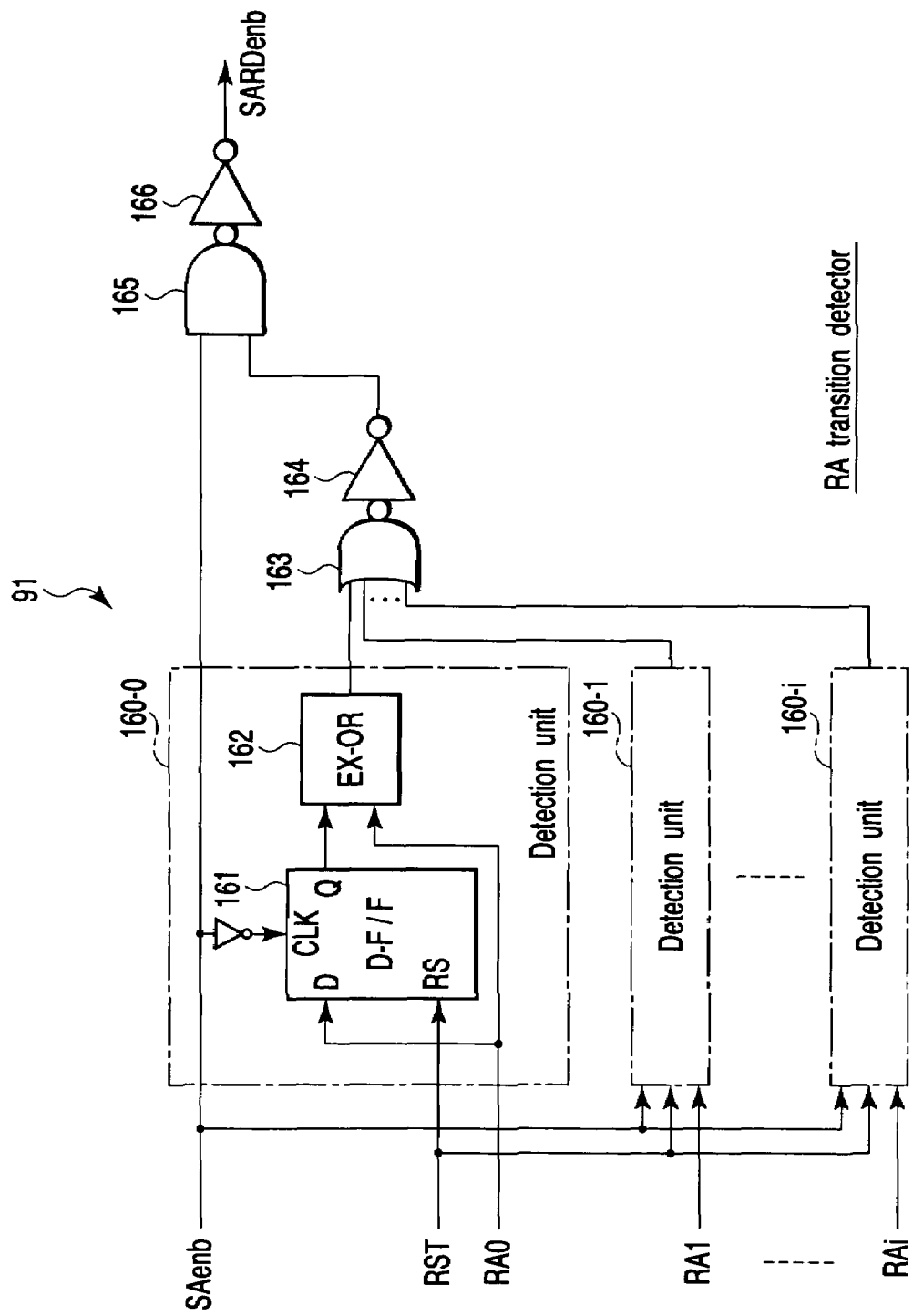
F I G. 5

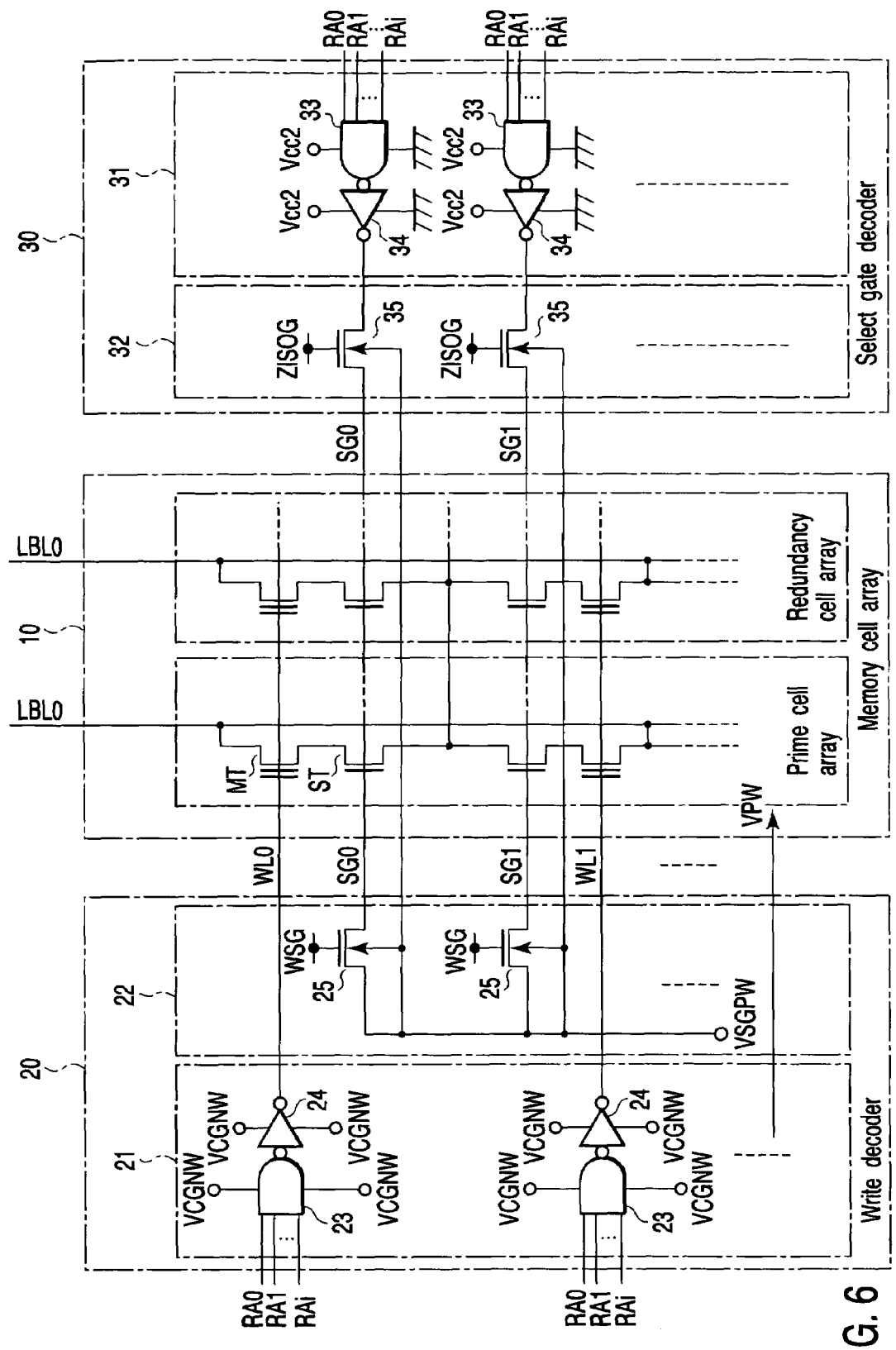
F I G. 6

F I G. 12    WRITE OPERATION

FIG. 13    ERASE OPERATION

FIG. 14    READ OPERATION

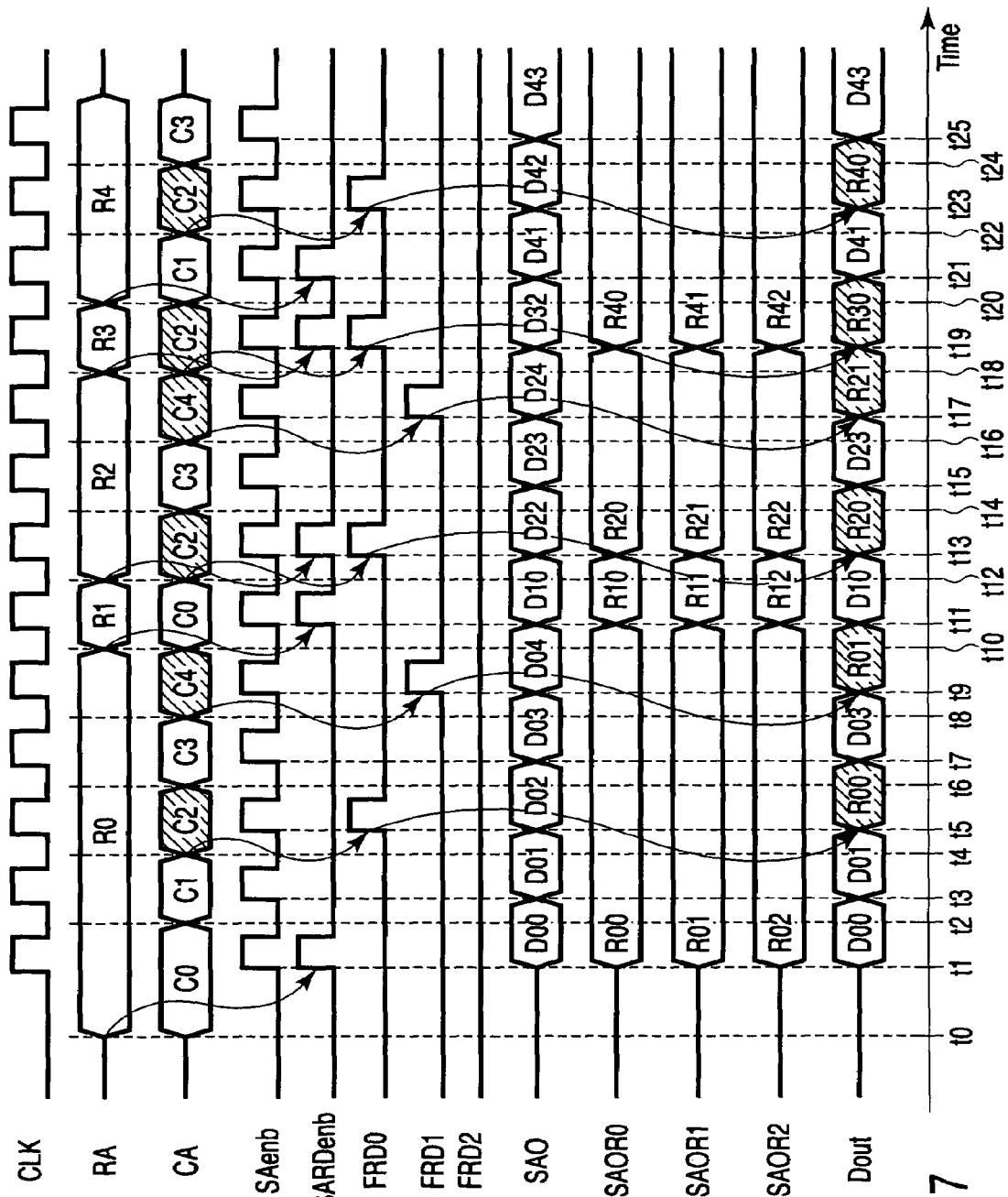
F I G. 17

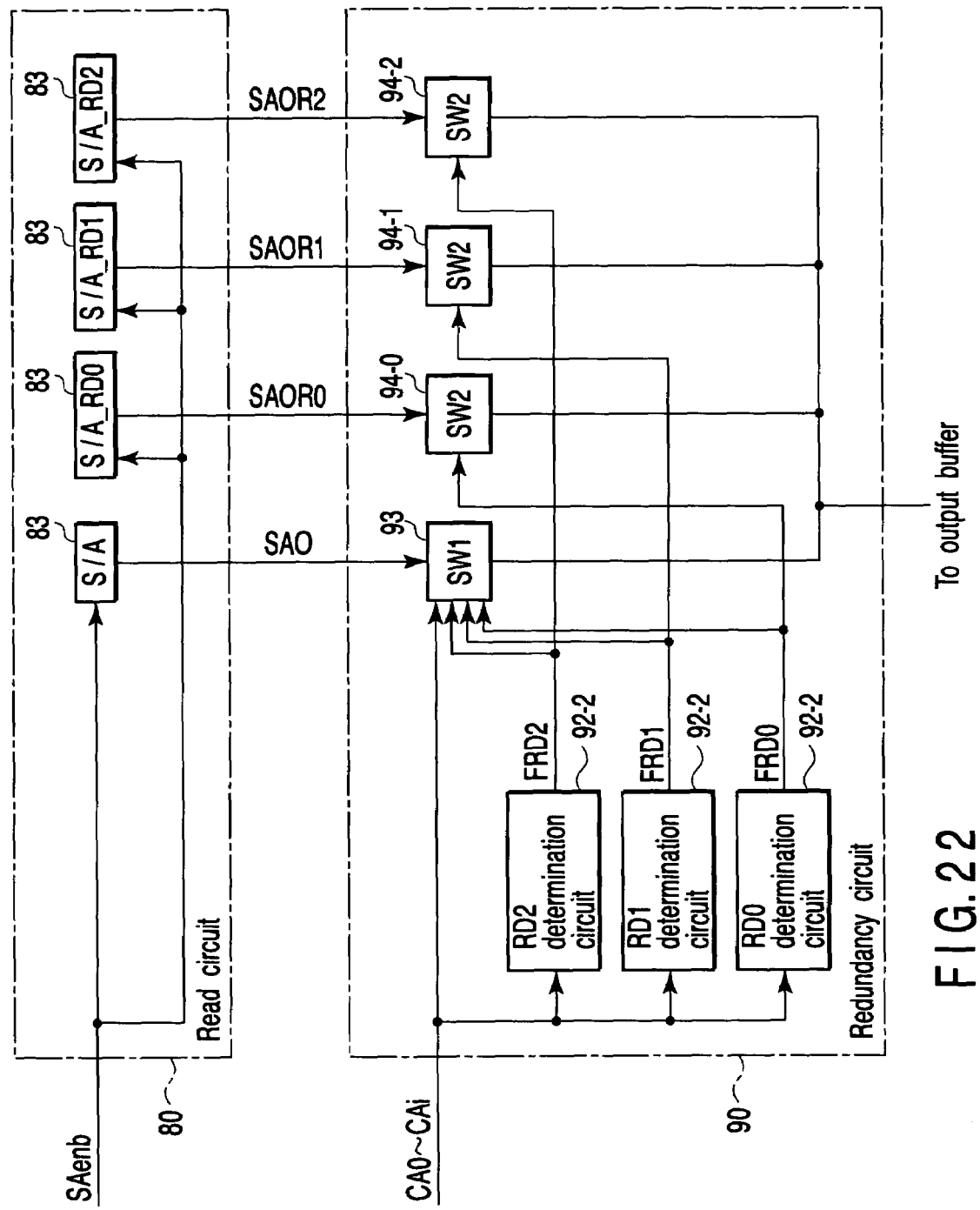
F I G. 22

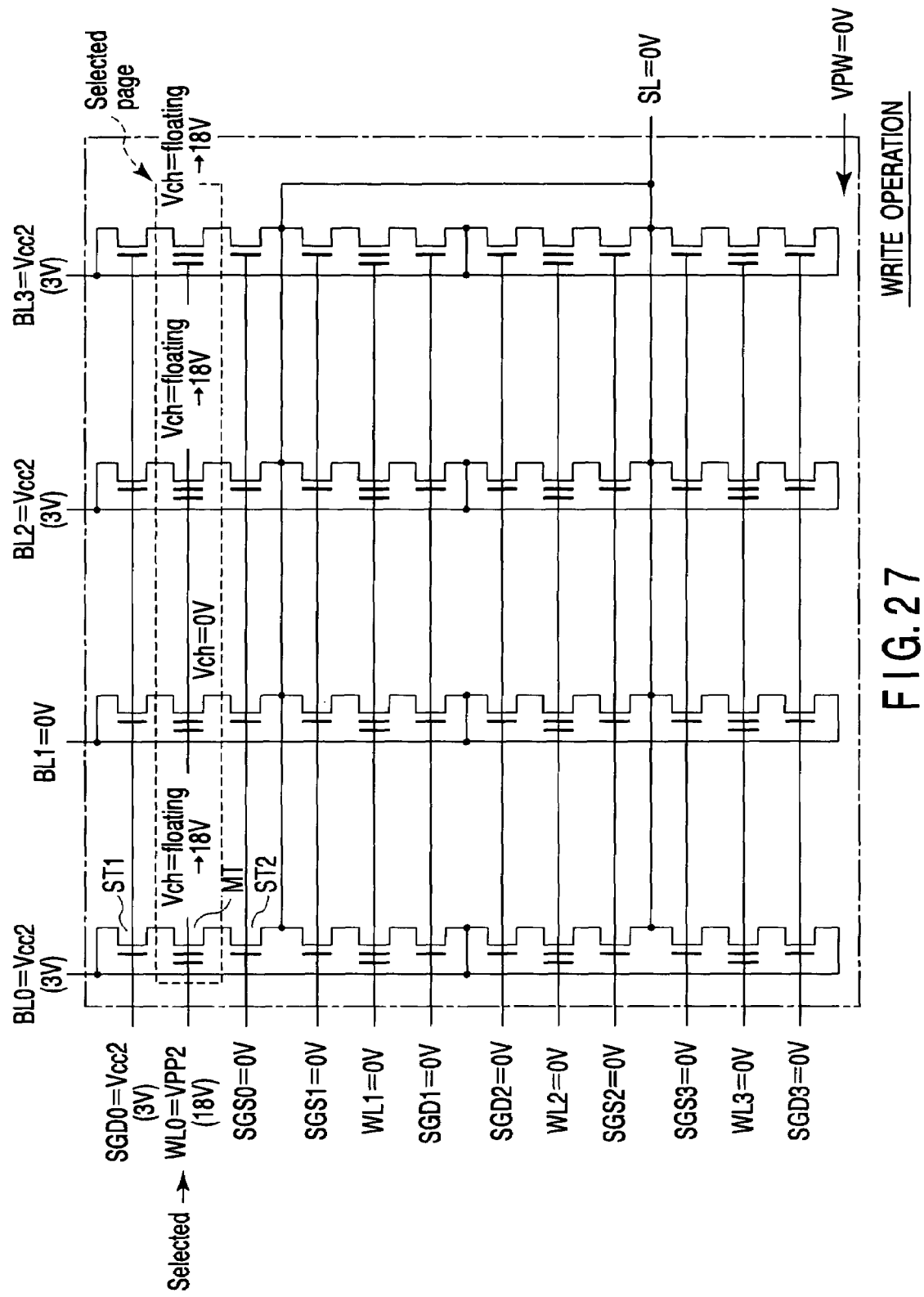
F I G. 27

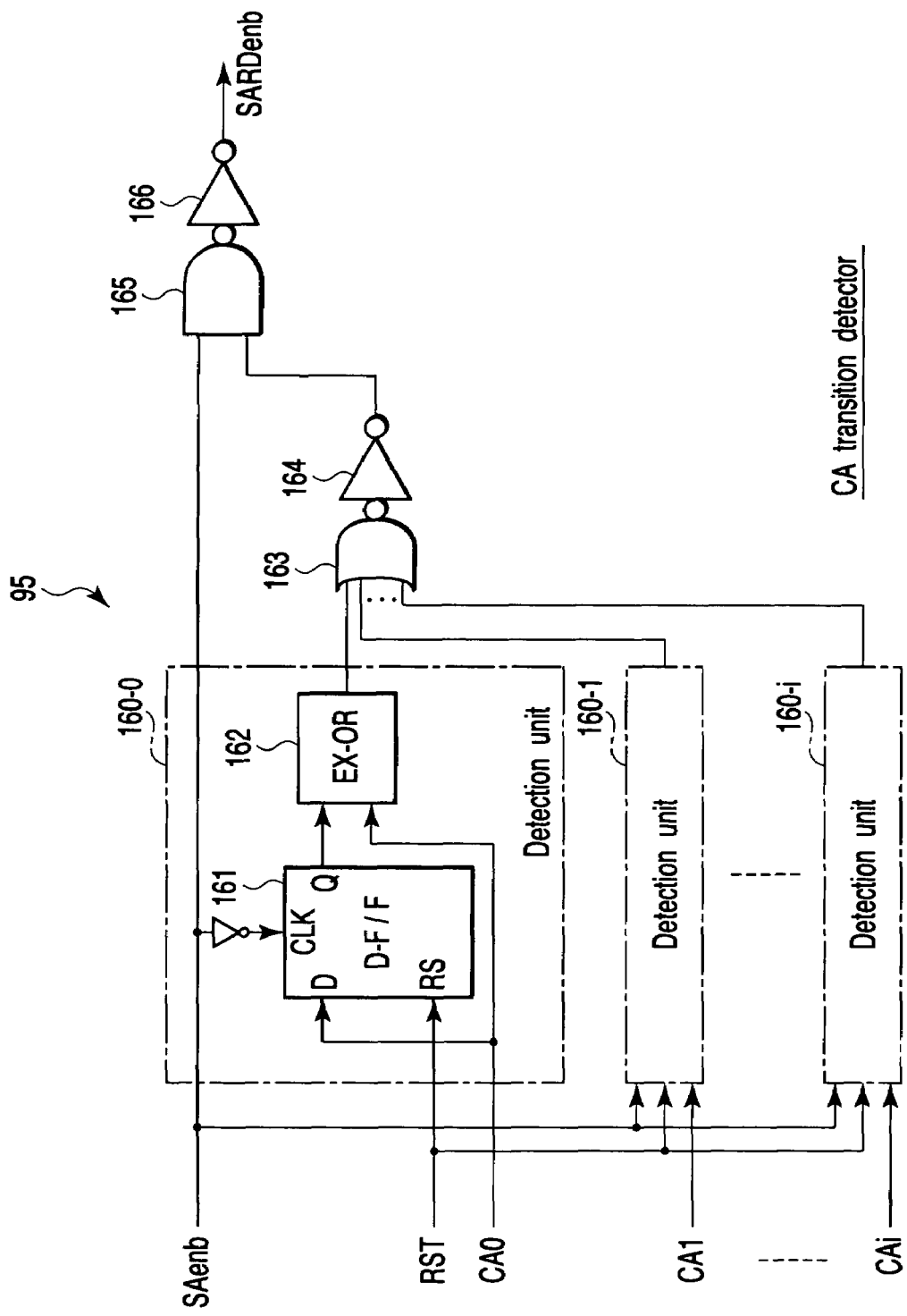
F I G. 34

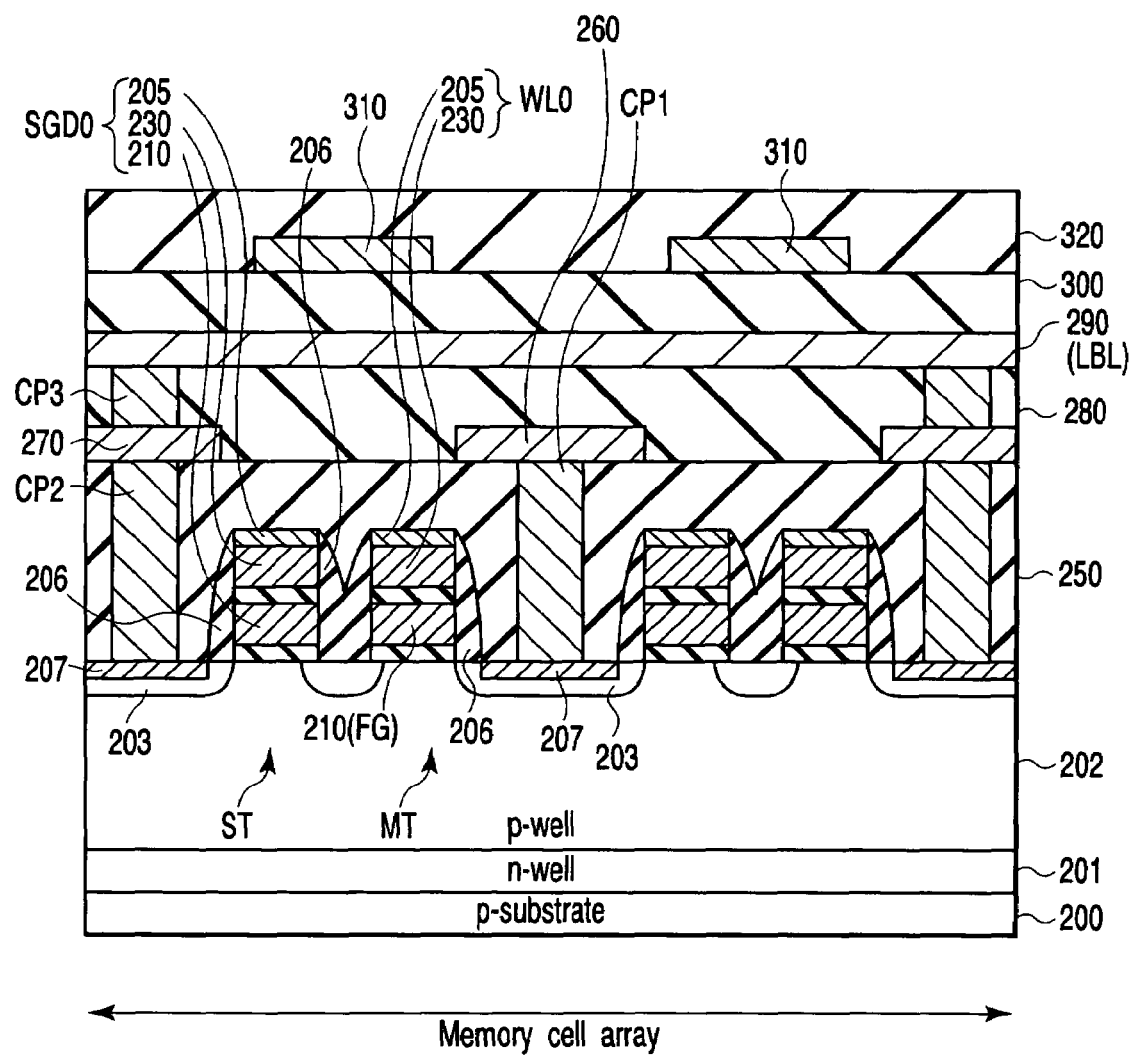
F I G. 49

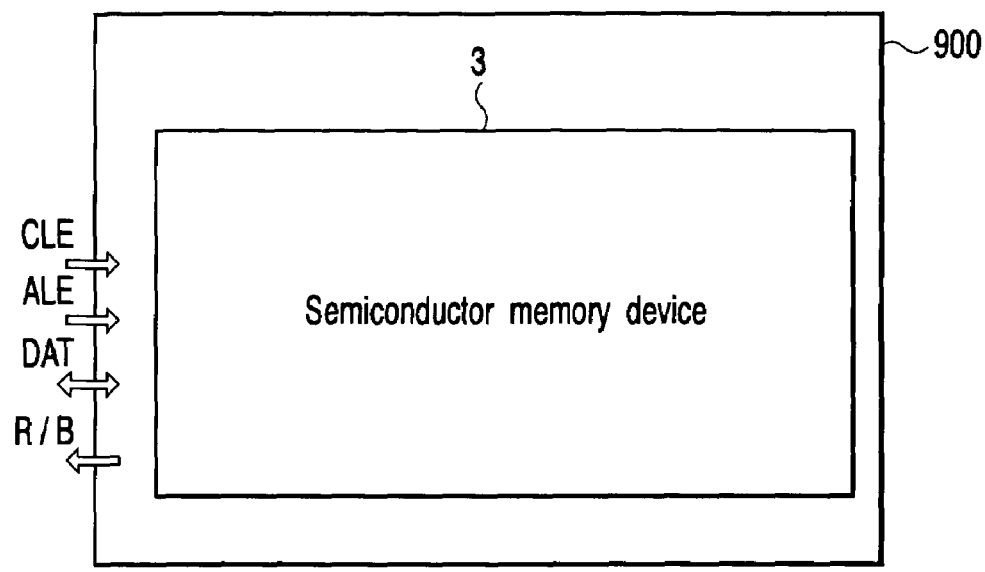
F I G. 5 3
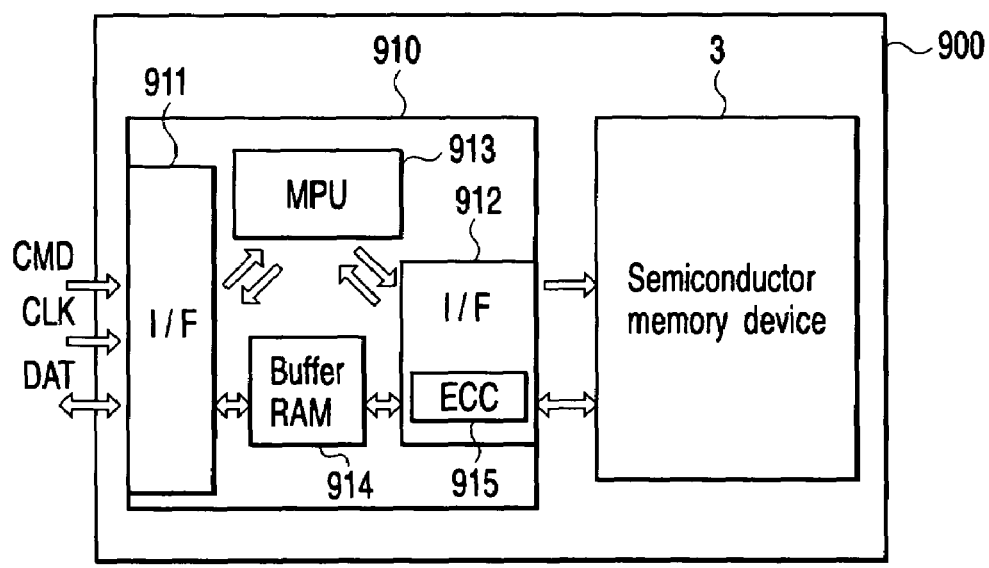
F I G. 5 4

SEMICONDUCTOR MEMORY DEVICE WITH MOS TRANSISTORS EACH HAVING FLOATING GATE AND CONTROL GATE

CROSS-REFERENCE TO RELATED APPLICATIONS

This application is based upon and claims the benefit of priority from prior Japanese Patent Application No. 2004-318258, filed Nov. 1, 2004, the entire contents of which are incorporated herein by reference.

BACKGROUND OF THE INVENTION

1. Field of the Invention

This invention relates to a semiconductor memory device. More specifically, this invention relates to a nonvolatile semiconductor memory device with MOS transistors each having a floating gate and a control gate.

2. Description of the Related Art

NOR and NAND flash memories have been widely used as nonvolatile semiconductor memory devices.

In recent years, a flash memory combining the features of the NOR flash memory and the NAND flash memory has been proposed. This type of flash memory has been disclosed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type (hereinafter, referred to as a 2Tr flash memory) has memory cells each of which includes two MOS transistors. In such a memory cell, one MOS transistor, which functions as a nonvolatile memory section, includes a control gate and a floating gate and is connected to a bit line. The other MOS transistor, which is connected to a source line, is used to select a memory cell.

In semiconductor memory, such as flash memory, redundancy techniques have been widely used to improve the production yield. In the redundancy techniques, redundancy elements are provided in addition to ordinary elements (e.g., memory cells, word lines, column select lines, or I/O lines). If a fault has taken place, ordinary elements are replaced with redundancy elements, thereby remedying the fault. "Redundancy" originally means "an excess of requirements." However, as the technique of replacing defective parts with redundancy elements has been popularized, the technique itself has been called "redundancy technique." Therefore, let the word "redundancy" in this specification mean "a measure to remedy defective parts by using redundancy lines, redundancy cells, or the like."

With the conventional redundancy techniques, however, the power consumption in a read operation is high.

BRIEF SUMMARY OF THE INVENTION

A semiconductor memory device, which remedies a fault by replacing a column in a memory cell array with a redundancy bit line, according to an aspect of the present invention includes:

a row address transition detector which detects a change in a row address signal for selecting the row direction of the memory cell array, the redundancy bit line being sensed only when a change in the row address signal is detected by the row address transition detector.

A memory card according to an aspect of the present invention includes a semiconductor memory device which remedies a fault by replacing a column in a memory cell array with a redundancy bit line, the device including a row address transition detector which detects a change in a row address signal for selecting the row direction of the memory cell array, the redundancy bit line being sensed only when a change in the row address signal is detected by the row address transition detector.

BRIEF DESCRIPTION OF THE SEVERAL VIEWS OF THE DRAWING

FIG. 2 is a circuit diagram of the memory cell array of a 2Tr flash memory according to the first embodiment;

FIG. 3 is a circuit diagram of the write selector, write circuit, and switch group included in the 2Tr flash memory according to the first embodiment;

FIG. 5 is a circuit diagram of the row address transition detector included in the 2Tr flash memory according to the first embodiment;

FIG. 6 is a circuit diagram of the write decoder and select gate decoder included in the 2Tr flash memory according to the first embodiment;

FIG. 17 is a timing chart for various signals in a read operation of the 2Tr flash memory according to the first embodiment;

FIG. 22 is a circuit diagram of the read circuit and redundancy circuit of the 2Tr flash memory according to the first embodiment;

FIG. 27 is a circuit diagram of the memory cell array in a write operation of the 3Tr-NAND flash memory according to the second embodiment;

FIG. 34 is a circuit diagram of the column address transition detector included in the 2Tr flash memory according to the fourth embodiment;

FIG. 49 is a sectional view, taken along a bit line, of a 2Tr flash memory according to the fifth embodiment;

FIG. 53 is a block diagram of a memory card including a flash memory according to the first to fifth embodiments;

FIG. 54 is a block diagram of a memory card including a flash memory according to the first to fifth embodiments;

DETAILED DESCRIPTION OF THE INVENTION

Figure 1:
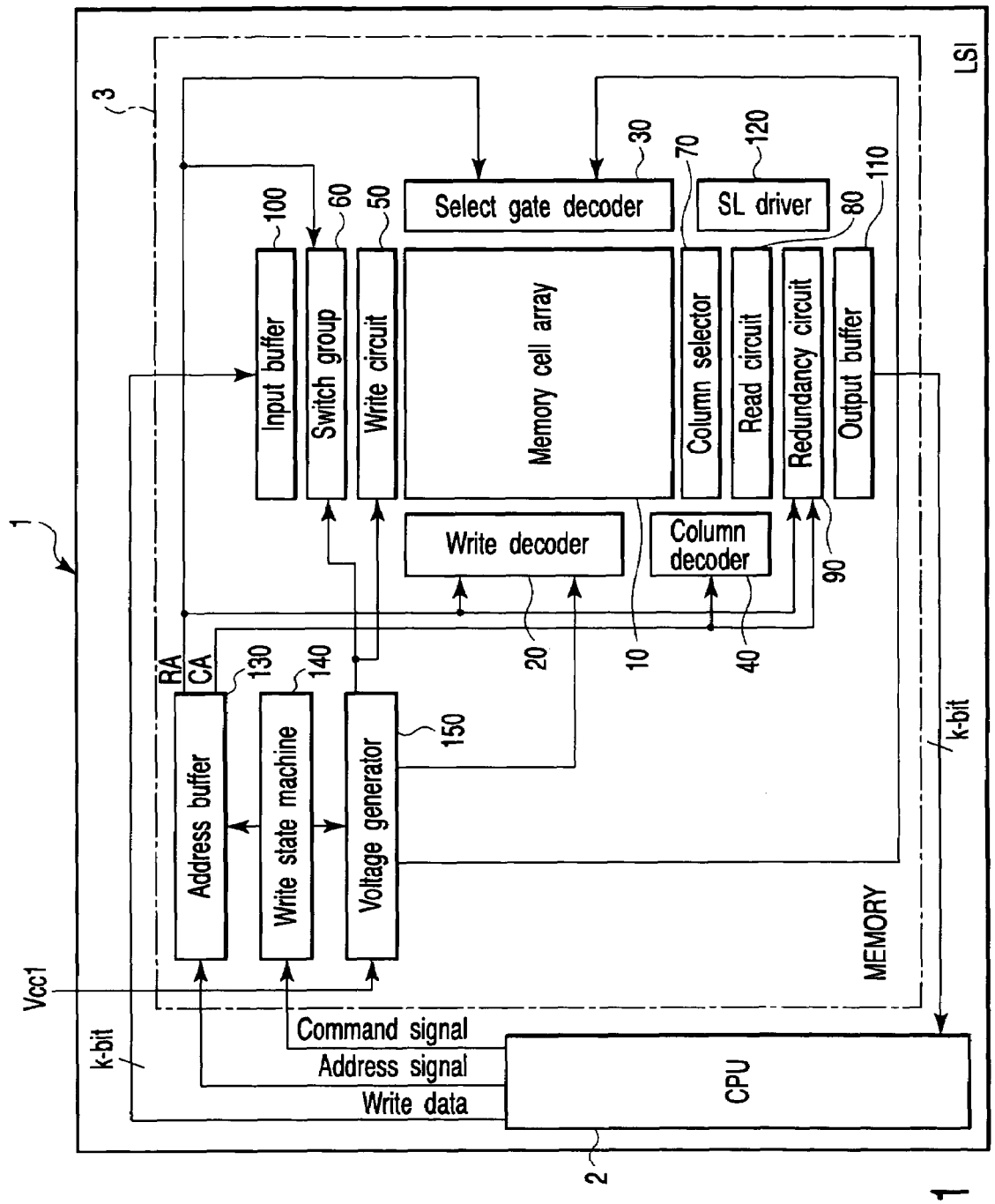
FIG. 1 is a block diagram of a system LSI according to a first embodiment of the present invention.

Referring to FIG. 1, a semiconductor memory device according to a first embodiment of the present invention will be explained. FIG. 1 is a block diagram of a system LSI according to the first embodiment.

As shown in FIG. 1, the system LSI 1 comprises a CPU 2 and a 2Tr flash memory 3. The CPU 2 exchanges data with the flash memory 3. The flash memory 3 comprises a memory cell array 10, a write decoder 20, a select gate decoder 30, a column decoder 40, a write circuit 50, a switch group 60, a column selector 70, a read circuit 80, a redundancy circuit 90, an input buffer 100, an output buffer 110, a source line driver 120, an address buffer 130, a write state machine 140, and a voltage generator 150. A voltage of Vcc1 (1.25 to 1.65V) is externally applied to the LSI 1. The voltage Vcc1 is applied to the voltage generator 150.

The memory cell array 10 has a plurality of memory cells arranged in a matrix. Using FIG. 2, the configuration of the memory cell array 10 will be explained. FIG. 2 is a circuit diagram of a part of the memory cell array 10.

As shown in FIG. 2, the memory cell array 10 has a main cell array (hereinafter, referred to as the prime cell array PCA) and a cell array to be replaced with the prime cell array if the latter malfunctions (hereinafter, referred to as the redundancy cell array RCA).

The prime cell array PCA has (m+1)×(n+1) memory cell blocks BLK (m and n are natural numbers). The prime cell array PCA further has write column selectors WCS, read column selectors RCS, and write inhibit column selectors ICS, which are provided for the memory cell blocks BLK in a one-to-one correspondence. The redundancy cell array RCA has (m+1)×(h+1) memory cell blocks BLK (h is a natural number). The redundancy cell array RCA further has write column selectors WCS, read column selectors RCS, and write inhibit column selectors ICS, which are provided for the memory cell blocks BLK in a one-to-one correspondence.

Each of the memory cell blocks BLK includes a plurality of memory cells MC. The memory cells MC constitute the memory cells of a 2Tr flash memory. Specifically, each of the memory cells MC includes a memory cell transistor MT and a select transistor ST. The source of the memory cell transistor MT is connected to the drain of the select transistor ST. The memory cell transistor MT has a stacked gate structure that includes a floating gate formed on a semiconductor substrate with a gate insulating film interposed therebetween and a control gate formed on the floating gate with an inter-gate insulating film interposed therebetween.

Memory cells MC adjoining each other in the column direction share the drain region of the memory cell transistor MT or the source region of the select transistor ST. Each of the memory cell blocks BLK includes (4×4) memory cells MC. Although the number of memory cells MC arranged in the column direction is 4 in FIG. 2, this is illustrative and not restrictive. For instance, the number of memory cells MC may be 8 or 16. The drain regions of the memory cell transistors MT of memory cells MC arranged in four columns are connected to four local bit lines LBL0 to LBL3 in a one-to-one correspondence. One end of each of local bit lines LBL0 to LBL3 is connected to a write column selector WCS and the other end is connected to a read column selector RCS. Hereinafter, to distinguish the memory cells in the prime cell array PCA from the memory cells in the redundancy cell array RCA, the former are called the prime cells PC and the latter the redundancy cells RC.

In the memory cell array 10, the control gates of the memory cell transistors MT in a same row are connected commonly to any one of word lines WL0 to WL(4m+3). Each of the local bit lines LBL0 to LBL3 connect the memory cell transistors to one another only in each of the memory cell blocks BLK, whereas each of the word lines WL connects the memory cell transistors MT in the same row to one another even across the memory cell blocks BLK. Furthermore, the word lines connect the memory cell transistors to one another between the prime cell array PCA and the redundancy cell array RCA.

The gates of the select transistors ST in a same row in the memory cell array 10 are connected commonly to any one of the select gate lines SG0 to SG(4m+3). Each of the select gate lines connects the gates of the select transistors ST in a row to one another even across the memory cell blocks BLK. Furthermore, the select gate lines SG0 to SG(4m+3) connect the gates of the select transistors to one another between the prime cell array PCA and the redundancy cell array RCA.

Specifically, as shown in FIG. 2, the redundancy cell array RCA is provided at one end of the memory call array 10 and shares the word lines and select gate liens with the prime cell array PCA.

Word lines WL0 to WL(4m+3) are connected to the write decoder 20. One end of each of the select gate lines SG0 to SG(4m+3) is connected to the select gate decoder 30 and the other end is connected to the write decoder 20. The source regions of the select transistors ST are connected to one another across a plurality of memory cell blocks BLK and are connected to the source line driver 120.

Next, the configuration of the write column selector WCS will be explained. Each of the write column selectors WCS includes four MOS transistors 11 to 14. One end of the current path of each of the MOS transistors 11 to 14 is connected to one end of the corresponding one of local bit lines LBL0 to LBL3. The other ends of the current paths of the MOS transistors 11 and 12 are connected to each other and the other ends of the current paths of the MOS transistors 13 and 14 are connected to each other. Hereinafter, the common junction node of the MOS transistors 11 and 12 is called node N10 and the common junction node of the MOS transistors 13 and 14 is called node N11. The gates of the MOS transistors 11 to 14 are connected to any one of write column select lines WCSL0 to WCSL(2m+1). The MOS transistors 11, 13 included in the write column selectors WCS in a row are connected to the same one of the write column select lines WCSL(l−1) (l: 1, 3, 5, . . . ). The MOS transistors 12, 14 included in the write column selectors WCS in the same row are connected to the same one of the write column select lines WCSL1. One of the write column select lines WCSL0 to WCSL(2m+1) is selected by the column decoder 40 in a write operation. The write column select lines WCSL0 to WCSL(2m+1) are connected to one another between the prime cell array PCA and the redundancy cell array RCA.

Each of the nodes N10, N11 in the prime cell array PCA is connected to any one of write global bit lines WGBL0 to WGBL(2n+1). Each of the nodes N10, N11 in the redundancy cell array RCA is connected to any one of redundancy write global bit lines WGBL_RD0 to WGBL_RD(2h+1). Each of the write global bit lines WGBL0 to WGBL(2n+1) is connected commonly to the nodes N10 or nodes N11 of the write column selectors WCS in a same column. Each of the redundancy write global bit lines WGBL_RD0 to WGBL_RD(2h+1) is connected commonly to the nodes N10 or nodes N11 of the write column selectors WCS in the same column.

Next, the configuration of a read column selector RCS will be explained. Each of the read column selectors RCS includes four MOS transistors 15 to 18. One end of the current path of each of the MOS transistors 15 to 18 is connected to the other end of the corresponding one of the local bit lines LBL0 to LBL3. The other ends of the current paths of the MOS transistors 15 and 18 are connected to each other. Hereinafter, the common junction node of the MOS transistors 15 and 18 is called node N20. Each of the gates of the MOS transistors 15 to 18 is connected to a different one of the read column select lines RCSL0 to RCSL(4m+3). Each of the MOS transistors 15 to 18 included in the read column selectors RCS in a row is connected to the same one of the read column select lines RCSL0 to RCSL(4m+3). One of the read column select lines RCSL0 to RCSL(4m+3) is selected by the column decoder 40 in a read operation. The read column select lines RCSL0 to RCSL(4m+3) are connected to one another between the prime cell array PCA and the redundancy cell array RCA.

Node 20 in the prime cell array PCA is connected to any one of the read global bit lines RGBL0 to RGBLn. On the other hand, node 20 in the redundancy cell array RCA is connected to redundancy read global bit lines RGBL_RD0 to RGBL_RDh. Each of the read global bit lines RGBL0 to RGBLn and redundancy read global bit lines RGBL_RD0 to RGBL_RDh connects commonly the nodes N20 of the write column selectors RCS in a same column.

Next, the configuration of a write inhibit column selector ICS will be explained. Each of the write inhibit column selectors ICS includes four MOS transistors 41 to 44. One end of the current path of each of the MOS transistors 41 to 44 is connected to the corresponding one of the local bit lines LBL0 to LBL3. A write inhibit voltage VPI is applied commonly to the other ends of the current paths of the MOS transistors 41 and 44. The write inhibit voltage VPI is generated by the voltage generator 150. The gates of the MOS transistors 41 to 44 are connected to any one of the write inhibit column select lines ICSL0 to ICSL(2m+1). The MOS transistors 41, 43 included in the write inhibit column selectors ICS in a same row are connected to the same one of the write column select lines ICSL(l−1) (l: 1, 3, 5, . . . ). The MOS transistors 42, 44 included in the write column selectors ICS in the same row are connected to the same one of the write column select lines ICSL1. One of the write inhibit column select lines ICSL0 to ICSL(2m+1) is selected by the column decoder 40 in a write operation. Write inhibit column select lines ICSL0 to ICSL(2m+1) are connected to one another between the prime cell array PCA and the redundancy cell array RCA.

The configuration of the memory cell array 10 can also be explained as follows. In the memory cell array 10, a plurality of memory cells MC are arranged in a matrix. The control gates of the memory cell transistors MC of the memory cell MCs in a same row are connected commonly to a word line. The gates of the select transistors of the memory cells in the same row are connected to a select gate line. The drains of the memory cell transistors MT of four memory cells MC in a same column are connected commonly to any one of the local bit lines LBL0 to LBL3. Specifically, the memory cells MC in the memory cell array 10 are connected to a different one of the local bit lines LBL0 to LBL3 every four memory cells MC arranged in a line. Then, one end of each of the local bit lines LBL0 in a same column and one end of each of the local bit lines LBL1 in the same column are connected commonly to any one of the write global bit lines WGBL0 to WGBL2n via the MOS transistors 11, 12, respectively. Moreover, one end of each of the local bit lines LBL2 in a same column and one end of each of the local bit lines LBL3 in the same column are connected commonly to any one of the write global bit lines WGBL1 to WGBL(2n+1) via the MOS transistors 13, 14, respectively. The other ends of local bit lines LBL0 to LBL3 in the same column are connected commonly to any one of the read global bit lines RGBL0 to RGBLn via the MOS transistors 15 to 18. Furthermore, local bit lines LBL0 to LBL3 are connected via the MOS transistors 41 to 44 to write inhibit nodes, respectively. Then, the sources of the select transistors ST of the memory cells MC are connected to one another and then are connected to the source line driver. In the memory cell array with the above configuration, four columns of four memory cells MC connected to the same local bit line constitute a single memory cell block BLK. The memory cell blocks in a column are connected to a common write global bit line and a common read global bit line. The memory cell blocks BLK in a different column are connected to a different write global bit line and a different read global bit line. In the above configuration, a plurality of memory cell blocks BLK function as the prime cell array PCA. A plurality of memory cell blocks BLK which are connected to the write global bit lines and read global bit lines different from those in the prime cell array and share the word lines and select gate lines with the prime cell array functions as the redundancy cell array RCA. The number of memory cells in a memory cell block, the number of read global bit lines RGBL, and the number of write global bit lines WGBL are not limited to those in the embodiment.

Referring to FIG. 1, the explanation will be continued. The write circuit 50 not only latches write data but also resets the write global bit lines WGBL.

The input buffer 100 holds the write data supplied from the CPU 2.

The switch group 60 transfers the write data held in the input buffer 100 to the write circuit 50.

Using FIG. 3, the configuration of the write circuit 50, switch group 60, and input buffer 100 will be explained. FIG. 3 is a circuit diagram of the write circuit 50, switch group 60, and input buffer 100.

First, the write circuit 50 will be explained. The write circuit 50 includes a latch circuit group 51 and a reset circuit 52. The latch circuit group 51 includes latch circuits 53 provided for write global bit lines WGBL0 to WGBL(2n+1) and redundancy write global bit lines WGBL_RD0 to WGBL_RD(2h+1) in a one-to-one correspondence. Each of the latch circuits 53 has two inverters 54, 55. The input terminal of the inverter 54 is connected to the output terminal of the inverter 55. The output terminal of the inverter 54 is connected to the input terminal of the inverter 55. The junction node of the input terminal of the inverter 54 and the output terminal of the inverter 55 makes the output node of the latch circuit 53, which is connected to the corresponding write global bit line and redundancy write global bit line. Each of the inverters 54, 55 has an n-channel MOS transistor 56 and a p-channel MOS transistor 57 whose current paths are connected in series. The source of the n-channel MOS transistor 56 is connected to VBLPW node and the source of the p-channel MOS transistor 57 is connected to the write inhibit voltage node VPI. The gate of the n-channel MOS transistor 56 and the gate of the p-channel MOS transistor 57 are connected to each other. Then, the junction node of the drain of the p-channel MOS transistor 57 and the drain of the n-channel MOS transistor 56 in the inverter 55 is connected to the junction node of the gate of p-channel MOS transistor 57 and the gate of n-channel MOS transistor 56 in the inverter 54 and is further connected to a write global bit line and a redundancy write global bit line. In addition, the junction node of the drain of the p-channel MOS transistor 57 and the drain of the n-channel MOS transistor 56 in the inverter 54 is connected to the junction node of the gate of the p-channel MOS transistor 57 and the gate of the n-channel MOS transistor 56 in the inverter 55. This junction node makes the input node of the latch circuit 53.

The reset circuit 52 includes n-channel MOS transistors 58 provided for write global bit lines WGBL0 to WGBL(2n+1) and redundancy write global bit lines WGBL_RD0 to WGBL_RD(2h+1) in a one-to-one correspondence. The drains of the n-channel MOS transistors 58 are connected to the corresponding write global bit lines or redundancy write global bit lines. Their sources are connected commonly to VBLPW node and their gates are connected commonly to WGBLPST node.

The switch group 60 includes n-channel MOS transistors 61 provided for the latch circuits 53 in a one-to-one correspondence and n-channel MOS transistors 62. One end of each of the MOS transistors 61 is connected to the input node of the corresponding latch circuit 53. The other ends of the current paths of the two MOS transistors 61 connected to adjacent latch circuits are connected to each other. That is, the MOS transistors 61 connected to the latch circuits 53 corresponding to write global bit lines WGBL0, WGBL1 share the other end of their current path. The same holds true for the MOS transistors 61 connected to the latch circuits 53 corresponding to write global bit lines WGBL2, WGBL3. In addition, the MOS transistors 61 connected to the latch circuits 53 corresponding to redundancy write global bit lines WGBL_RD0, WGBL_RD1 share the other end of their current path. The same holds true for the MOS transistors 61 connected to the latch circuits 53 corresponding to redundancy write global bit lines WGBL_RD2, WGBL_RD3.

The gates of the MOS transistors 61 connected to the latch circuits 53 corresponding to write global bit lines WGBL(l−1) (l=1, 3, 5, . . . ) are connected commonly to WDH0 node. The gates of the MOS transistors 61 connected to the latch circuits 53 corresponding to write global bit lines WGBL1 are connected commonly to WDH1 node. In addition, the gates of the MOS transistors 61 connected to the latch circuits 53 corresponding to redundancy write global bit lines WGBL_RD(l−1) (l=1, 3, 5, . . . ) are connected commonly to WDH0 node. The gates of the MOS transistors 61 connected to the latch circuits 53 corresponding to redundancy write global bit lines WGBL_RD1 are connected commonly to WDH1 node. The other ends of the current paths of the MOS transistors 61 connected to one another are connected to one end of the current path of a MOS transistor 62. A positive voltage Vcc2 (about 3V) is applied to the gates of the MOS transistors 62 at the same time. The positive voltage Vcc2 is, for example, generated by the voltage generator 150. Hereinafter, the junction nodes of the MOS transistors 61 corresponding to the write global bit lines and the input nodes of the latch circuits 53 are referred to as nodes A0 to A(2n+1). In addition, the junction nodes of the MOS transistors 61 corresponding to the redundancy write global bit lines and the input nodes of the latch circuits 53 are referred to as nodes AR0 to AR(2h+1).

Next, the input buffer 100 will be explained. The input buffer 100 includes inverters 101 provided for the MOS transistors 62 in the switch group 60 in a one-to-one correspondence. The write data supplied from the CPU2 is input to the input node of the inverter 101. The output node of the inverter 101 is connected to the other end of the current path of the MOS transistor 62. The inverter 101 operates with a high-voltage-side power supply potential of Vcc2 and a low-voltage-side power supply potential of 0V. Hereinafter, the junction nodes of the output nodes of the inverters 101 corresponding to the write global bit lines and the MOS transistors 62 are called nodes TOWDI0 to TOWDI((2n+1)/2). In addition, the junction nodes of the output nodes of the inverters 101 corresponding to the redundancy write global bit lines and the MOS transistors 62 are called nodes TOWDI_RD0 to TOWDI_RD((2h+1)/2).

Referring to FIG. 1, the explanation of the LSI 1 will be continued.

The column decoder 40 decodes a column address signal, thereby producing a column address decode signal. On the basis of the column address decode signal, the column select lines WCSL, RCSL, ICSL are selected.

In a read operation, on the basis of the column address decode signal, the column selector 70 selects any one of the read global bit lines RGBL0 to RGBLn.

In a read operation, the read circuit 80 precharges read global bit lines RGBL0 to RGBLn and redundancy read global bit lines RGBL_RD0 to RGBL_RDh. Then, the read circuit 80 amplifies the data read onto read global bit lines RGBL0 to RGBLn and redundancy read global bit lines RGBL_RD0 to RGBL_RDh.

In a read operation, the redundancy circuit 90 determines whether to replace any one of the read global bit lines RGBL0 to RGBLn with any one of the redundancy read global bit lines RGBL_RD0 to RGBL_RDh. Then, the redundancy circuit 90 outputs the read-out data selected on the basis of the result of the determination to the output buffer 110.

Figure 4:
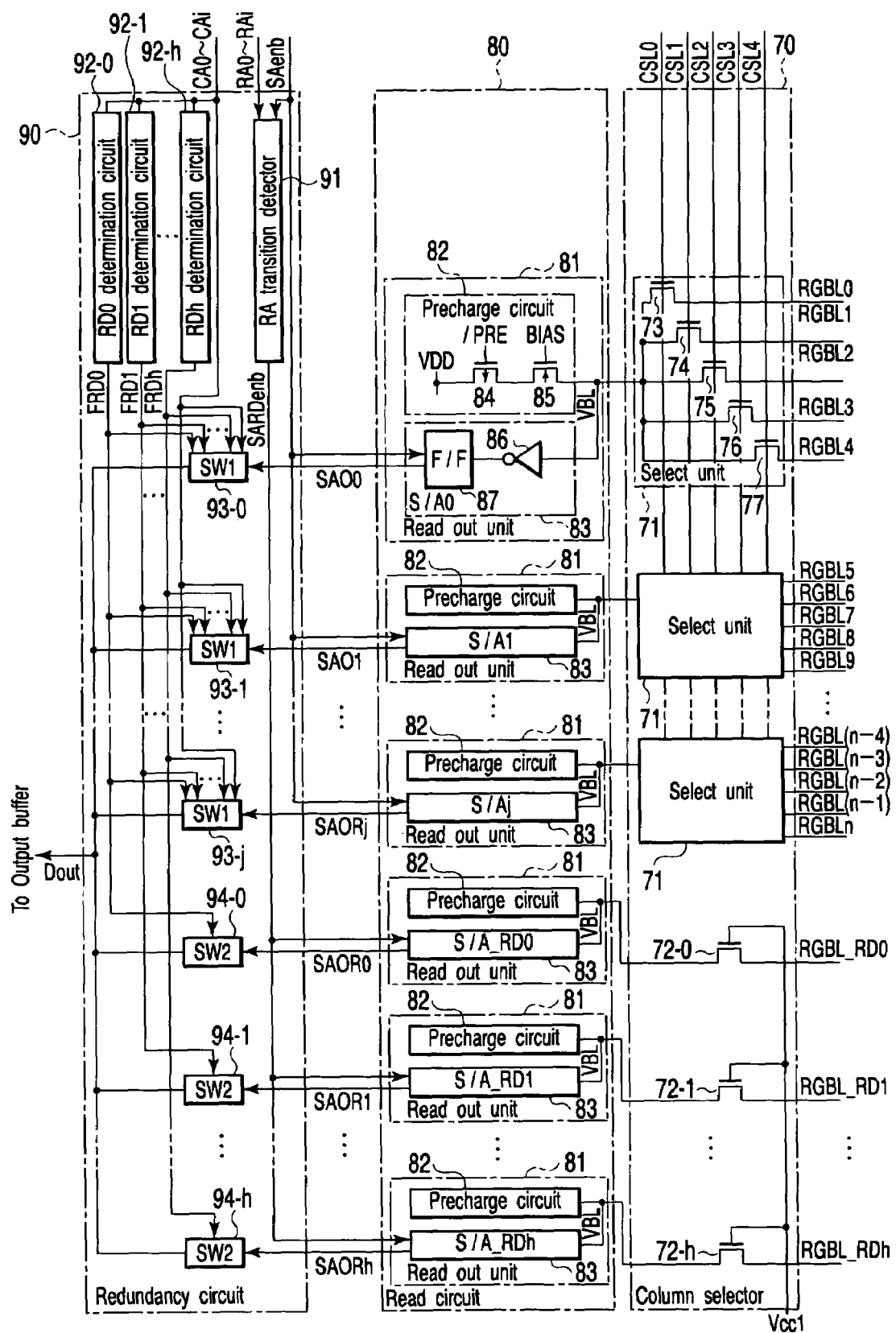
FIG. 4 is a circuit diagram of the column selector, read circuit, and redundancy circuit included in the 2Tr flash memory according to the first embodiment.

Using FIG. 4, the configuration of the column selector 70, read circuit 80, and redundancy circuit 90 will be explained. FIG. 4 is a circuit diagram of the column selector 70, read circuit 80, and redundancy circuit 90.

The column selector 70 includes select units 71 provided in units of global bit lines and MOS transistors 72-2 to 72-h provided for redundancy read global bit lines RGBL_RD0 to RGBL-RDh in a one-to-one correspondence. In the example of FIG. 4, although one select unit 71 is provided for every five read global bit lines (RGBL0 to RGBL4, RGBL5 to RGBL9, RGBL10 to RGBL14, . . . ), the number of read global bit lines is not limited to five. Hereinafter, explanation will be given using the case of FIG. 4 as an example.

Each of the select units 71 includes MOS transistors 73 to 77 provided for five global bit lines in a one-to-one correspondence. One end of each of the current paths of the MOS transistors 73 to 77 is connected to the corresponding one of the five read global bit lines. The other ends of them are connected to one another. The gates of the MOS transistors 73 to 77 are connected to column select lines CSL0 to CSL4 respectively across a plurality of select units 71. Column select lines CSL0 to CSL4 are connected to the column decoder 40.

One end of the current path of each of the MOS transistors 72-0 to 72-h is connected to the corresponding one of the redundancy read global bit lines RGBL_RD0 to RGBL_RDh. Vcc1 is applied to the gates of the MOS transistors 72-0 to 72-h. Thus, in a read operation, the MOS transistors 72-0 to 72-h are made on.

Next, the configuration of the read circuit 80 will be explained. The read circuit 80 includes read units 81 provided for the select units 71 and MOS transistors 72-0 to 72-h in the column selector 70 in a one-to-one correspondence. Each of the read units 81 is connected to the common junction node of the other ends of the current paths of the MOS transistors 73 to 77 in the column selector 70 or to the common junction node of the other ends of the current paths of the MOS transistors 72-0 to 72-h in the column selector 70. Each of the read units 81 includes a precharge circuit 82 and a sense amplifier 83.

In a read operation, the precharge circuit 82 precharges the read global bit line selected by the select unit 71 of the column selector 70 and redundancy read global bit lines. The precharge circuit 82 includes a p-channel MOS transistor 84 and an n-channel MOS transistor 85. The source of the p-channel MOS transistor 84 is connected to a power supply voltage VDD (e.g., 1.3V). A precharge signal /PRE is input to its gate. The drain of the n-channel MOS transistor 85 is connected to the drain of the MOS transistor 84. A bias signal BIAS is input to its gate.

In a read operation, the sense amplifier 83 amplifies the data read onto the read global bit line selected by the select unit 71 of the column selector 70 and onto the redundancy read global bit lines RGBL_RD0 to RGBL_RDh. The sense amplifier 83 includes an inverter 86 and a flip-flop 87. The input node of the inverter 86 is connected to the source of the MOS transistor 85. The output node of the inverter 86 is connected to the input node of the flip-flop 87. The amplified read data is output at the output node of the flip-flop 87.

That is, in a read operation, the column selector 70 connects read global bit lines RGBL0 to RGBLn selected in one in five lines to the precharge circuit 82 and sense amplifier 83. In addition, all of redundancy read global bit lines RGBL_RD0 to RGBL_RDh are connected to the precharge circuits 82 and sense amplifiers 83. Hereinafter, the sense amplifiers 83 provided for the read global bit lines RGBL0 to RGBLh are referred to as sense amplifiers S/A0 to S/Aj (j=((n+1)/5)−1). The sense amplifiers 83 provided for redundancy read global bit lines RGBL_RD0 to RGBL_RDh in a one-to-one correspondence are referred to as sense amplifiers S/A_RD0 to S/A_RDh. In addition, the outputs of the sense amplifiers S/A0 to S/Aj are referred to as SAO0 to SAOj. The outputs of the sense amplifiers S/A_RD0 to S/A_RDh are referred to as SAOR0 to SAORh.

Next, the redundancy circuit 90 will be explained. The redundancy circuit 90 includes a row address transition detector 91, redundancy determination circuits 92-0 to 92-h, and switch circuits 93-0 to 93-j, 94-0 to 94-h.

The row address transition detector 91 monitors the row address signal RA. When the row address signal RA changes, the row address transition detector 91 generates a sense amp enable signal SARDenb to enable sense amplifiers S/A_RD0 to S/A_RDh. The sense amp enable signal SARDenb is output in synchronization with a sense amp enable signal SAenb to enable sense amplifiers S/A0 to S/Aj.

The sense amp enable signal SAenb is supplied to sense amplifiers S/A0 to S/Aj. The sense amp enable signal SARDenb is supplied to sense amplifiers S/A_RD0 to S/ARDh.

The redundancy determination circuits 92-0 to 92-i monitor the column address signal CA. In a read operation, if a column address signal CA indicates a faulty read global bit line, the read global bit line is replaced with a redundancy read global bit line. Each of the redundancy read global bit lines RGBL_RD0 to RGBL_RDh is allocated a column to be replaced with (a read global bit line RGBL) in advance. The redundancy determination circuits 92-0 to 92-i correspond to redundancy read global bit lines RGBL_RD0 to RGBL_RDh. Each of the redundancy read global bit lines RGBL_RD0 to RGBL_RDh holds a column address to be replaced with. Then, the input column address signal CA coincides with the column address held in the redundancy determination circuits 92-0 to 92-h, control signals FRD0 to FRDh are asserted (or made high).

The switch circuits 93-0 to 93-j are provided for sense amplifiers S/A0 to S/Aj in a one-to-one correspondence. A column address signal CA and control signals FRD0 to FRDh are input to the switch circuits 93-0 to 93-j. If the column address signal CA coincides with a column (read global bit lines RGBL_RD0 to RGBL_RDn) connected to the corresponding one of the sense amplifiers S/A0 to S/Aj and all of the control signals FRD0 to FRDh are low, the switch circuits 93-0 to 93-j are turned on. Any one of the switch circuits 93-0 to 930-j turned on transmits the output SAO0 to SAOj of the corresponding one of the sense amplifiers S/A0 to S/Aj to the output buffer 110. Conversely, if the column address signal CA does not coincides with the corresponding column, or even when they coincide, any one of the control signals FRD0 to FRDh is high, the switch circuits 93-0 to 93-j are turned off.

The switch circuits 94-0 to 94-h are provided for sense amplifiers S/A_RD0 to S/A_RDh in a one-to-one correspondence. Control signals FRD0 to FRDh are input to the switch circuits 94-0 to 94-h, respectively. If any one of the control signals FRD0 to FRDh is made high, the corresponding one of the switch circuits 94-0 to 94-h is turned on. Then, the output SAOR0 to SAORh of the corresponding one of the sense amplifiers S/A_RD0 to S/A_RDh is transmitted to the output buffer 110. Conversely, when the control signals FRD0 to FRDh are low, the switch circuits 94-0 to 94-h are turned off.

FIG. 5 is a circuit diagram of the row address transition detector 91 included in the redundancy circuit 90. As shown in FIG. 5, the row address transition detector 91 includes a plurality of detection units 160-0 to 160-i, a NOR gate 163, a NAND gate 165, and inverters 164, 166.

The detection units 160-0 to 160-i are provided for the bits in the row address signal RA in a one-to-one correspondence. Each of the detection units 160-0 to 160-i includes a D-F/F 161 and an exclusive OR circuit 162. The inverted signal of a sense amp enable signal SAenb is input to the clock terminal CLK of the D-F/F 161. Bits RA0 to RAi in the row address signal RA are input to the corresponding data input terminals D of the D-F/F 161. A reset signal RST is input to the reset terminal RS of the D-F/F 161. The exclusive OR circuit 162 exclusive-ORs the corresponding one of the bits RA0 to RAi in the row address signal RA with the output Q of the flip-flop 161. The flip-flop 161 operates in synchronization with the sense amp enable signal SAenb.

The NOR gate 163 carries out the NOR operation of the output of the exclusive OR circuits 162 in the detection units 160-1 to 160-i. The output of the NOR gate 163 is inverted by the inverter 164. The NAND gate 165 carries out the NAND operation of the output of the inverter 164 and the sense amp enable signal SAenb. The output of the NAND gate 165 is inverted by the inverter 166, thereby producing a sense amp enable signal SARDenb.

Suppose a row address signal RA is input to the row address transition detector 91 with the above configuration at, for example, time t0 and time t1. Then, the exclusive OR circuit 162 of the detection unit 160-0 obtains the exclusive OR of the bits RA0 of the row address signals taken in by the flip-flop 161 at the falling edges of the sense amp enable signals SAenb input at time t0 and time t1. In addition, the exclusive OR circuit 162 of the detection unit 160-1 obtains the exclusive OR of bit RA1 (t=0) in the row address signal taken in by the flip-flop 161 at time t0 and the bit RA1 (t=1) in the row address signal input at time t1. The same holds true for the detection units 160-2 to 160-i. Therefore, if any bit in the row address signal RA has changed between time t0 and time t1, the output of the exclusive OR circuit 162 of the one of the detection units 160-0 to 160-i which corresponds to the changed bit goes high. Since the result of the OR operation by the NOR gate 163 and inverter 164 goes high, the sense amp enable signal SARDenb also goes high in the period that the sense amp enable signal SAenb is high.

Referring to FIG. 1, the explanation will be continued.

The output buffer 110 holds the read-out data obtained via the redundancy circuit 90. The read-out data is supplied to the CPU 2.

The source line driver 120 supplies a voltage to the source lines SL.

The address buffer 130 holds an address signal supplied from the CPU 2. Then, the address buffer 130 supplies a column address signal CA to the column decoder 40 and a row address signal RA to the write decoder 20 and select gate decoder 30.

The write state machine 140 controls the operation of each circuit included in the flash memory 3 on the basis of a command signal supplied from the CPU 2, thereby performing timing control in writing, erasing, or reading data, and executing a specific algorithm determined for each operation.

The voltage generator 150 generates a plurality of internal voltages on the basis of the externally input voltage Vcc1. The voltage generator has a negative charge pump circuit and a positive charge pump circuit. Then, the voltage generator generates negative voltages VBB1 (=−7V), VBB2 (=−8V) and positive voltages VPP1 (=12V), Vcc2 (=3V).

The write decoder 20 not only selects any one of the word lines WL0 to WL(4m+3) and applies the positive potential VPP1 (12V) to the selected word line but also applies the negative potential VBB1 (−7V) to all of the select gate lines SG0 to SG(4m+3). In an erase operation, the write decoder 2 applies the negative potential VBB2 to all of the word lines.

The select gate decoder 30 selects any one of the select gate lines SG0 to SG(4m+3) in a read operation and applies the positive potential Vcc2 (3V) to the selected select gate line.

Using FIG. 6, the configuration of the write decoder 20 and select gate decoder 30 will be explained. First, the configuration of the select gate decoder 30 will be explained. The select gate decoder 30 includes a row address decode circuit 31 and a switch element group 32. The row address decode circuit 31, which operates on the power supply voltage Vcc2, decodes (i+1)-bit row address signals RA0 to RAi, thereby producing a row address decode signal. The row address decode circuit 31 has NAND circuits 33 and inverters 34 provided for select gate lines SG0 to SG(4m+3) in a one-to-one correspondence. The NAND circuit 33 performs NAND operation on each bit in row address signals RA0 to RAi. Then, the inverter 34 inverts the result of the NAND operation and outputs the inverted value as a row address decode signal.

The switch element group 32 has n-channel MOS transistors 35. The n-channel MOS transistors 35 are provided for select gate lines SG0 to SG(4m+3) in a one-to-one correspondence. The outputs of the inverters 34 are supplied to select gate lines SG0 to SG(4m+3) via the current paths of the n-channel MOS transistors 35. A control signal ZISOG is input to the gates of the n-channel MOS transistors 35. The control signal ZISOG turns off the MOS transistors 35 in a write and an erase operation and turns on the MOS transistors 35 in a read operation.

Next, the configuration of the write decoder 20 will be explained. The write decoder 20 includes a row address decode circuit 21 and a switch element group 22. The row address decode circuit 21 decodes (i+1)-bit row address signals RA0 to RAi, thereby producing a row address decode signal. The row address signal is supplied to word line WL0 to WL(4m+3). The row address decode circuit 21 includes NAND circuits 23 and inverters 24 provided for word lines WL0 to WL(4m+3) in a one-to-one correspondence. The NAND circuit 23 and inverter 24 have their positive power supply voltage nodes connected to power supply node VCGNW and their negative power supply voltage nodes connected to power supply voltage node VCGPW. The NAND circuit 23 performs NAND operation on each bit in the row address signals RA0 to RAi. The positive voltages VPP1, Vcc2 and the negative voltage VBB1 generated by the voltage generator 150 or 0V are applied to the power supply voltage nodes VCGNW, VCGPW. Then, the inverter 24 inverts the result of the NAND operation and outputs the result as a row address decode signal.

The switch element group 22 has n-channel MOS transistors 25. The n-channel MOS transistors 25 are provided for select gate lines SG0 to SG(4m+3) in a one-to-one correspondence. One end of the current path of each of the MOS transistors 25 is connected to the corresponding one of the select gate lines SG0 to SG(4m+3) and the other end is connected to VSGPW node. The negative potential VBB2 or positive potential VPP1 is applied to VSGPW node. A control signal WSG is input to the gates of the MOS transistors 25. The control signal WSG turns on the MOS transistors 25 in a write operation. In addition, the write decoder 20 applies the voltage VPW to the semiconductor substrate (or well region) in which the memory cell array 10 has been formed.

Figure 7:
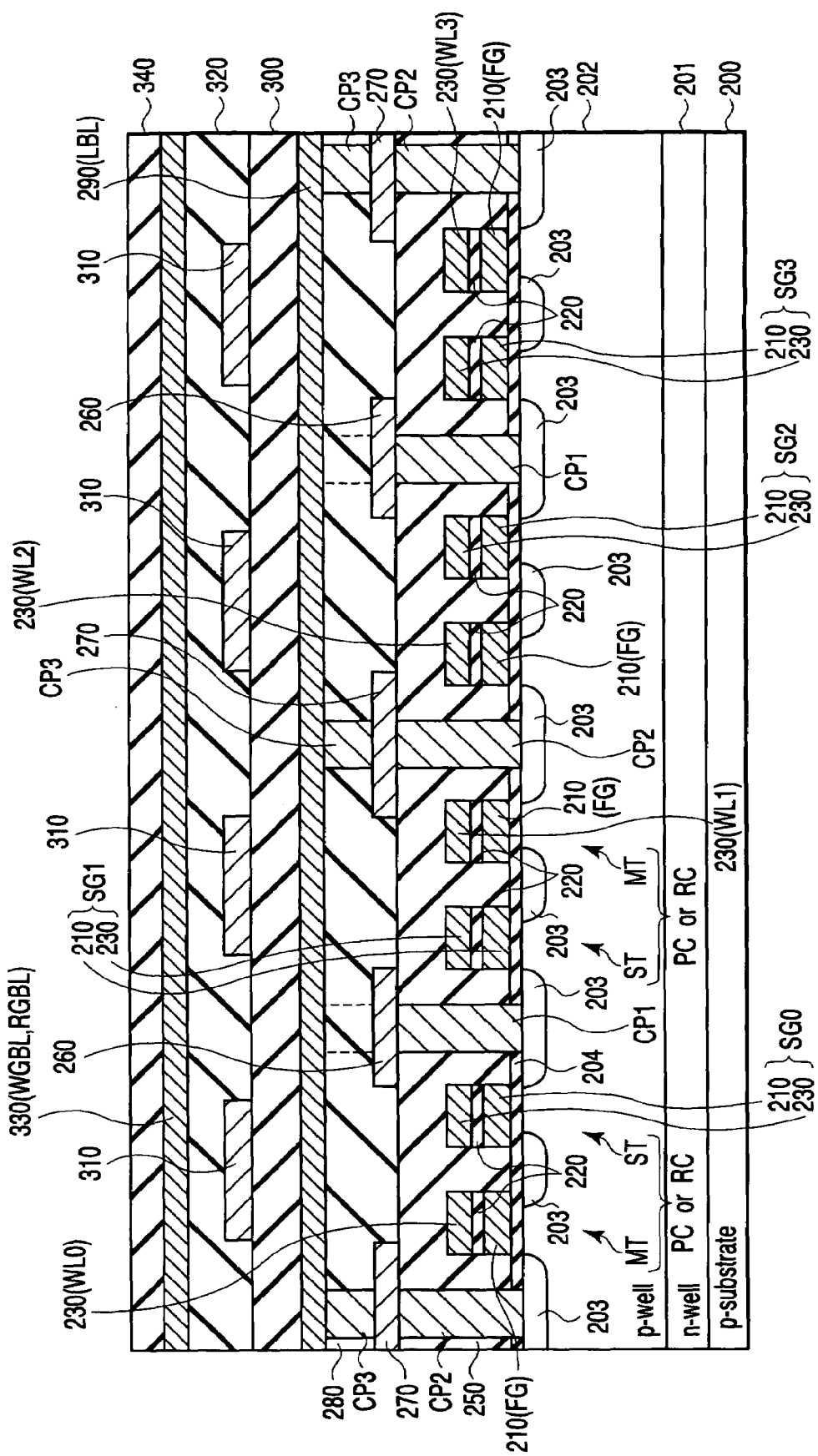
FIG. 7 is a sectional view, taken along a bit line, of the memory cell array included in the 2Tr flash memory according to the first embodiment.

Next, using FIG. 7, a sectional structure of the memory cell array 10 included in the flash memory with the above configuration will be explained. FIG. 7 is a sectional view, taken along a bit line, of the prime cell array PCA in the memory cell array 10. The sectional structure of the redundancy cell array RCA is the same as that of the prime cell array PCA, except that the write global bit lines and read global bit lines are replaced with the redundancy write global bit lines and redundancy read global bit lines. Thus, hereinafter, only the prime cell array PC will be explained.

As shown in FIG. 7, at the surface of the p-type semiconductor substrate 200, an n-well region 201 is formed. At the surface of the n-well region 201, a p-well region 202 is formed. In the p-well region 202, an element isolating region STI is formed. The region surrounded by the element isolating region STI is an element region AA. On the element region AA of the p-well region 202, a gate insulating film 204 is formed. On the gate insulating film 204, the gate electrodes of a memory cell transistor MT and a select transistor ST are formed. Each of the gate electrodes of the memory cell transistor MT and the select transistor ST includes a polysilicon layer 210 formed on the gate insulating film 204, an inter-gate insulating film 220 formed on the polysilicon layer 210, and a polysilicon layer 230 formed on the inter-gate insulating film 220. The inter-gate insulating film 220 is made of, for example, a silicon oxide film, or an ON film, NO film, or ONO film having a stacked structure of a silicon oxide film and a silicon nitride film.

In a memory cell transistor MT, the polysilicon layers 210, which are separated from each other between adjacent element regions AA, function as floating gates (FG). On the other hand, the polysilicon layers 230, which are connected to one another between adjacent element regions AA, function as control gates (or word line WL).

In a select transistor ST, the polysilicon layers 210 are connected to one another between adjacent element regions AA. The polysilicon layers 230 are also connected to one another between adjacent element regions AA. Then, the polysilicon layers 210, 230 function as select gate lines SG. Of these polysilicon layers, only the polysilicon layers 210 practically function as select gate lines.

At the surface of the p-well region 202 between adjacent gate electrodes, an impurity diffused layer 203 is formed. The impurity diffused layer 203 is shared by adjacent transistors. As described above, a memory cell including a memory cell transistor MT and a select transistor ST is formed so as to have the following relationship. In adjacent memory cells MC, their select transistors ST or their memory cell transistors MT are adjacent to each other. The adjacent select transistors or memory cell transistors share the impurity diffused layer 203. Therefore, two adjacent memory cells MC, MC, when their select transistors ST are adjacent to each other, are arranged symmetrically with the impurity diffused layer (or source region) 203 shared by the two select transistors ST, ST. Conversely, when their memory cell transistors MT are adjacent to each other, two adjacent memory cells MC, MC are arranged symmetrically with the impurity diffused layer (or drain region) 203 shared by the two memory cell transistors MT, MT.

Then, on the p-well region 202, an interlayer insulating film 250 is formed so as to cover the memory cell transistor MT and select transistor ST. In the interlayer insulating film 250, a contact plug CP1 reaching the impurity diffused layer (or source region) 203 shared by two select transistors ST, ST is formed. On the interlayer insulating film 250, a metal wiring layer 260 connected to the contact plug CP1 is formed. The metal wiring layer 260 functions as a source line SL. Further in the interlayer film 250, a contact plug CP2 reaching the impurity diffused layer (or drain region) 203 shared by two memory cell transistors MT, MT is formed. On the interlayer insulating film 250, a metal wiring layer 270 connected to the contact plug CP2 is further formed.

On the interlayer insulating film 250, an interlayer insulating film 280 is formed so as to cover the metal wiring layers 260, 270. In the interlayer insulating film 280, a contact plug CP3 reaching the metal wiring layer 270 is formed. On the interlayer insulating film 280, a metal wiring layer 290 connected equally to a plurality of contact plugs CP3 is formed. The metal wiring layer 290 function as any one of the local bit lines LBL0 to LBL3. In the interlayer insulating film 280, a contact plug reaching the metal wiring layer 260 is formed. The contact plug connects a plurality of source lines 260 to one another in a region (not shown).

On the interlayer insulating film 280, an interlayer insulating film 300 is formed so as to cover the metal wiring layer 290. On the interlayer insulating film 300, a metal wiring layer 310 is formed. The metal wiring layer 310, which is connected to the polysilicon layer 210 of the select transistor ST in a shunt region (not shown), functions as a shunt wire for a select gate line. The interconnections of the metal wiring layers 310 are arranged at equal intervals. In the shunt region, at least a part of the polysilicon layer 230 of the select transistor ST is removed. A contact plug (not shown) formed in the shunt region connects the shunt wire 310 to the polysilicon layer 210. The shunt wire 310 is electrically separated from the polysilicon layer 230.

On the interlayer insulating film 300, an interlayer insulating film 320 is formed so as to cover the metal wiring layer 310. On the interlayer insulating film 320, a metal wiring layer 330 functioning as a write global bit line and a read global bit line is formed. In addition, an interlayer insulating film 340 is also formed.

Figure 8:
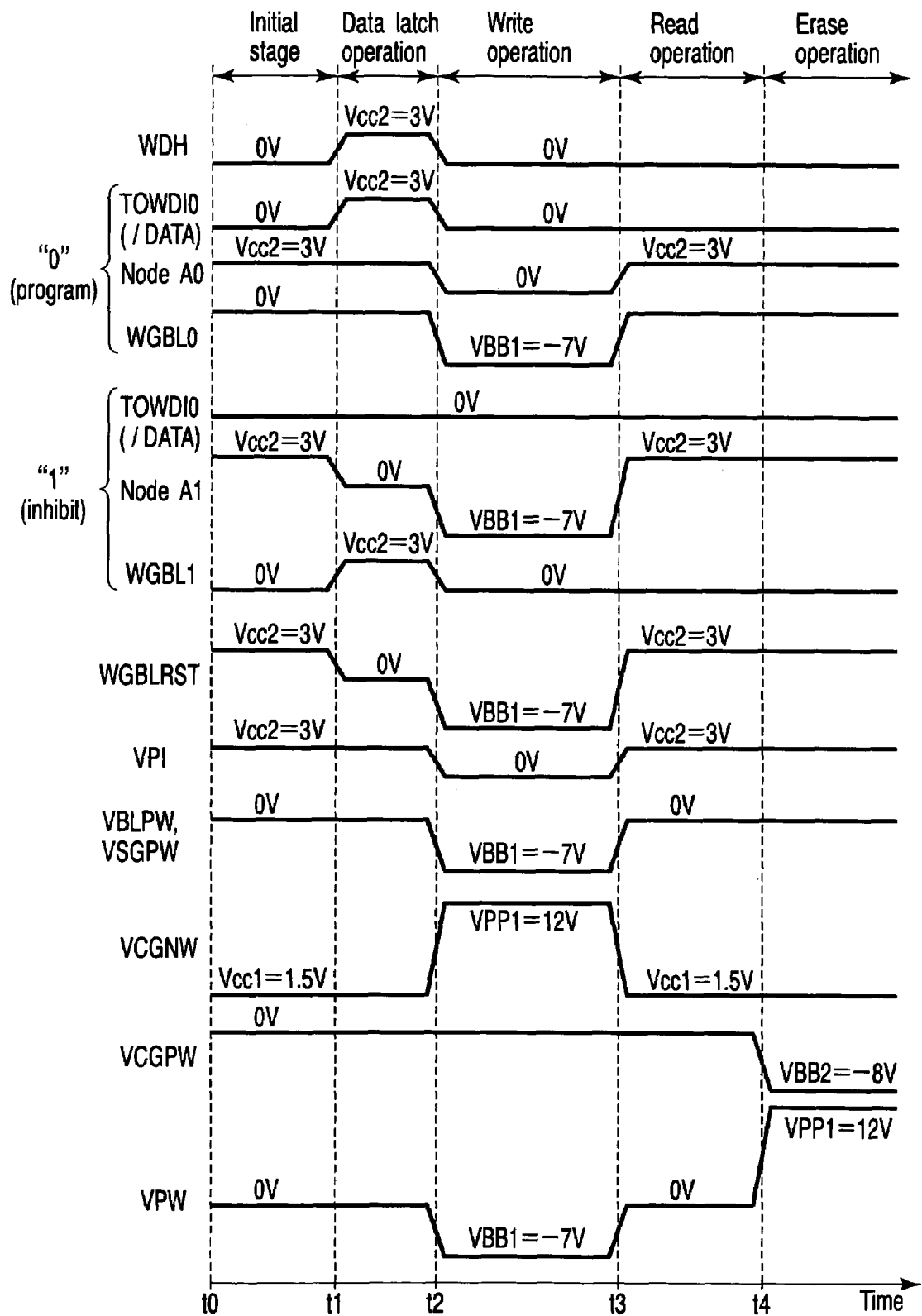
FIG. 8 is a timing chart for various signals in a write operation of the 2Tr flash memory according to the first embodiment.

Next, using FIG. 8, the operation of the 2Tr flash memory 3 with the above configuration will be explained. FIG. 8 is a timing chart for various signals and the voltages at various nodes. Hereinafter, a state where no electron is injected into the floating gate and the threshold voltage is negative is defined as a state where "1" data has been written. A state where electrons are injected into the floating gate and the threshold voltage is positive is defined as a state where "0" data has been written. For the sake of simplification, only the operation of the prime cells PC connected to write global bit lines WGBL0, WGBL1 will be explained. The same holds true for the other write global bit lines WGBL2 to WGBL(2n+1) and redundancy write global bit lines WGBL_RD0 to WGBL_RD(2h+1).

<Initial Operation>

Figure 9:
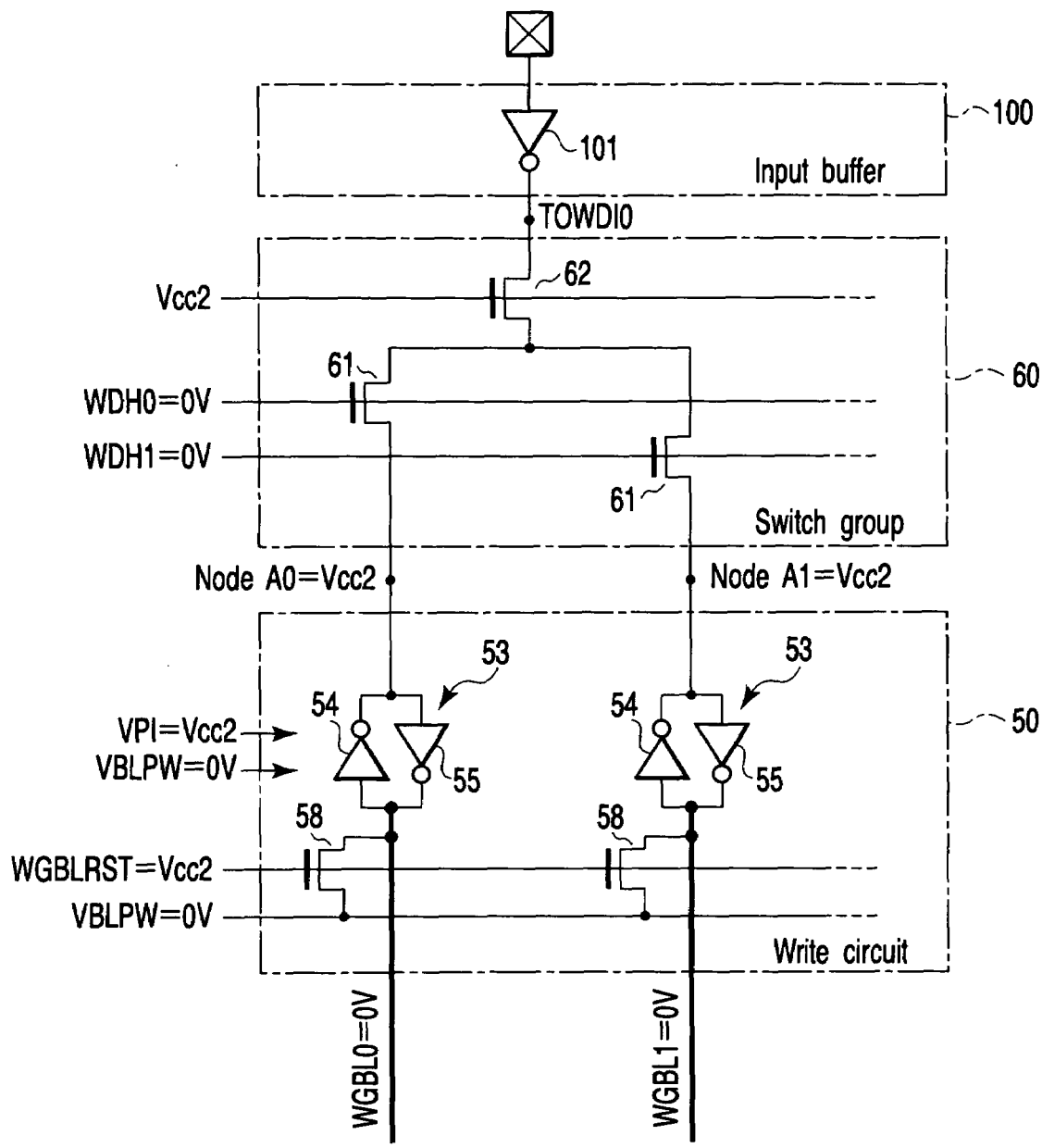
FIG. 9 is a circuit diagram of the write circuit, switch group, and input buffer in an initial operation of the 2Tr flash memory according to the first embodiment.

First, an initial operation will be explained. An initial operation is the first operation to be performed in a write, a read, and an erase operation. In FIG. 8, an initial operation is carried out in the period between time t0 to time t1. FIG. 9 is a circuit diagram of the write circuit 50, switch group 60, and input buffer 100 corresponding to write global bit lines WGBL0, WGBL1 in an initial operation.

Before the initial operation, the signals WDH0 and WDH1 are both set to the low (L) level (0V), turning off the MOS transistors 61 in the switch group 60, which electrically isolates the write circuit 50 from the input buffer 100. The write inhibit voltage VPI supplied as the high voltage power supply voltage of the latch circuit 53 is set to Vcc2 and VBLPW is set to 0V. Then, the signal WGBLRST is set to the high (H) level (Vcc2) and all of the write global bit lines WGBL0, WGBL1 are reset. That is, the MOS transistors 58 in the write circuit 50 are turned on, thereby allowing VBLPW node to apply 0V to the write global bit lines WGBL0, WGBL1. As a result, the output nodes of all of the latch circuits 53 go to the low (L) level (0V) and the input nodes (node A0, node A1) go to the high (H) level (Vcc2).

As described above, in the initial operation, the write global bit lines are set to 0V and Vcc2 is applied to node A0 and node A1.

<Data Latch Operation>

Figure 10:
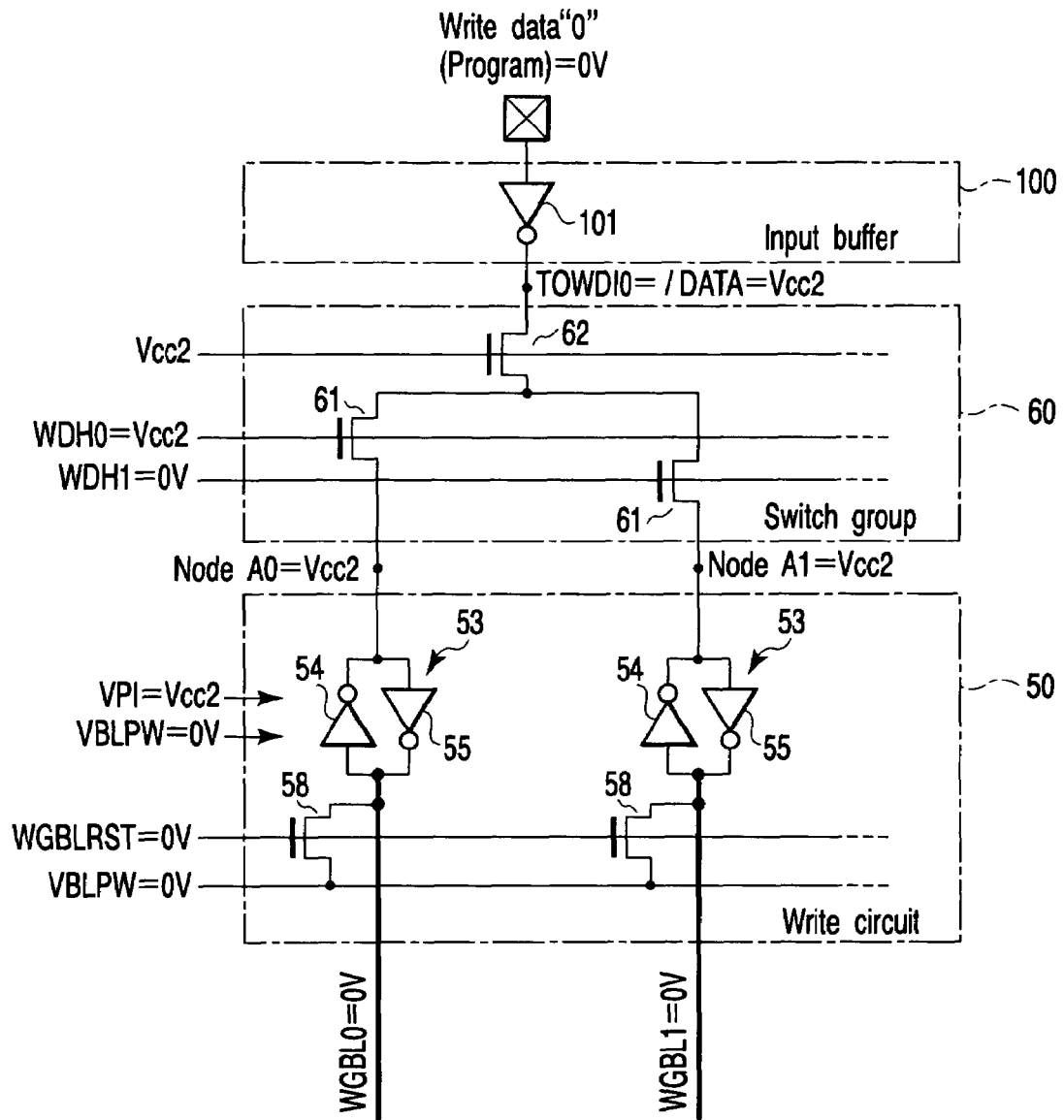
FIGS. 10 and 11 are circuit diagrams of the write circuit, switch group, and input buffer in a data latch operation of the 2Tr flash memory according to the first embodiment.
Figure 11:
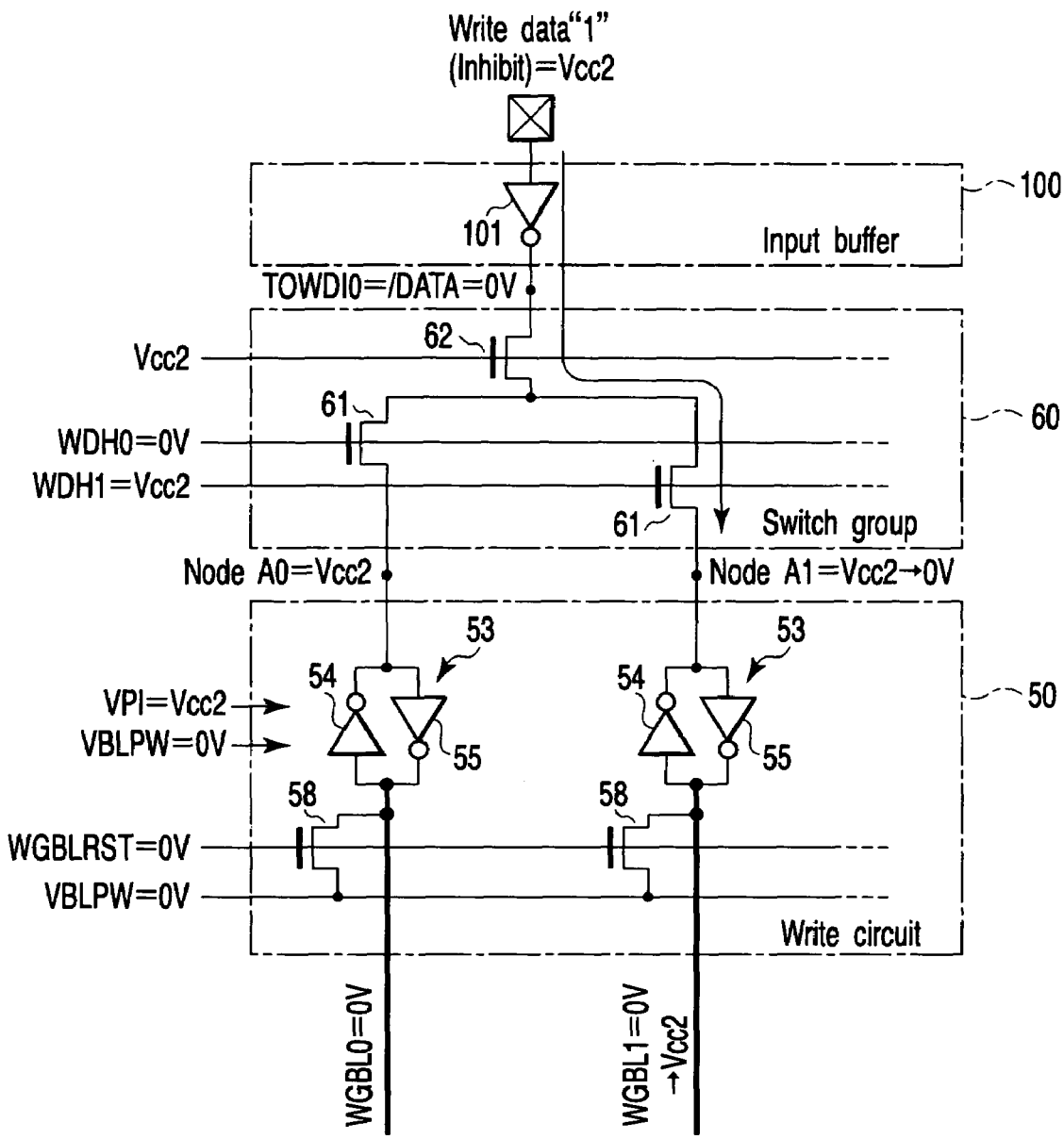

Next, a data latch operation will be explained with reference to FIGS. 10 and 11. A data latch operation is the operation of inputting the write data to each latch circuit 53 in a write operation. A data latch operation is carried out between time t1 to time t2 in FIG. 8. FIGS. 10 and 11 are circuit diagrams of the input buffer 100, switch group 60, and write circuit 50 in a data latch operation. FIG. 10 shows a case where "0" data has been input. FIG. 11 shows a case where "1" data has been input. Hereinafter, explanation will be given using a case where "0" data is written into the memory cells connected to write global bit line WGBL0 (that is, WGBL0 is selected) and "1" data is written into the memory cells connected to WGBL1 (that is, WGBL1 is unselected).

First, a case where "0" data is input will be explained with reference to FIG. 10. Before a data latch operation, the signal WGBLRST is set to 0V, thereby turning off the MOS transistor 58, which electrically isolates write global bit lines WGBL0, WGBL1 from VBLPW node. To latch the data in the latch circuit 53 corresponding to write global bit line WGBL0, the signal WDH0 is set to the high (H) level (Vcc2), which turns on the MOS transistor 61 corresponding to write global bit line WGBL0. On the other hand, the MOS transistor 61 corresponding to write global bit line WGBL1 is turned off. Therefore, the input buffer 100 is electrically connected to the latch circuit 53 corresponding to write global bit line WGBL0.

Then, the CPU 2 inputs "0" data to the inverter of the input buffer 100. When "0" data is input, 0V is applied to the input node of the inverter 101. The "0" data is inverted by the inverter 101. As a result, the potential of TOWDI0 node goes to Vcc2. Then, since Vcc2 has been applied to the gate of the MOS transistor 62, the MOS transistor 62 goes into the cutoff state. Therefore, the latch circuit 53 keeps holding the data given in the period between time t0 to time t1. That is, node A0 remains at Vcc2 and write global bit line WGBL0 remains at 0V.

Next, a case where "1" data is input will be explained with reference to FIG. 11. What differs from the case where "0" data is input is that setting WDH0 to 0V (WDH0=0V) and WDH1 to Vcc2 (WDH1=Vcc2) brings the MOS transistor 61 corresponding to write global bit line WGBL1 into the on state.

Then, the CPU 2 inputs "1" data to the input buffer 100. When "1" data is input, Vcc2 is applied to the input node of the inverter 101. Consequently, the potential at the TOWDI0 node goes to 0V. The potential at TOWDI0 node is input to the latch circuit 53 via the current path of the MOS transistor 61. As a result, the potential at node A1 is inverted from Vcc2 to 0V, which inverts the potential on write global bit line WGBL1 from 0V to Vcc2.

As described above, in the data latch operation, the data in the latch circuit corresponding to the memory cell into which "1" data is to be written is reversed from its initial state. That is, when "0" writing is done (or when electrons are injected), virtually no data is input from the outside. When "1" writing (or when no electron is injected=the memory is unselected), the data is taken in from the outside.

<Write Operation>

Figure 12:
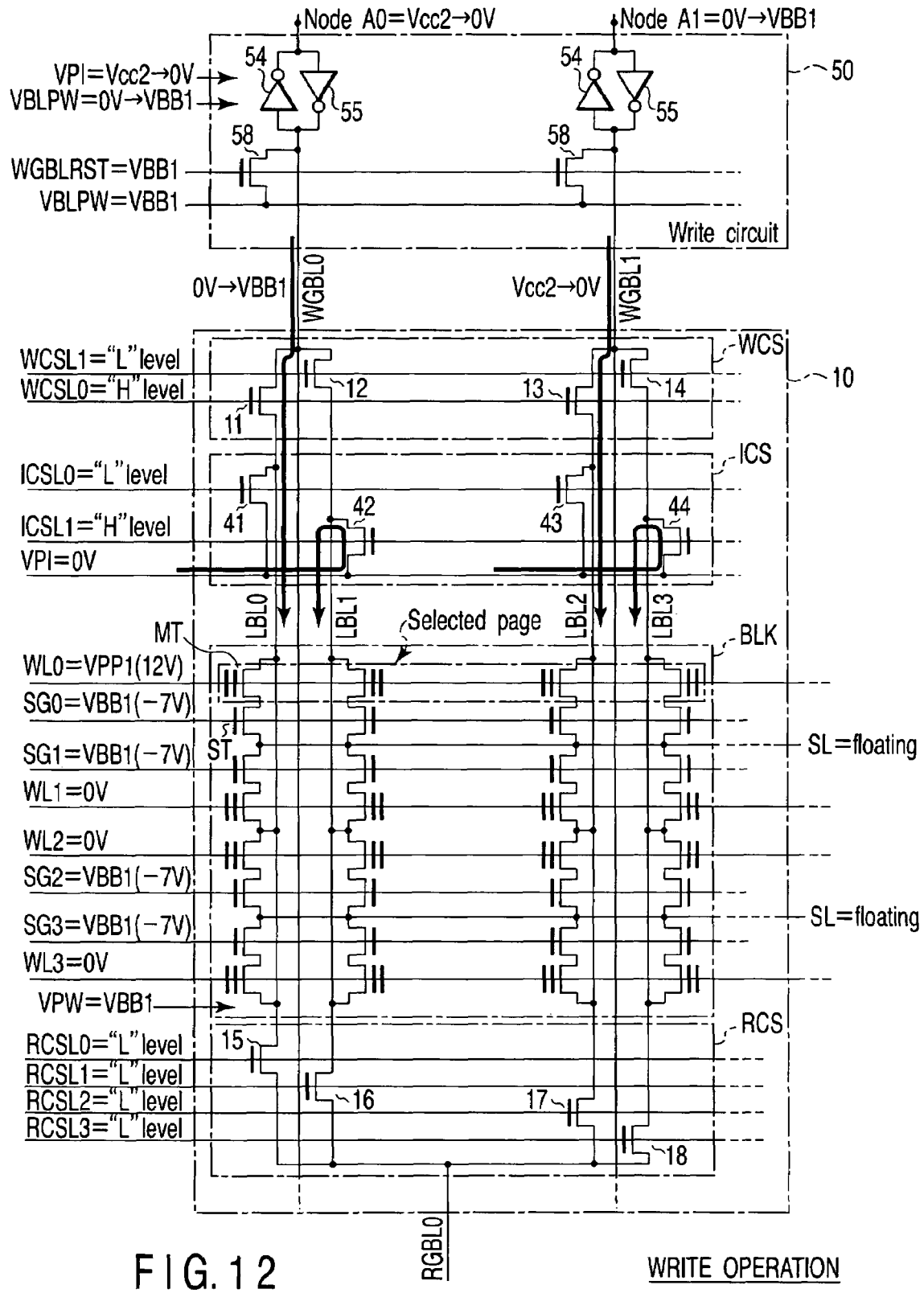
FIG. 12 is a circuit diagram of the memory cell array and write circuit in a write operation of the 2Tr flash memory according to the first embodiment.

A write operation will be explained with reference to FIG. 12. Data is written simultaneously into all of the memory cell blocks in a row. In each of the memory cell blocks, the memory cells written into simultaneously include those connected to one of the local bit lines LBL0 and LBL1 and those connected to one of the local bit lines LBL2 and LBL3.

In FIG. 8, a write operation is carried in the period between time t2 and t3. FIG. 12 is a circuit diagram of a part of the memory cell array 10 and write circuit 50 in a write operation. In FIG. 12, it is assumed that data is written into the memory cell transistors MT connected to word line WL0 and local bit lines LBL0, LBL2 and that, of the memory cell transistors MT, "0" data is written into the one connected to local bit line LBL0 and "1" data is written into the one connected to local bit line LBL2. In other words, the memory cell connected to local bit line LBL0 is selected and the memory cell connected to local bit line LBL2 is unselected.

First, before a write operation, the signal WGBLRST still remains at 0V. Then, at time t2, the write inhibit voltage VPI changes from Vcc2 to 0V and the potential at VBLPW node changes from 0V to VBB1 (−7V). Under the control of the write state machine 140, the voltage generator 150 outputs the negative potential VBB1. The potential of VPI may be a negative potential instead of 0V.

Then, the low-voltage-side power supply voltage of the inverters 54, 55 in the latch circuit 53 changes from 0V to VBB1 and the high-voltage-side power supply voltage changes from Vcc2 to 0V, with the result that the potentials at node A0 and node A1 change to 0V and VBB1, respectively. The potentials on write global bit lines WGBL0, WGBL1 also change to VBB1 and 0V, respectively.

Then, the write decoder 20 selects word line WL0 and applies the positive voltage VPP1 (12V) to the selected word line WL0. In addition, the signal WSG is raised to the high level (0V to Vcc2), which turns on the isolating MOS transistor 25, with the result that the negative potential VBB1 (−7V) is applied from VSGPW node to all of the select gate lines SG0 to SG(4m+3). Furthermore, the write decoder 20 applies the negative potential VBB1 to the substrate (p-well region 202) in which memory cells have been formed. In a write operation, the signal ZISOG is made low, which electrically separates the row address decode circuit 31 of the select gate decoder 30 from the select gate lines.

The column decoder 40 selects write column select line WCSL0 from the two write column select lines connected to the write column selector WCS corresponding to the memory cell block BLK including the selected word line WL0. This turns on the MOS transistors 11, 13 in the write column selector WCS. As a result, write global bit line WGBL0 and local bit line LBL0 are electrically connected and write global bit line WGBL1 and local bit line LBL2 are electrically connected.

Furthermore, the column decoder 40 makes unselected all of the write column select lines connected to the write column selector WCS corresponding to the memory cell block BLK which does not include the selected word line WL0. Therefore, the MOS transistors 11 to 14 in the write column selector WCS corresponding to the memory cell block BLK not including the selected word line are turned off.

Furthermore, the column decoder 40 makes unselected all of the read column select lines RCSL0 to RCSL(4m+3). This turns off the MOS transistors 15 to 18 in all of the read column selectors RCS. Therefore, the read global bit lines RGBL are electrically isolated from local bit lines LBL0 to LBL3.

In addition, to turn on the MOS transistors 42, 44 connected to local bit lines LBL1, LBL3 made unselected, the column decoder 40 sets the write inhibit column select line ICSL1 to the high (H) level (Vcc2). Write inhibit column select line ICSL0 connected to the MOS transistors 41, 43 corresponding to the selected local bit lines LBL0, LBL2 is set to the low (L) level, which turns off the MOS transistors 41, 43. As a result, the write inhibit voltage VPI=0V is applied to the unselected local bit lines LBL1, LBL3.

Consequently, the write voltage (VBB1) is applied from write global bit line WGBL0 via the MOS transistor 11 in the write column selector WCS to the local bit line LBL0 in the memory cell block BLK including the selected word line WL0. Moreover, the write inhibit voltage VPI (0V) is applied from write global bit line WGBL1 via the MOS transistor 13 to local bit line LBL2 in the memory cell block BLK including the selected word line WL0.

As a result, in the memory cell transistor MT connected to write global bit lines WGBL1 and word line WL0, since the potential difference between the gate and channel is insufficient (VPP1−VPI=12V), no electron is injected into the floating gate. Thus, the memory cell MC holds the negative threshold value. That is, "1" data is written. Furthermore, in the memory cell transistors MT connected to the unselected local bit lines LBL1, LBL3 and word line WL0, since VPI is applied to the channel, no electron is injected into the floating gate, which enables the memory cell MC to hold the negative threshold value. On the other hand, in the memory cell transistor MT connected to write global bit line WGBL0 and word line WL0, since the potential difference between the gate and channel is sufficient (VPP1−VBB1=19V), electrons are injected into the floating gate by FN tunneling. As a result, the threshold value of the memory cell transistor MT changes to positive. That is, "0" data is written.

As described above, the data is written into one page of memory cell transistors simultaneously.

<Erase Operation>

Figure 13:
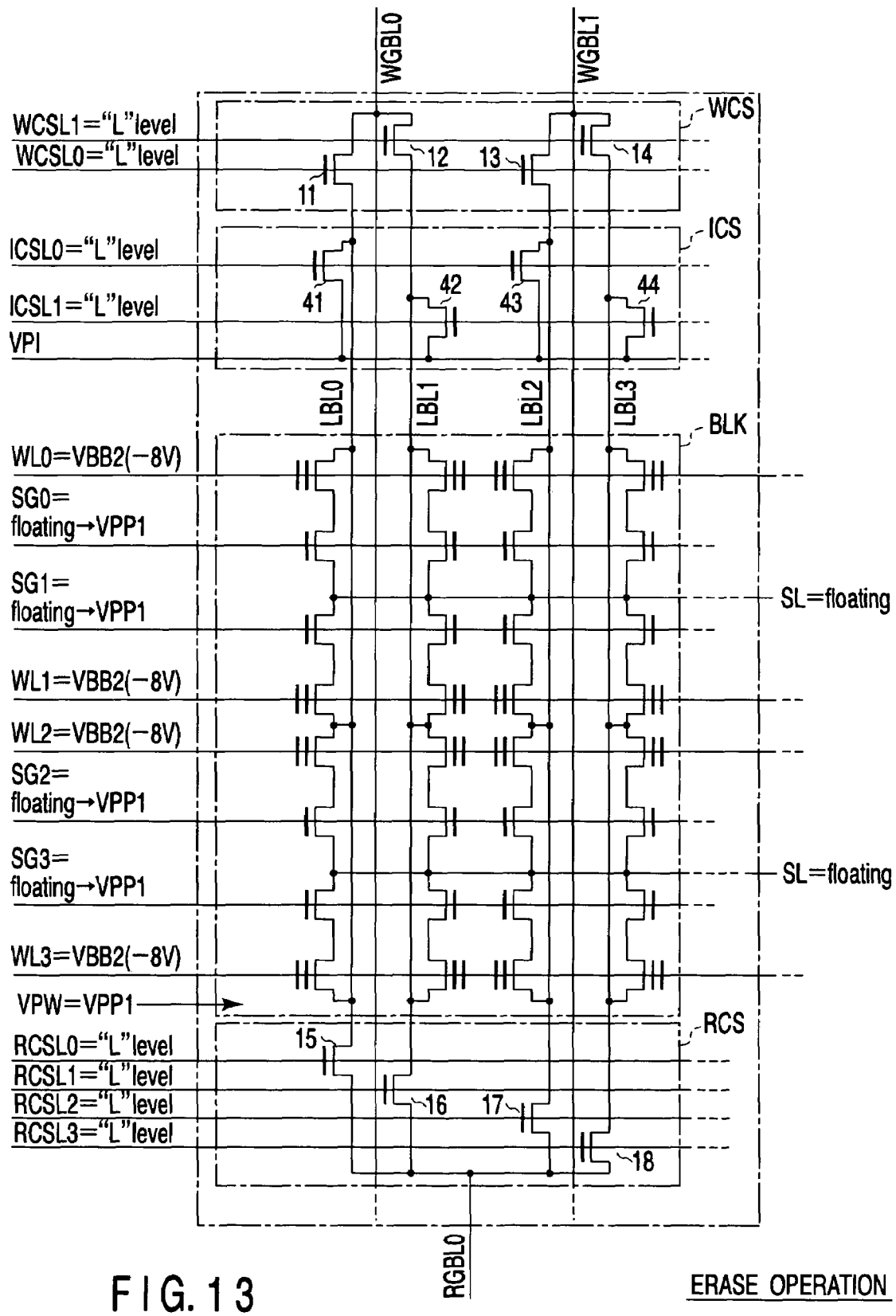
FIG. 13 is a circuit diagram of the memory cell array in an erase operation of the 2Tr flash memory according to the first embodiment.

An erase operation will be explained. An erase operation is carried out at time t4 and later in FIG. 8. FIG. 13 is a circuit diagram of the memory cell array 10 in an erase operation. Data is erased from all of the memory cells MC sharing the p-well region 202 simultaneously. An erase operation is carried out by pulling electrons out of the floating gate by FN tunneling.

Before an erase operation, all of the MOS transistors 11 to 16 are turned off. Therefore, all of the write global bit lines WGBL0, WGBL1 are electrically isolates from the latch circuits 53 and from VBLPW node and VPI node and therefore go into the floating state.

Then, the write decoder 20 applies the negative voltage VBB2 to all of the word lines WL0 to WL(4m+3) in the selected block. In addition, the write decoder 20 applies the positive potential VPP1 to the substrate (p-well region 202) in which memory cells have been formed. In the erase operation, the signals ZISOG and WSG are made low, which electrically isolates the row address decode circuit 31 of the select gate decoder 30 from the select gate lines.

As a result, electrons are pulled out of the floating gates of the memory cell transistors of the memory cells MC into the semiconductor substrate by FN tunneling, thereby erasing the data in all of the memory cells MC connected to word lines WL0 to WL(4m+3), which makes the threshold voltage negative.

The potential on the select gate line rises to about VPP1 as a result of coupling with the p-well region 202. Therefore, almost no voltage stress is applied to the gate insulating film of the select transistor ST. In the select gate decoder 30, VPP1 may be applied to the select gate line by setting VSGPW to VPP1 (VSGPW=VPP1) and turning on the MOS transistor 36.

As described above, data is erased simultaneously.

<Read Operation>

Figure 14:
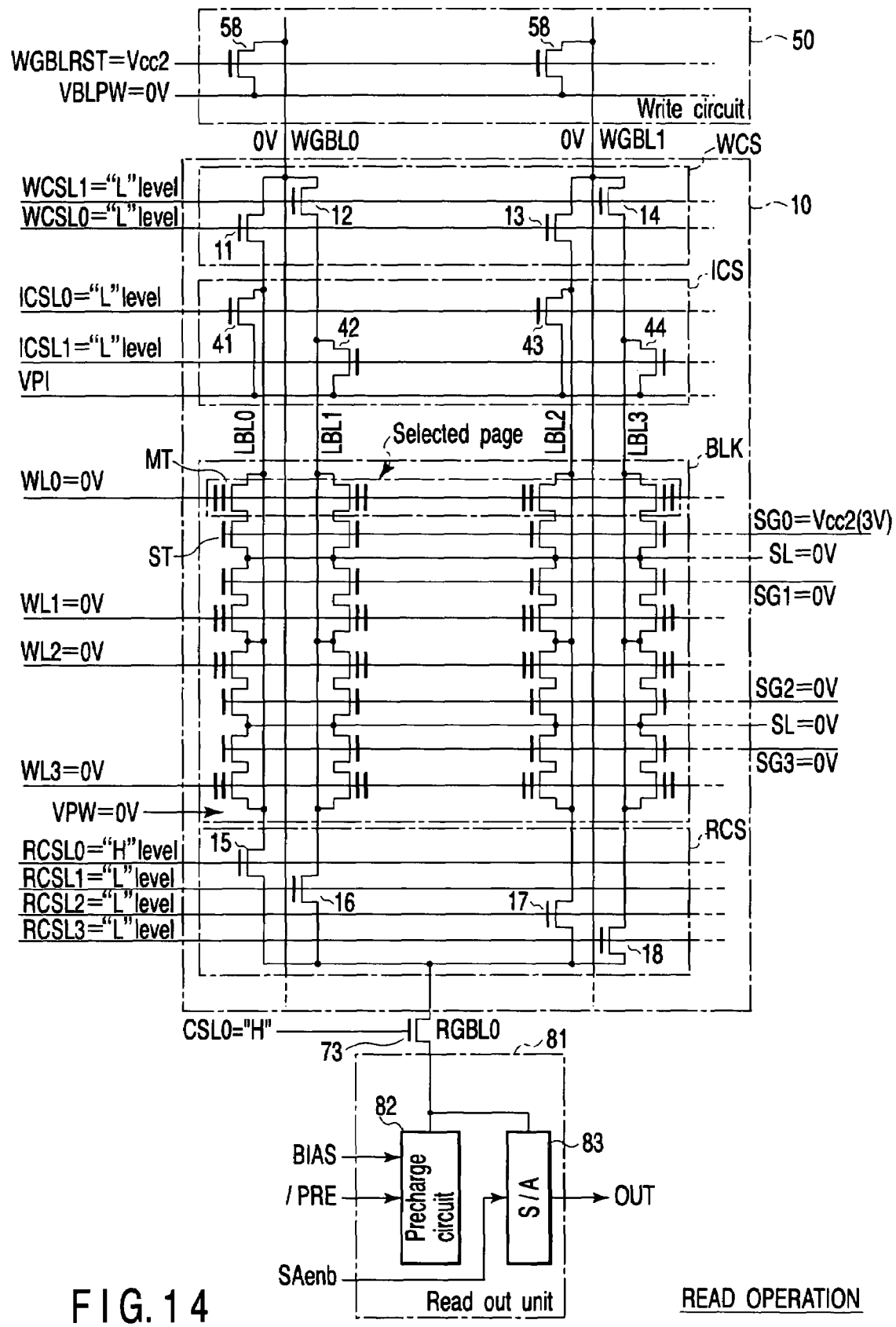
FIG. 14 is a circuit diagram of the memory cell array, write circuit, and read circuit in a read operation of the 2Tr flash memory according to the first embodiment.

Next, a read operation will be explained. In FIG. 8, a read operation is carried out in the period between time t3 and time t4. FIG. 14 is a circuit diagram of the memory cell array 10 and read unit 71 of the 2Tr flash memory 3. FIG. 14 shows a case where the data is read from the memory cell transistor MT connected to local bit line LBL0 and word line WL0. The data is read from one memory cell MC per memory cell block BLK. However, when there are a plurality of read global bit lines per memory cell block BLK, as many items of data as correspond to the read global bit lines are read out.

As shown in FIG. 14, first, the column decoder 40 selects read column select line RCSL0 from the four read column select lines RCSL0 to RCSL3 connected to the read column selector RCS corresponding to the memory cell block BLK including the selected select gate line SG0. This turns on the MOS transistor 15 in the read column selector RCS corresponding to the memory cell block BLK including the selected select gate line SG0.

Furthermore, the column decoder 40 makes all of the write column select lines WCSL0 to WCSL(2m+1) unselected, which turns off all of the four MOS transistors 11 to 14 in all of the write column select lines WCSL0 to WCSL(2m+1). Therefore, the write global bit lines WGBL are electrically separated from local bit lines LBL0 to LBL3.

When the signal WGBLRST is raised to the high (H) level (Vcc2), this turns on the MOS transistor 58 in the write circuit 50. In addition, 0V has been applied to VBLPW node. Therefore, in the read operation, all of the write global bit lines WGBL0, WGBL1 are put at 0V.

Furthermore, the signal BIAS is made high and the signal /PRE is made low. Moreover, the column decoder 40 raises column select line CSL0 to the high (H) level. This turns on the MOS transistor 62, which causes the precharge circuit 72 to precharge read global bit line RGBL0.

After the potential on the read global bit line has reached a specific precharge potential, the signal ZISOG is made high, turning on the isolating MOS transistor 35. Then, the select gate decoder 30 selects select gate line SG0 (H level: Vcc2=3V). Furthermore, the write decoder 20 makes all of the word lines WL0 to WL(4m−1) unselected (0V) and sets the potential VPW at the p-well region 202 to 0V. Moreover, the source line driver 120 sets the potential on the source line to 0V. In the read operation, the signal WSG is made low, which electrically isolates VSGPW node from the select gate lines.

Then, the select transistor ST connected to select gate line SG0 is turned on. As a result, if the data written in the memory cell transistor MT connected to the selected word line WL0 and selected local bit line LBL0 is "1", current flows from read global bit line RGBL0 to the source line. On the other hand, if the data written in the memory cell transistor MT is "0", no current flows.

Then, a change in the potential on the read global bit line as a result of current flowing in the memory cell MC is amplified by the sense amplifier 83.

As described above, the read operation is carried out.

When the data is read from the redundancy cells RC, the basic operation is as described above, except that the redundancy global bit lines are connected to the read units 81 by MOS transistors 72-0 to 72-h, not by the select units 71, which differs from the reading of the data from the prime cells PC.

<Read Operation to Read-out Data Output Operation (Redundancy Method)>

Figure 15:
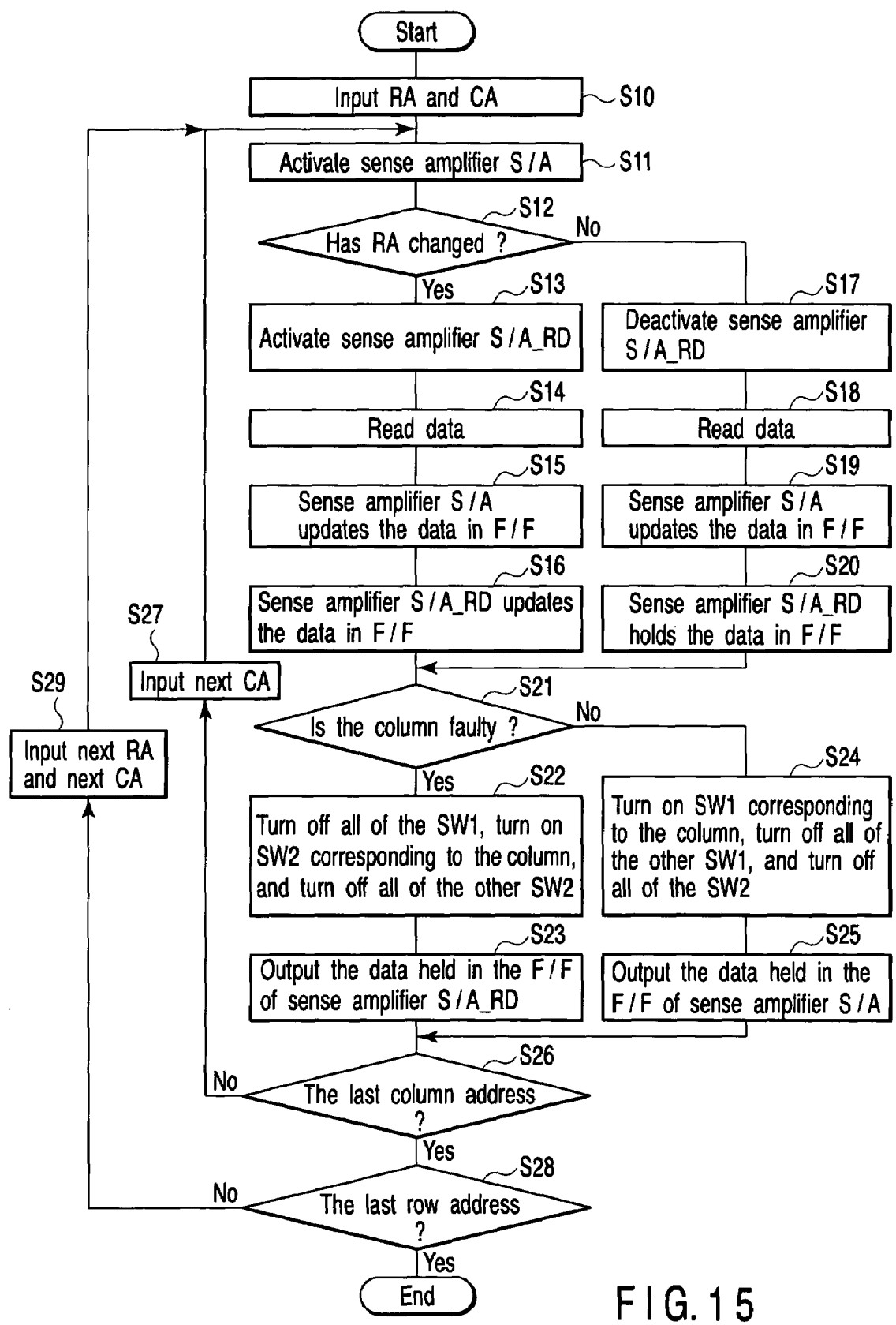
FIG. 15 is a flowchart for a read operation of the 2Tr flash memory according to the first embodiment.

Next, the operation from when the data is read by the above-described method until the read-out data is output to the output buffer 110 will be explained. Explanation will be given, particularly centering on a case where, if a fault has occurred in a column, the faulty column is replaced with a redundancy column. FIG. 15 is a flowchart covering a read operation to a faulty column replacing operation. In the embodiment, explanation will be given using an example of a flash memory from which a plurality of data items are read consecutively in synchronization with a clock signal. In the embodiment, data is read consecutively by changing the column address, while keeping the row address RA unchanged.

As shown in FIG. 15, first, the CPU 2 supplies a row address signal RA and a column address signal CA to the flash memory 3 (step S10). The row address signal RA and column address signal CA are supplied to the address buffer 130. The address buffer 130 then supplies the row address signal RA and column address signal CA to the select gate decoder 30, column decoder 40, and redundancy circuit 90. Then, as described above, the precharge circuits 82 of the read circuit 80 precharge the read global bit line selected by the column selector 70 and all of the redundancy read global bit lines.

After the potentials on the read global bit line and the redundancy read global bit lines have reached a precharge potential, the precharge circuits 82 are turned off. Instead, the sense amp enable signal ASenb goes high, which activates sense amplifiers S/A0 to S/Aj (step S11). The row address transition detector 91 detects the presence or absence of a change in the row address signal RA (step S12).

In step S12, if the row address transition detector 91 detects a change in the row address signal RA, it makes the sense amp enable signal SARDenb high, thereby activating sense amplifiers S/A_RD0 to S/A_RDh (step S13).

Then, the data is read from the prime cells PC and redundancy cells RC (step S14). A method of reading the data is as described above. The sense amplifiers S/A0 to S/Aj have been activated and the data amplified at the inverters 86 are newly stored in the flip-flops 87 (step S15). The same holds true for sense amplifiers S/A_RD0 to S/A_RDh. The data read onto the redundancy read global bit lines are amplified at the inverters 86. The amplified data are stored in the flip-flops 87 (step S16).

In step S12, if the row address transition detector 91 does not detect a change in the row address signal RA, it makes the sense amp enable signal SARDenb low, thereby deactivating sense amplifiers S/A_RD0 to S/A_RDh (step S17).

Then, the data is read from the prime cells PC and redundancy cells RC (step S18). The sense amplifiers S/A0 to S/Aj have been activated and the data amplified at the inverters 86 are newly stored in the flip-flops 87 (step S19). On the other hand, the sense amplifiers S/A_RD0 to S/A_RDh have been deactivated. Therefore, the data in the flip-flops 87 in the sense amplifiers S/A_RD0 to S/A_RDh are not updated. Accordingly, the flip-flops 87 continue holding the previously read data (step S20).

After step S16 or step S20, the redundancy determination circuits 92-0 to 92-i determine whether the column address input in step S10 is for the column in which there is a fault (step S21).

If in step S21, it has been determined that the column has a fault and it has to be replaced with a redundancy read global bit line, any one of the switch circuits 94-0 to 94-h connects the redundancy read global bit line to be replaced with the column to the output buffer 110. In addition, any one of the switch circuits 93-0 to 93-j disconnects the read global bit line corresponding to the column from the output buffer 110 (step S22). As a result, the data held in any one of the sense amplifiers S/A_RD0 to S/A_RDh is output to the output buffer 110 (step S23).

On the other hand, if in step S21, it has been determined that the column is normal and it need not be replaced with a redundancy read global bit line, the switch circuits 94-0 to 94-h disconnect the output nodes of the sense amplifiers S/A_RD0 to S/A_RDh from the output buffer 110. In addition, the switch circuits 93-0 to 93-j connect the output node of any one of the sense amplifiers S/A0 to S/Aj holding the data read onto the corresponding read global bit line to the output buffer (step S24). As a result, the data held in any one of the sense amplifiers S/A0 to S/Aj is output to the output buffer 110 (step S25).

Then, it is determined whether the present column address is the last address at which a read operation is carried out for the row (step S26). If it is not the last address, the row address is kept unchanged and the next column address signal is input (step S27). Then, the processes in step S11 to step S25 are repeated. If the address is the last column address, it is then determined whether the present row address is the last row address at which a read operation is to be carried out (step S28). If it is the last row address, the read operation is completed. If it is not the last row address, the next row address at which a read operation is to be carried out is input. Then, at the row address, the column address at which data is to be read first is input (step S29). Thereafter, the processes in step S11 to step S26 are repeated.

Figure 16:
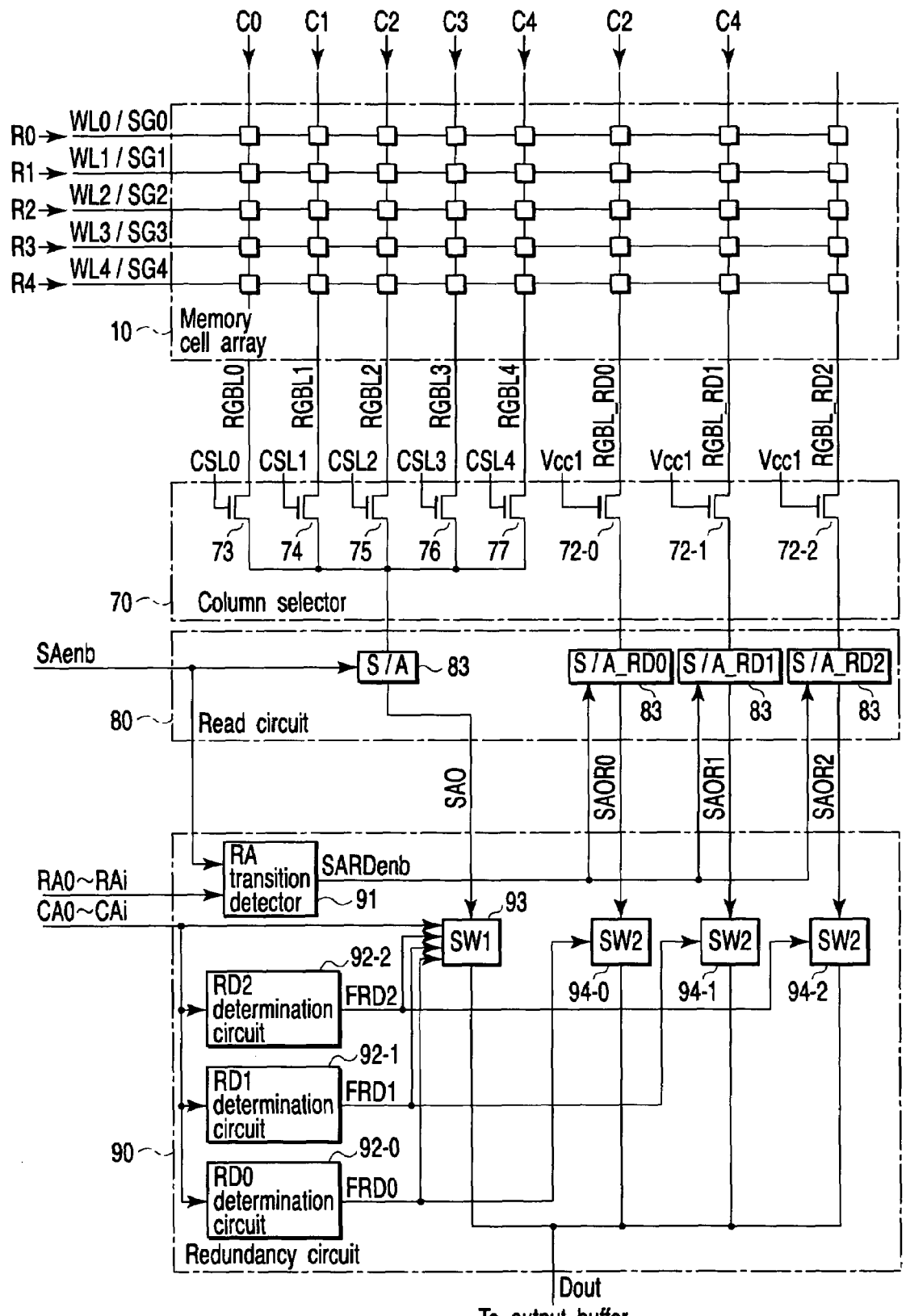
FIG. 16 is a circuit diagram of the memory cell array, column selector, read circuit, and redundancy circuit of the 2Tr flash memory according to the first embodiment.

Referring to FIG. 16, the above operations will be explained in further detail. FIG. 16 is a circuit diagram of a 2Tr flash memory according to the first embodiment. For the sake of simplicity, explanation will be given about a case where the number of word lines, the number of select gate lines, and the number of read global bit lines are each five and the number of redundancy read global bit lines is three.

At the intersections of word lines/select gate lines WL0/SG0 to WL4/SG4 and read global bit lines RGBL0 to RGBL4, prime cells PC are provided. At the intersections of word lines/select gate lines WL0/SG0 to WL4/SG4 and redundancy read global bit lines RGBL_RD0 to RGBL_RD2, redundancy cells RC are provided. The read circuit 80 includes a sense amplifier S/A and three sense amplifiers S/A_RD0 to S/A_RD2. The sense amplifier S/A is connected to any one of the read global bit lines RGBL0 to RGBL4 by MOS transistors 73 to 77 in the column selector 70. In addition, the sense amplifiers S/A_RD0 to S/A_RD2 are connected to redundancy read global bit lines RGBL_RD0 to RGBL_RD2 by MOS transistors 72-0 to 72-2 in the column selector 70, respectively.

Suppose the row address signals RA=R0 to R4 correspond to the word/select gate lines WL0/SG0 to WL4/SG4 respectively and the column address signals CA=C0 to C4 correspond to the read global bit lines RGBL0 to RGBL4 respectively. Moreover, suppose the read global bit lines RGBL2, RGBL4 are replaced with the redundancy read-global bit lines RGBL_RD0, RGBL_RD1. Thus, the redundancy determination circuits 92-0, 92-1 hold column addresses C2, C4, respectively. When the column address signal CA=C2 is input, redundancy read global bit line RGBL_RD0 is selected in place of read global bit line RGBL2. When the column address signal CA=C4 is input, redundancy read global bit line RGBL_RD1 is selected in place of read global bit line RGBL4.

Using FIG. 17, the operation of the flash memory configured as described above will be explained. FIG. 17 is a timing chart for various signals.

Figure 18:
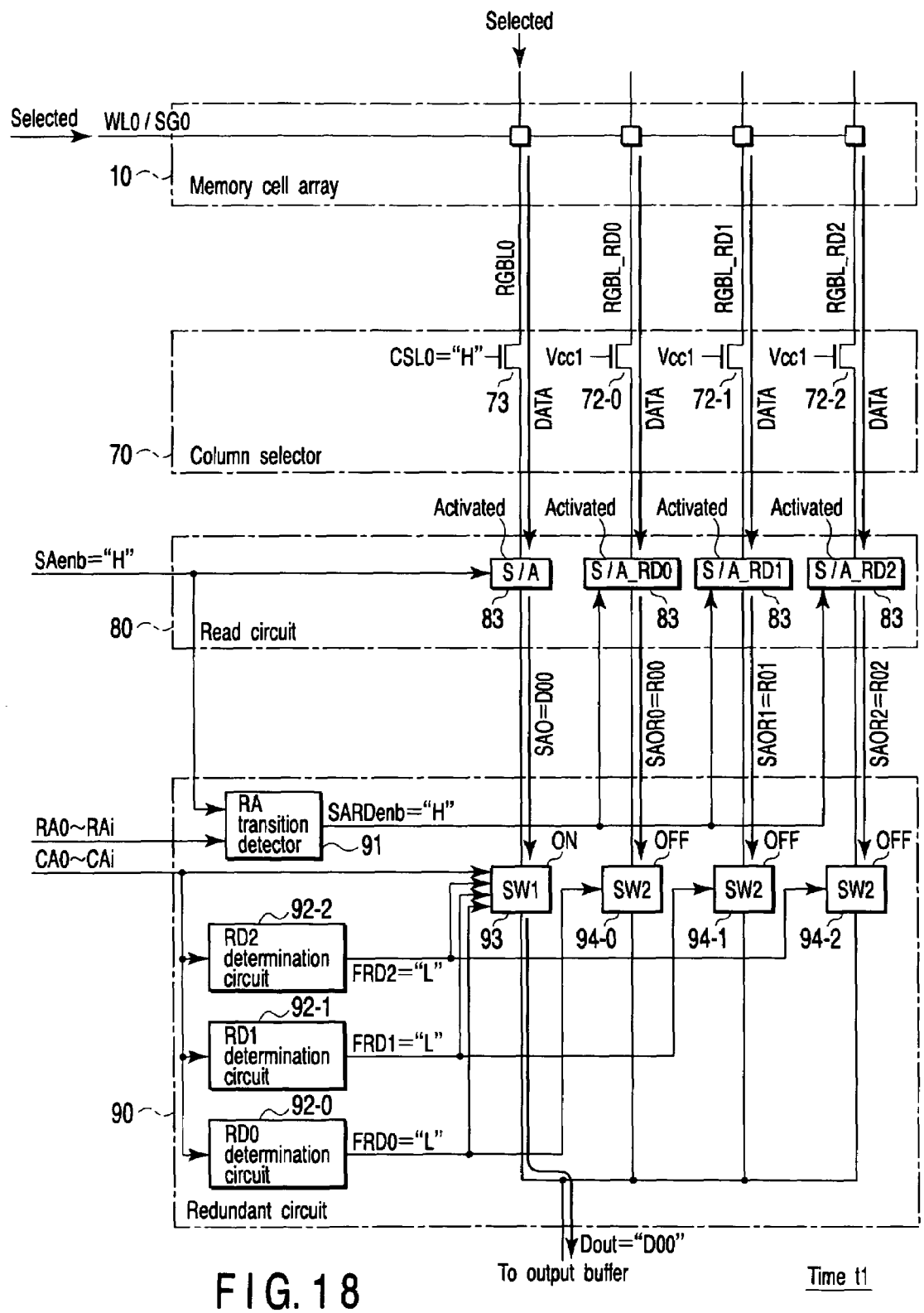
FIGS. 18 to 21 are circuit diagrams of the memory cell array, column selector, read circuit, and redundancy circuit in a read operation of the 2Tr flash memory according to the first embodiment.

As shown in FIG. 17, the row address signal RA, column address signal CA, and sense amp enable signal SAenb are input in synchronization with the clock signal CLK. First, at time t0, the row address signal RA=R0 and the column address signal CA=C0 are input (step S10). Then, at time t1, to start to read the data, the sense amp-enable signal SAenb is made high, which activates the sense amplifier S/A (step S11). FIG. 18 shows the state of the 2Tr flash memory at time t1. As shown in FIG. 18, the sense amp enable signal SAenb is made high and, at time t0, the row address signal RA is input (step S12), with the result that the row address transition detector 91 makes the sense amp enable signal SARDenb high. Thus, not only the sense amplifier S/A but also sense amplifiers S/A_RD0 to S/A_RD2 are activated (step S13). Then, the data is read from the prime cells PC and redundancy cells RC at the intersections of word line/select gate line WL0/SG0 and read global bit lines RGBL0 and at the intersections of word line/select gate line WL0/SG0 and redundancy read global bit lines RGBL_RD0 to RGBL_RD2 (step S14). The operation of reading the data is as explained using FIG. 13.

Then, the sense amplifier S/A amplifies data D00 read onto read global bit line RGBL0 and not only holds the amplified data in the flip-flop 87 but also outputs the amplified data as an output signal SA0 (step S15). Similarly, the sense amplifiers S/A_RD0 to S/A_RD2 amplify data R00, R01, R02 read onto redundancy read global bit lines RGBL_RD0 to RGBL_RD2 and not only hold them in the flip-flops 87 but also output them as output signals SAOR0 to SAOR2 (step S16).

Since there is no fault in read global bit line PRGBL0 corresponding to the column address signal CA=C0 input at time t0 (step S21), all of the redundancy determination circuits 92-0 to 92-2 make the respective control signals FRD00 to FRD2 low. Accordingly, the switch circuits 94-0 to 94-2 are turned off and the switch circuit 93 is turned on (step S24). As a result, the output signal SA0=D00 of the sense amplifier S/A is sent to the output buffer 110 via the switch circuit 93 (step S25).

Figure 19:
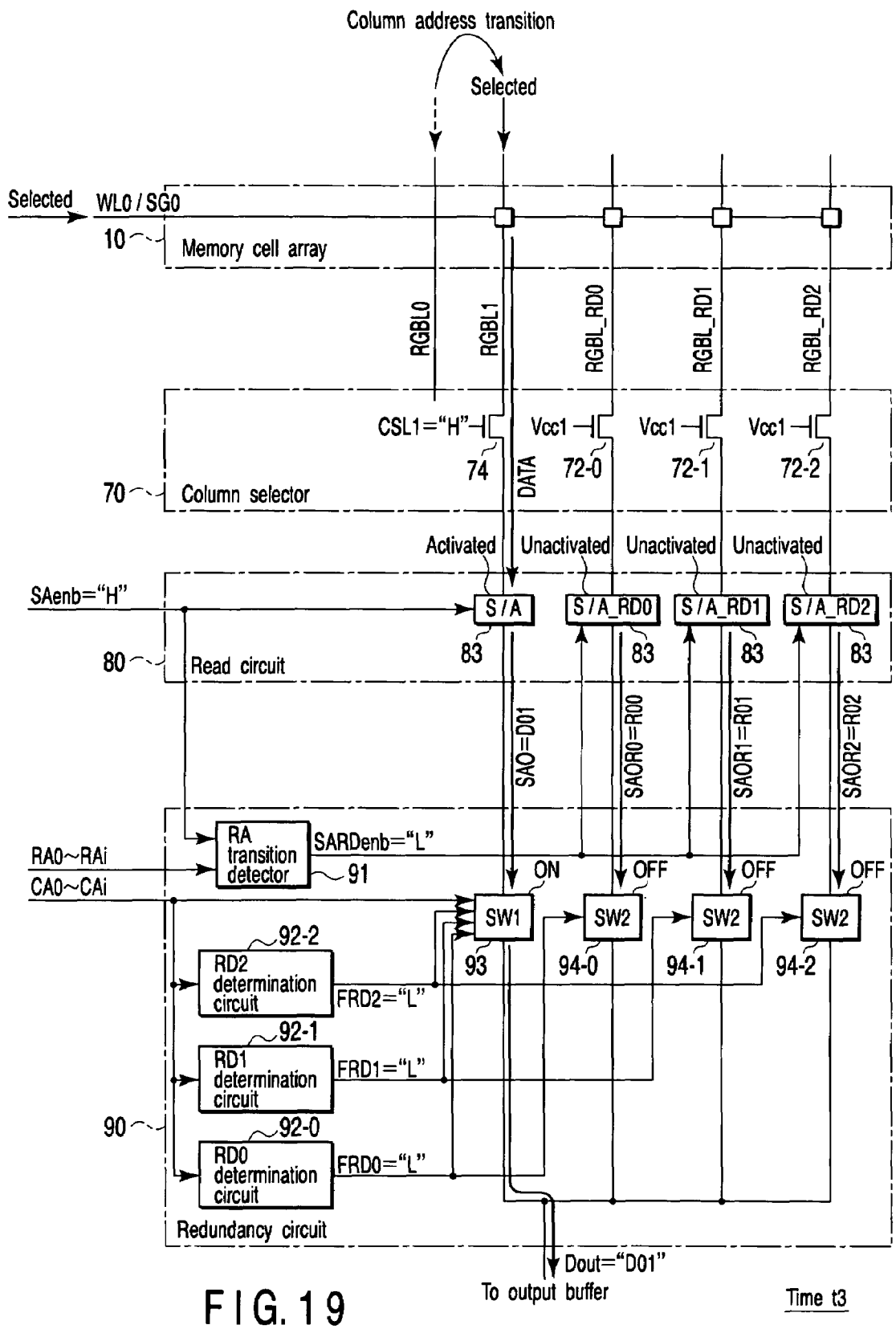

Next, at time t2, the column address signal CA changes from C0 to C1 (step S27). The row address signal PA remains at R0. Then, at time t3, the sense amp enable signal SAenb goes high, which activates the sense amplifier S/A (step S11). FIG. 19 shows the state of the 2Tr flash memory at time t3. Since the row address signal RA remains unchanged (step S12), the row address transition detector 91 makes the sense amp enable signal SARDenb low, which deactivates sense amplifiers S/A_RD0 to S/A_RD2 (step S17). Then, the data is read from the prime cells PC at the intersections of word line/select gate line WL0/SG0 and read global bit line RGBL1 (step S18).

Then, the sense amplifier S/A amplifies data D01 read onto read global bit line RGBL1 and not only holds the amplified data in the flip-flop 87 but also outputs the amplified data as an output signal SA0 (step S19). On the other hand, since sense amplifiers S/A_RD0 to S/A_RD2 are deactivated, they hold data R00, R01, R02 read at time t1, respectively (step S20). Therefore, the output signals SAO0 to SA02 remain at R00, R01, R02, respectively.

Since there is no fault in read global bit line RGBL1 corresponding to the column address signal CA=C1 input at time t2 (step S21), all of the redundancy determination circuits 92-0 to 92-2 make the respective control signals FRD0 to FRD2 low. Accordingly, the switch circuits 94-0 to 94-2 are turned off and the switch circuit 93 is turned on (step S24). As a result, the output signal SA0=DO0 of the sense amplifier S/A is sent to the output buffer 110 via the switch circuit 93 (step S25).

Figure 20:
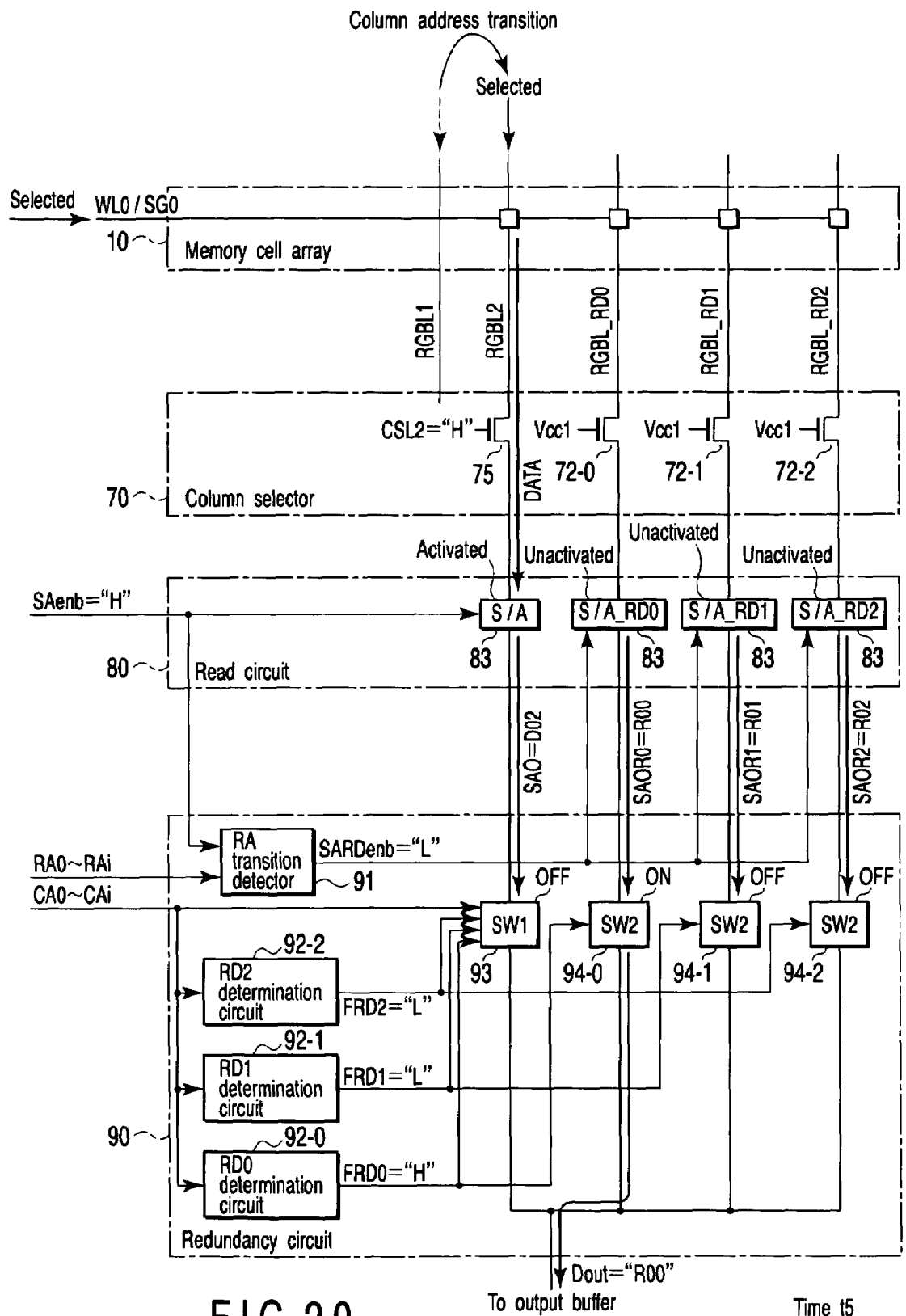

Next, at time t4, the column address signal CA changes from C1 to C2 (step S27). The row address signal RA remains at R0. Then, at time t5, the sense amp enable signal SAenb goes high, which activates the sense amplifier S/A (step S11). FIG. 20 shows the state of the 2Tr flash memory at time t5. Since the row address signal RA remains unchanged (step S12), the row address transition detector 91 makes the sense amp enable signal SARDenb low, which deactivates sense amplifiers S/A_RD0 to S/A_RD2 (step S17). Then, the data is read from the prime cells PC at the intersections of word line/select gate line WL0/SG0 and read global bit line RGBL2 (step S18).

Then, the sense amplifier S/A amplifies data D02 read onto read global bit line RGBL2 and not only holds the amplified data in the flip-flop 87 but also outputs the amplified data as an output signal SA0 (step S19). On the other hand, since sense amplifiers S/A_RD0 to S/A_RD2 are deactivated, they hold data R00, R01, R02 read at time t1, respectively (step S20). Therefore, the output signals SAO0 to SA02 remain at R00, R01, R02, respectively.

There is a fault in read global bit line RGBL2 corresponding to the column address signal CA=C2 input at time t4 (step S21). This is the column to be replaced with redundancy read global bit line RGBL_RD0. Thus, the redundancy determination circuit 92-0 makes control signal FRD0 high. The control signals FRD1, FRD2 output from the other redundancy determination circuits 92-1, 92-2 are at the low level. When control signal FRD0 goes high, this turns off the switch circuit 93 and turns on the switch circuit 94-0 (step S22). The switch circuits 94-1, 94-2 remain off. When the switch circuit 94-0 is turned on, this causes the read-out data SAOR0=R00 held in sense amplifier S/A_RD0 to be sent to the output buffer 110 (step S23). As a result, the prime cell PC at the intersection of word line WL0 and read global bit lines RGBL2 is remedied with the redundancy cell RC at the intersection of word line WL0 and redundancy read global bit line RGBL_RD0.

Next, at time t6, the column address signal CA changes from C2 to C3. At this time, the switch circuits 94-0 to 94-2 are turned off and the switch circuit 93 is turned on, which causes data D03 read onto read global bit line RGBL3 to be sent to the output buffer 110. This is the same as in FIGS. 18 and 19.

At time t8, the column address signal CA changes from C3 to C4. At this time, the switch circuit 94-1 is turned on and the switch circuit 93 is turned off. Thus, instead of data D04 read onto read global bit line RGBL4, data SAOR1=R01 held in sense amplifier S/A_RD1 is sent to the output buffer 110. This is the same as in FIG. 20.

Figure 21:
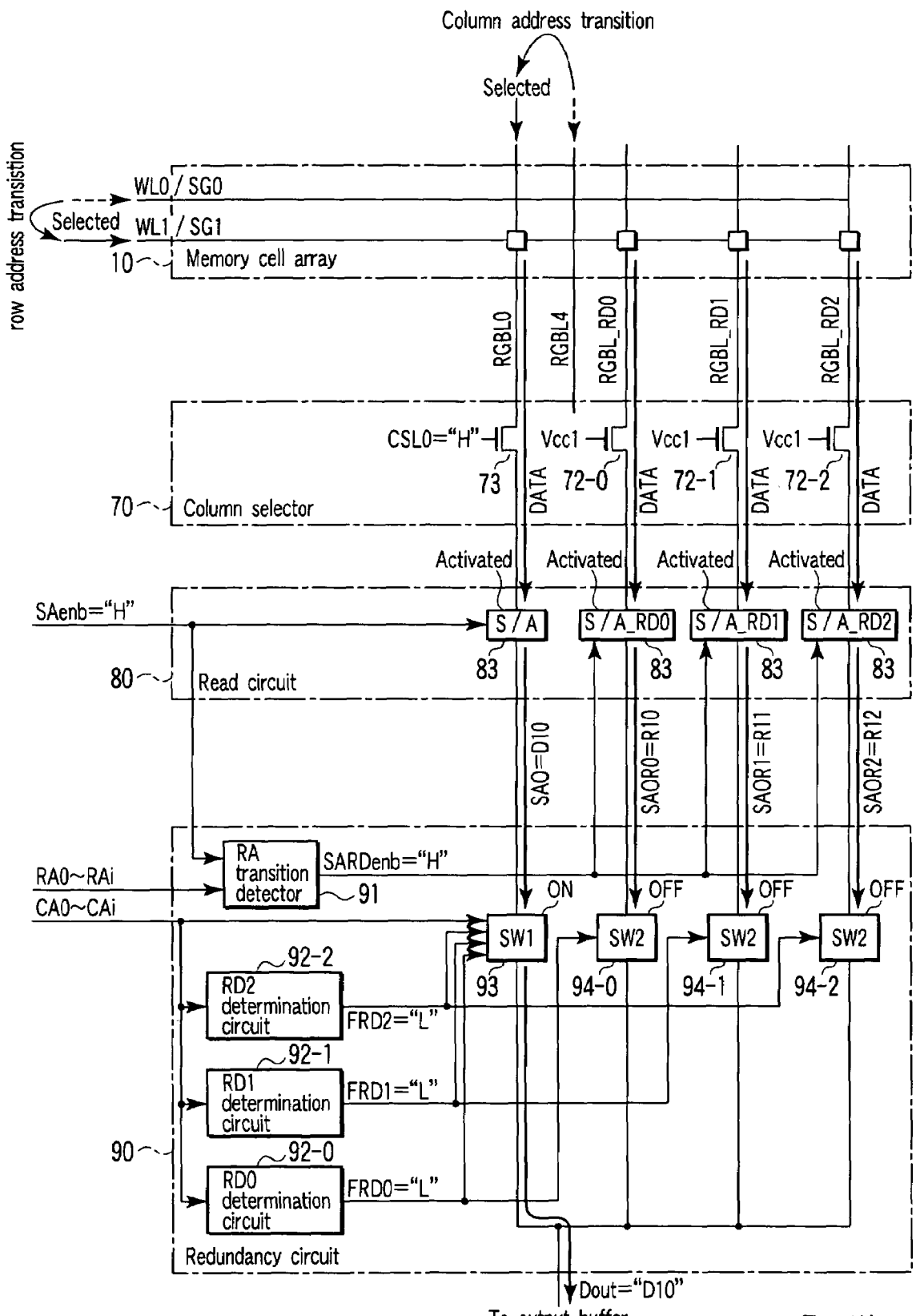

Next, at time t10, not only does the column signal CA change from C4 to C0, but the row address signal RA also changes from R0 to R1. Accordingly, word line WL1 and select gate line SG1 are selected. Then, at time t11, the sense amp enable signal SAenb is made high, which activates the sense amplifier S/A (step S1). FIG. 21 shows the state of the 2Tr flash memory at time t11. As shown in FIG. 21, after the sense amp enable signal SAenb is made high and the row address signal RA changes at time t10 (step S12), the row address transition detector 91 makes the sense amp enable signal SARDenb high. Therefore, not only the sense amplifier S/A but also sense amplifiers S/A_RD0 to S/A_RD2 are activated (step S13). Then, the data is read from the prime cells PC and redundancy cells RC at the intersections of word line/select gate line WL1/SG1 and read global bit line RGBL0 and at the intersections of word line/select gate line WL1/SG1 and redundancy read global bit lines RGBL_RD0 to RGBL_RD2 (step S14).

Then, the sense amplifier S/A amplifies data D10 read onto read global bit line RGBL0 and not only holds the amplified data in the flip-flop 87 but also outputs the amplified data as an output signal SA0 (step S15). Similarly, sense amplifiers S/A_RD0 to S/A_RD2 amplify data R10, RP1, and R12 read onto redundancy read global bit lines RGBL_RD0 to RGBL_RD2 and not only hold the amplified data in the flip-flops 87 but also output the amplified data as output signals SAOR0 to SAOR2 (step S16).

Since there is no fault in read global bit line RGBL0 corresponding to the column address signal CA=C0 input at time t10 (step S21), all of the redundancy determination circuits 92-0 to 92-2 make the respective control signals FRD0 to FRD2 low. Accordingly, the switch circuits 94-0 to 94-2 are turned off and the switch circuit 93 is turned on (step S24). As a result, the output signal SA0=D10 of the sense amplifier S/A is sent to the output buffer 110 via the switch circuit 93 (step S25).

Since subsequent operations are as described above, a detailed explanation of them will be omitted. At times t10, t12, t18, and t20 that the row address signal RA changes, the row address transition detector 91 makes the sense amp enable signal SARDenb high, which activates sense amplifiers S/A_RD0 to S/A_RD2. At other times that the row address does not change, the sense amp enable signal SARDenb is made low, which deactivates sense amplifiers S/A_RD0 to S/A_RD2.

In this way, the read operation is carried out.

As described above, the flash memory according to the first embodiment produces the effects in item (1) to item (5) described below.

(1) The power consumption in a read operation can be reduced.

The flash memory of the first embodiment includes the row address transaction detector 91. In a read operation, only when the row address transition detector 91 has detected a change in the row address signal RA, the sense amplifier S/A_RD is activated.

Figure 23:
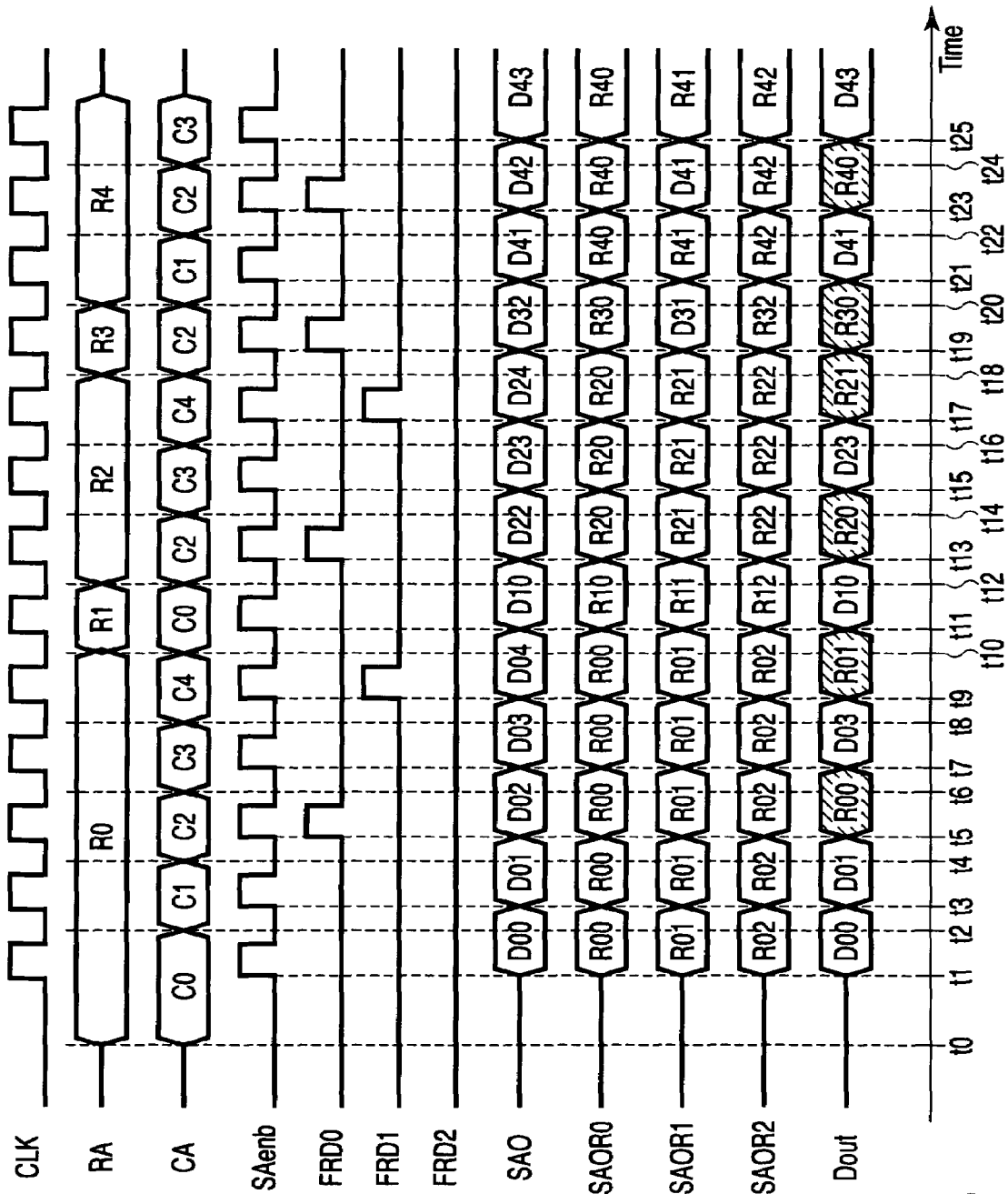
FIG. 23 is a timing chart for various signals in a read operation of the 2Tr flash memory according to the first embodiment.

To just replace a faulty column with a redundancy column, a configuration as shown in FIG. 22 can be considered. FIG. 22 is a circuit diagram of the read circuit and redundancy circuit. Specifically, the sense amplifier S/A_RD is controlled by the sense amp enable signal SAenb without providing a row address transition detector. Even this configuration enables redundancy techniques to be realized. In this configuration, however, like the sense amplifier S/A, the sense amplifier S/A_RD is activated each time the data is read from a memory cell as shown in the timing chart of FIG. 23. However, if the row address RA does not change as seen at, for example, time t1 to time t9 in FIG. 23, the data read onto the redundancy read global bit line RGBL_RD is always the same even when the column address CA changes. That is, a read operation carried out after the first read operation is performed since the change of the row address RA is a completely useless operation for redundancy read global bit lines.

However, with the configuration of the first embodiment, use of the row address transition detector 91 causes the sense amplifier S/A_RD to be activated only in the first clock cycle after the row address RA changes. Thereafter, the sense amplifier S/A_RD keep holding the data read first unless the row address RA changes (e.g., see time t2 to time t9 in FIG. 17). Then, when a read command is given for a faulty column, the data read beforehand by the sense amplifier S/A_RD is output. Therefore, the sense amplifier S/A_RD is not activated uselessly. Consequently, it is possible to suppress the wasteful power consumption in the read circuit 80, which enables the power consumption of the flash memory to be reduced.

(2) A write operation can be simplified.

With the configuration of the first embodiment, in the initial operation before a write operation, the data in the latch circuit 53 is initialized. As a result, the input to the latch circuit 53 is made low and its output is made high.

In a data latch operation, when "1" data is written, 0V is applied to the MOS transistor 62 (the selected bit line). When "0" data is written, 3V is applied to the MOS transistor (an unselected bit line). However, since the MOS transistor 62 is cut off in writing "0" data, externally supplied "0" data is not actually transferred to the latch circuit 53. Specifically, the data in the latch circuit 53 remains unchanged. On the other hand, when "1" data is written, "1" data is transferred to the latch circuit 53 via the current path of the MOS transistor 62.

Specifically, when "0" data is written (onto the selected bit line), the latch circuit 53 applies the voltage VBLPW to the selected bit line on the basis of the initialized data. On the other hand, when "1" data is written (to an unselected bit line), the latch circuit 53 applies the write inhibit voltage VPI to the unselected line on the basis of externally input data, not the initialized data.

Therefore, "the latch circuit 53 is initialized in the initial operation" can be paraphrased as follows: "0" data is input to all of the latch circuits. Thus, in a write operation, only when "1" is written, or when no electron is injected to the floating gate, or in other words, when data is written onto the unselected bit lines, data is input from the outside. Then, when "0" data is written, or when electrons are injected to the floating gate, or in other words, data is written onto the selected bit line, there is no need to input data from the outside. Consequently, the write operation can be simplified.

(3) The operating speed of the flash memory can be improved.

With the configuration of the first embodiment, the bit lines are hierarchized into the local bit lines and the global bit lines (read global bit lines and write global bit lines). That is, a plurality of memory cells are connected to each of a plurality of local bit lines. A plurality of local bit lines are connected to each of a plurality of global bit lines. In the example of FIG. 2, 2(m+1) local bit lines (LBL0 and LBL1 or LBL2 and LBL3) are connected to one write global bit line WGBL via the write column selector WCS. Then, four memory cells are connected to each of the local bit lines LBL. In addition, 4(m+1) local bit lines (LBL0 to LBL3) are connected to one read global bit line RGBL via the read column selector RCS. Then, four memory cells are connected to each of the local bit lines.

In a write operation, only the local bit line LBL to which the selected memory cell has been connected is connected to the write global bit line WGBL. The local bit lines LBL to which the selected memory cell has not been connected are electrically isolated from the write global bit line WGBL by the write column selector WCS. Therefore, only one local bit line including the selected memory cell, that is, four memory cells, can be seen from one write global bit line WGBL. Therefore, only the four memory cells MC contribute to the parasitic capacitance on the write global bit line WGBL. The unselected memory cells which are in the same column as the selected memory cell and are connected to a different local bit line LBL do not contribute to the parasitic capacitance on the write global bit line. Therefore, it is possible to decrease the parasitic capacitance on the write global bit line remarkably. The same holds true for a read operation.

As described above, since the parasitic capacitance on the write global bit line and read global bit line are reduced, the operating speed of the flash memory can be improved.

(4) The read speed can be improved.

In the flash memory, relatively high voltages, including VPP1, VBB1 and VBB2, have to be handled in a write operation. To meet this requirement, high-withstand-voltage MOS transistors whose gate insulating film is thick have to be used. On the other hand, the voltages handled in a read operation are lower than in a write operation. Therefore, as far as a read operation is concerned, it is desirable that low-withstand-voltage MOS transistors whose gate insulating film is thin should be used. Even from the viewpoint of operating speed, it is desirable that low-withstand-voltage MOS transistors should be used.

In this respect, with the configuration of the first embodiment, the local bit lines are connected to the write global bit lines and read global bit lines. Then, the memory cells are connected to the write circuit 50 via the write global bit lines and to the read circuit 80 via the read global bit lines. That is, the signal route for a write operation differs from the signal route for a read operation. Therefore, in the signal route in a read operation, all of the circuits excluding the read column selector RCS that connects the read global bit lines to the local bit lines can be made using the transistors whose gate insulating film is thin. As a result, the read operating speed can be improved.

(5) The reliability of a write operation can be improved.

As explained in item (3), the bit lines are hierarchized. When the write route is particularly considered, a plurality of local bit lines are connected to one write global bit lines. Then, in a write operation, only one local bit line including the selected memory cell is electrically connected to the write global bit line. The other local bit lines are electrically isolated from the write local bit line. Therefore, the voltage corresponding to the write data is not applied to the local bit lines to which the selected memory cell is not connected. Therefore, the memory cells connected to these local bit lines can be prevented effectively from being written into erroneously, which enables the reliability of the write operation to be improved.

Figure 24:
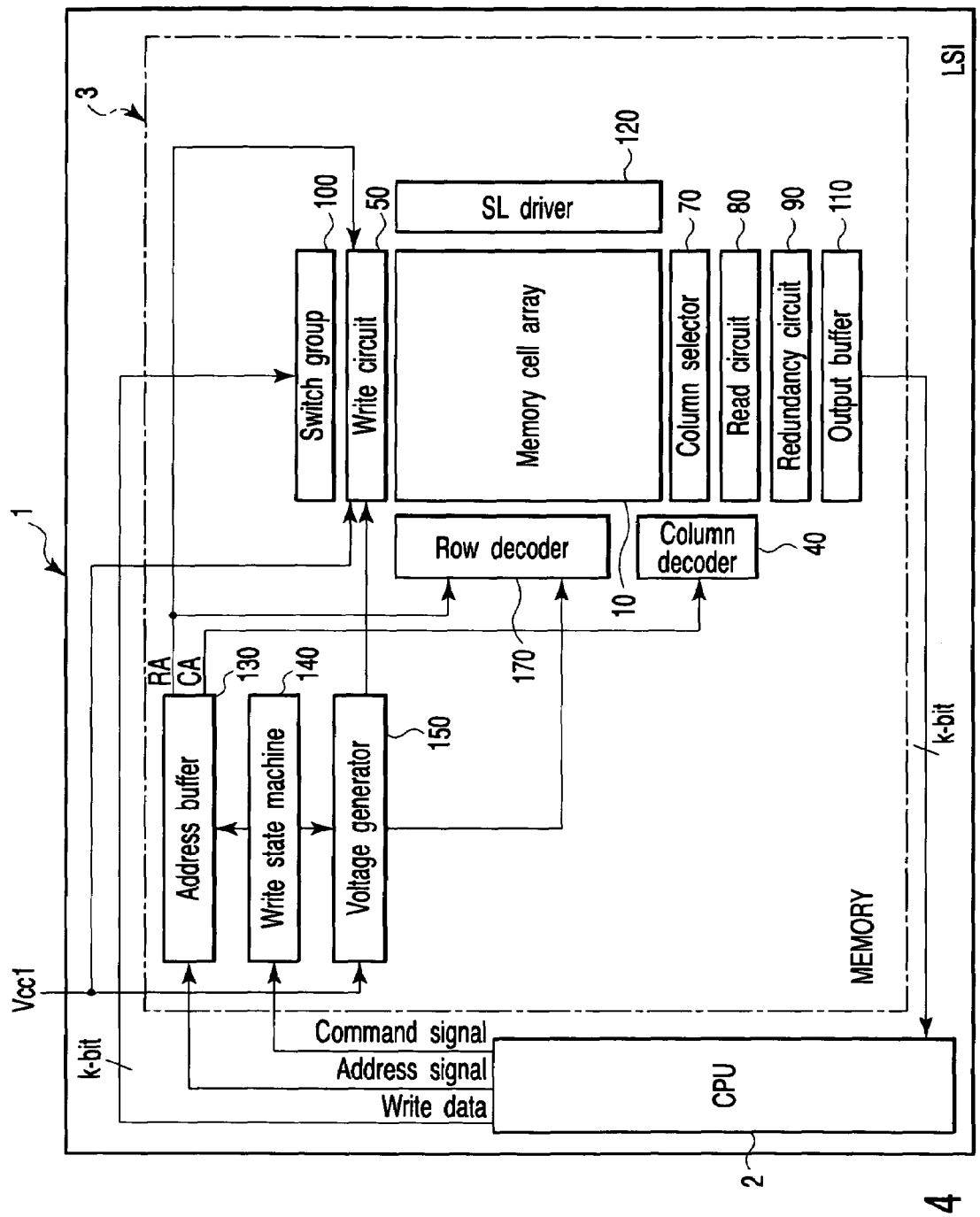
FIG. 24 is a block diagram of a system LSI according to a second embodiment of the present invention.

Next, using FIG. 24, a semiconductor memory device according to a second embodiment of the present invention will be explained. FIG. 24 is a block diagram of a system LSI according to the second embodiment. The second embodiment is such that the first embodiment is applied to a 3Tr-NAND flash memory. Hereinafter, only what differs from the first embodiment will be explained.

As shown in FIG. 24, the system LSI 1 of the second embodiment is such that a row decoder 170 is provided instead of the write decoder 20 and select gate decoder 30 in the configuration of FIG. 1 in the first embodiment.

Figure 25:
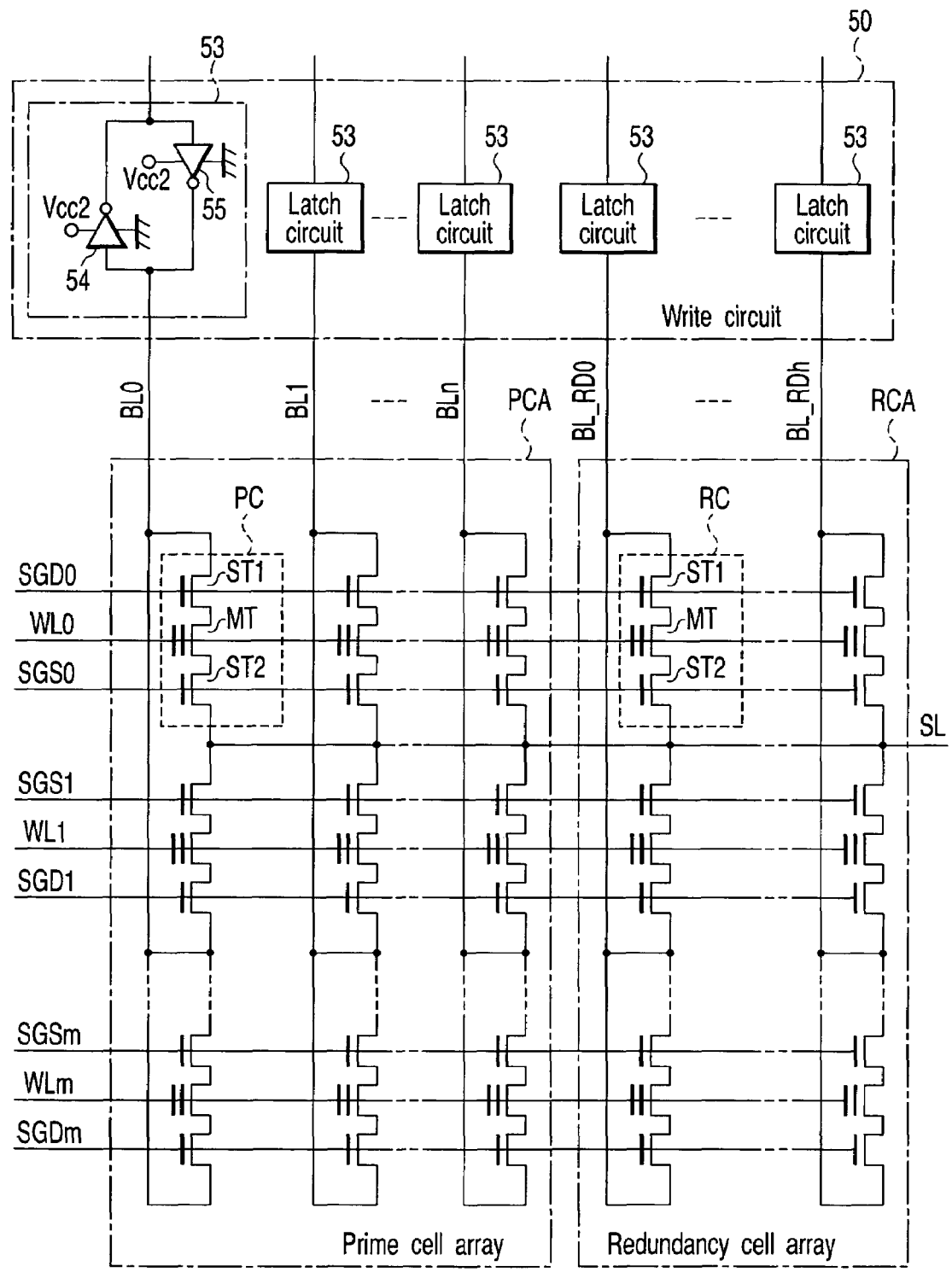
FIG. 25 is a circuit diagram of the memory cell array and write circuit included in a 3Tr-NAND flash memory according to the second embodiment.

FIG. 25 is a circuit diagram of the memory cell array 10 and write circuit 50. As shown in FIG. 25, the memory cell array 10 includes a prime cell array PCA and a redundancy cell array RCA. The prime cell array PCA has (m+1)×(n+1) prime cells PC arranged in a matrix. The redundancy cell array RCA has (m+1)×(h+1) redundancy cells RC arranged in a matrix.

Each of the prime cells PC and redundancy cells RC includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a floating gate formed on a semiconductor substrate with a gate insulating film interposed therebetween and a control gate formed on the floating gate with an inter-gate insulating film interposed therebetween. Each of the select transistors ST1, ST2 has a multilayer gate structure that includes a first polysilicon layer formed on the semiconductor substrate with a gate insulating film interposed therebetween and a second polysilicon layer formed on the first polysilicon layer with an intergate insulating film interposed therebetween. The source region of the select transistor ST1 is connected to the drain region of the memory cell transistor MT. The source region of the memory cell transistor MT is connected to the drain region of the select transistor ST2. Memory cells MC adjoining each other in the column direction share the drain region of the select transistor ST1 or the source region of the select transistor ST2.

The control gates of the memory cell transistors MT of the prime cells PC and redundancy cells RC in a same row are connected commonly to any one of the word lines WL0 to WLm. The gates of the select transistors ST1 of the prime cells PC and redundancy cells RC in a same row are connected commonly to any one of select gate lines SGD0 to SGDm. The gates of the select transistors ST2 in a same row are connected commonly to any one of select gate lines SGS0 to SGSm. The drain regions of the select transistors ST1 of the prime cells PC in a same column are connected commonly to any one of bit lines BL0 to BLn. In addition, the drain regions of the select transistors ST1 of the redundancy cells RC in the same column are connected commonly to any one of redundancy bit lines BL_RD0 to BL_RDh.

Bit lines BL0 to BLn and redundancy bit lines BL_RD0 to BL_RDh are connected to the corresponding latch circuits 53. Moreover, bit lines BL0 to BLn are connected to the select units 71 of the column selector 70. Redundancy bit lines BL_RD0 to BL_RDh are connected to the MOS transistors 72-0 to 72-h of the column selector 70. The source regions of the select transistors ST2 of the prime cells PC and redundancy cells RC are connected commonly to a source line SL and further connected to the source line driver 120.

In the memory cell array 10 with the above configuration, a plurality of columns of memory cells MC located at one end of the memory cell array 10 function as redundancy cells RC. The redundancy cells RC share the word lines WL and select gate lines SGS, SGD with the prime cells PC, but have different bit lines from those of the prime cells PC.

The write circuit 50 latches write data. As shown in FIG. 25, the configuration of the write circuit 50 is as explained in the first embodiment, except that the high-voltage-side power supply voltage of the inverters 54, 55 in the latch circuit 53 is Vcc (3V) and their lower-voltage-side power supply voltage is 0V.

The row decoder 170 decodes a row address signal, thereby producing a row address decode signal. Then, on the basis of the row address decode signal, the row decoder selects a word line and a select gate line.

The voltage generator 150 generates a plurality of internal voltages on the basis of the voltage Vcc1 externally input. The voltage generator, which includes a positive charge pump circuit, generates positive voltages VPP2 (e.g., 18V) and VPP3 (e.g., 4.5V).

In the above configuration, as in the first embodiment, the redundancy cell array RCA replaces the column including a fault in the prime cell array with a redundancy one.

Figure 26:
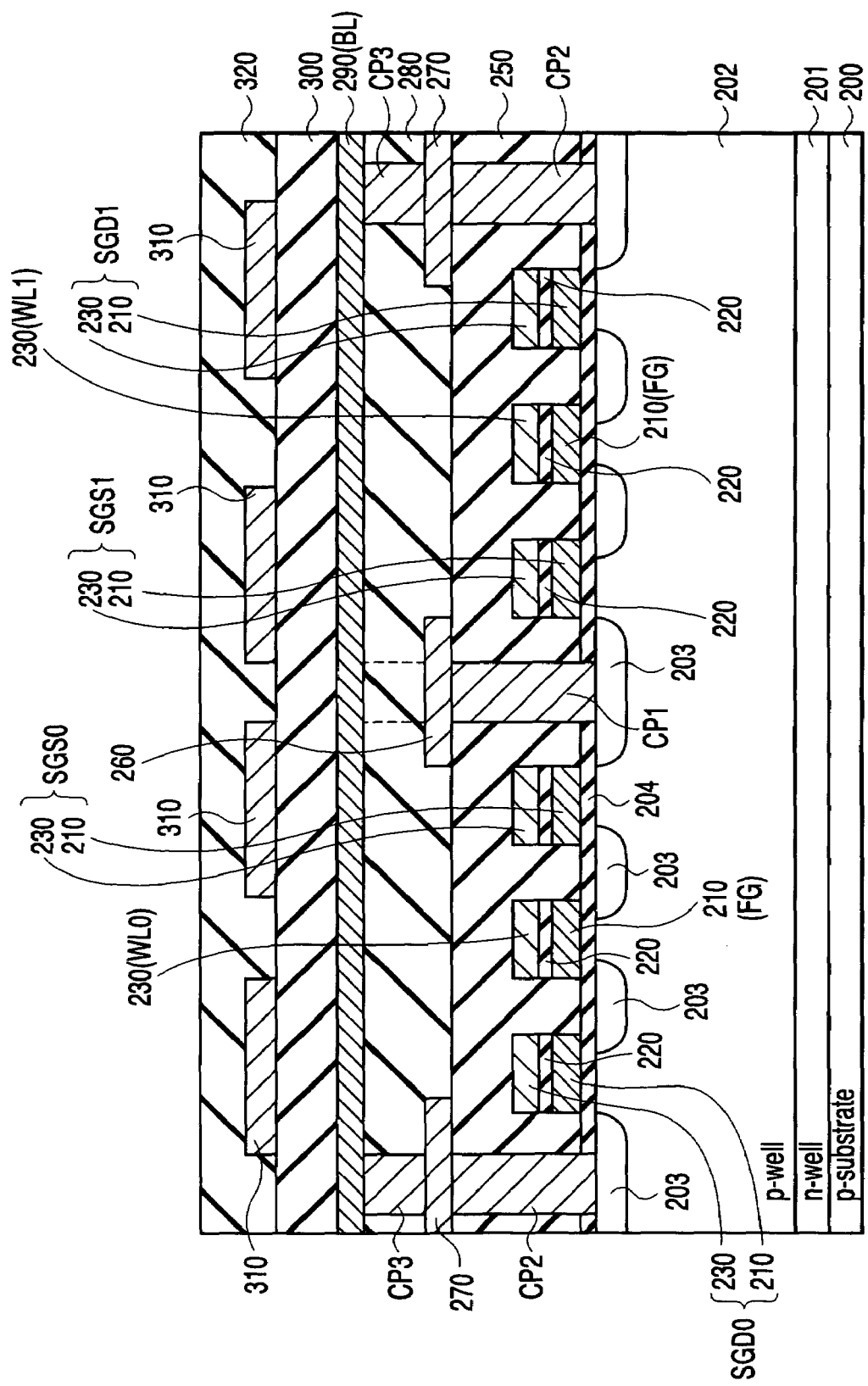
FIG. 26 is a sectional view, taken along a bit line, of the memory cell array included in the 3Tr-NAND flash memory according to the second embodiment.

Next, using FIG. 26, a sectional structure of the memory cell array 10 with the above configuration will be explained. FIG. 26 is a sectional view, taken along a bit line, of the prime cell array PCA in the memory cell array 10. A sectional structure of the redundancy cell array RCA is the same as that of the prime cell array PCA, except that the bit lines are replaced with redundancy bit lines. Therefore, only the prime cell array PCA will be explained hereinafter.

As shown in FIG. 26, at the surface of the p-type semiconductor substrate 200, an n-well region 201 is formed. At the surface of the n-well region 201, a p-well region 202 is formed. On the p-well region 202, the gate electrodes of a memory cell transistor MT and select transistors ST1, ST2 are formed with a gate insulating film 204 interposed therebetween. Each of the gate electrodes of the memory cell transistor MT and select transistors ST1, ST2 has a polysilicon layer 210 formed on the gate insulating film 204, an inter-gate insulating film 220 formed on the polysilicon layer 210, and a polysilicon layer 230 formed on the inter-gate insulating film 220 as in the first embodiment.

In the memory cell transistor MT, the polysilicon layers 210, which are isolated from one another between adjacent element regions AA along the word line, function as floating gates. The polysilicon layers 230 function as control gates (or word lines WL) and are connected to each other between adjacent element regions AA.

In each of the select transistors ST1, ST2, the polysilicon layers 210, 230, are connected to each other between adjacent element regions AA, function as select gate lines SGS, SGD, respectively. The polysilicon layers 230 of the select transistors ST1, ST2 are put in an electrically floating state as described in the first embodiment. Therefore, it is only the polysilicon layers 210 that practically function as select gate lines SGS, SGD.

Then, at the surface of the p-well region 202 located between adjacent gate electrodes, an impurity diffused layer 203 is formed. The impurity diffused layer 203 is shared by adjacent transistors.

As described above, memory cells MC including memory cell transistors MT and select transistors ST are formed so as to have the following relationship. Adjacent memory cells MC, MC have their select transistors ST1 adjoining each other and their select transistors ST2 adjoining each other. The adjoining ones share an impurity diffused layer 203.

On the p-well region 202, an interlayer insulating film 250 is formed so as to cover the memory cell transistor MT and select transistor ST. In the interlayer insulating film 250, a contact plug CP1 reaching the impurity diffused layer (or source region) 203 shared by two select transistors ST2, ST2 is formed. On the interlayer insulating film 250, a metal wiring layer 260 connected to the contact plug CP1 is formed. The metal wiring layer 260 functions as a source line SL. Further in the interlayer film 250, a contact plug CP2 reaching the impurity diffused layer (or drain region) 203 shared by two select transistors ST2, ST2 is formed. On the interlayer insulating film 250, a metal wiring layer 270 connected to the contact plug CP2 is formed.

On the interlayer insulating film 250, an interlayer insulating film 280 is formed so as to cover the metal wiring layers 260, 270. In the interlayer insulating film 280, a contact plug CP3 reaching the metal wiring layer 270 is formed. On the interlayer insulating film 280, a metal wiring layer 290 connected commonly to a plurality of contact plugs CP3 is formed. The metal wiring layer 290 function as local bit lines LBL0 to LBLn or redundancy bit lines BL_RD0 to BL_RDh. In the interlayer insulating film 280, contact plugs each reaching the metal wiring layer 260 are formed. A metal wiring layer which connects the contact plugs to one another in the bit line direction is formed in a region (not shown) on the interlayer insulating film 280. The metal wiring layer functions as a part of the source line SL.

On the interlayer insulating film 280, an interlayer insulating film 300 is formed so as to cover the metal wiring layer 290. On the interlayer insulating film 300, metal wiring layers 310 are formed. The metal wiring layers 310 function as shunt wires for select gate lines SGS, SGD. The interconnections of the metal wiring layers 310 are arranged at equal intervals. On the interlayer insulating film 300, an interlayer insulating film 320 is formed so as to cover the metal wiring layer 310.

Next, the operation of the 3Tr-NAND flash memory configured as described above will be explained.

<Write Operation>

First, using FIG. 27, a write operation will be explained. FIG. 27 is a circuit diagram of the memory cell array 10 of the 3Tr-NAND flash memory 3. For simplification, FIG. 27 shows a case where the number of prime cells PC is (4×4). Data is written simultaneously into all of the memory cell transistors connected to any one of the word lines. Either "0" data or "1" data is written, depending on whether electrons are injected into the floating gate of a memory cell transistor MT. Electrons are injected into the floating gate by FN tunneling. In FIG. 27, it is assumed that data is written into the memory cell transistors MT connected to word line WL0. Of the memory cell transistors MT, "0" data is written into the memory cell transistor MT connected to bit line BL1 and "1" data is written into the memory cell transistors MT connected to bit lines BL0, BL2, BL3. The same holds true for a method of writing data into the redundancy cells RC.

First, the CPU 2 inputs write data ("1" or "0"). Then, the latch circuit 53 in the write circuit 50 latches the write data on a bit line basis. If "1" data is input, the latch circuit 53 applies Vcc2 (e.g., 3V) to the bit line. Conversely, if "0" data is input, the latch circuit 51 applies 0V to the bit line. That is, as shown in FIG. 27, the latch circuit 53 applies Vcc2 to bit lines BL0, BL2, BL3 and 0V to bit line BL1.

Then, the row decoder 170 selects any one of the select gate lines SGD and applies Vcc1 to the selected select gate line SGD and 0V to the unselected select gate lines SGD and all of the select gate lines SGS. That is, as shown in FIG. 27, the row decoder 170 selects select gate line SGD0 and applies Vcc2 to the selected select gate line SGD0 and 0V to the other select gate lines SGS0, SGD1, SGS1, SGD2, SGS2, SGD3, SGS3.

As a result, of the select transistors ST1 connected to the selected select gate line SGD, the select transistor ST1 connected to the bit line BL to which Vcc2 is applied is in the cut-off state. On the other hand, the select transistor ST1 connected to the bit line BL to which 0V is applied is in the on state.

Furthermore, the row decoder 170 selects any one of the word lines and applies VPP2 (18V) to the selected word line WL. In addition, the row decoder applies 0V to all of the unselected word lines. Here, the word line WL selected is the one connected to the memory cell MC including the selected select gate line SGD. As a result, a channel region is formed in the memory cell transistor MT connected to the selected word line WL. Since the select transistor ST1 connected to the selected select gate line SGD and the bit line to which Vcc2 is applied is in the cut-off state, the channel potential of the memory cell transistor MT connected to the select transistor ST1 is in the floating state. Then, coupling with the word line WL, the channel potential rises to about 18V. On the other hand, since the select transistor ST1 connected to the selected select gate line SGD and the bit line to which 0V is applied is in the on state, the channel potential of the memory cell transistor MT connected to the select transistor ST1 is at 0V.

Specifically, as shown in FIG. 27, the row decoder 170 not only selects word line WL0 and applies VPP2 to the selected word line WL0 but also applies 0V to the unselected word lines WL1 to WL3. Therefore, a channel region is formed in the memory cell transistors MT connected to word line WL0. Then, since 0V is applied to bit line BL1, the channel potential Vch of the memory cell transistors MT in the memory cell including the select transistor ST1 connected to bit line BL1 is 0V. On the other hand, since Vcc1 is applied to bit lines BL0, BL2, BL3, the channel potential Vch of the memory cell transistors MT in the memory cell including the select transistors ST1 connected to bit lines BL0, BL2, BL3 rises to about 18V as a result of coupling with the word line WL0.

Moreover, the row decoder 170 applies 0V to the p-well region 202 in which memory cells have been formed.

As a result, in the memory cell transistor MT in the memory cell including the select transistor ST1 cut off, since the potential difference between the gate and channel is insufficient, no electron is injected into the floating gate. That is, the threshold value of the memory cell connected to the bit line applied with Vcc1 and the selected word line WL (or the memory cell into which "1" data is to be written) remains negative. In the example of FIG. 27, no electron is injected into the floating gate of the memory cell transistors MT connected to bit lines BL0, BL2, BL3 and word line WL0. In other words, "1" data is written into the memory cell transistors MT connected to bit lines BL0, BL2, BL3 and the selected word line WL0.

On the other hand, in the memory cell transistor MT in the memory cell including the select transistor ST1 connected to the selected select gate line SGD and to the bit line BL applied with 0V, since the potential difference between the gate and channel is 18V, electrons are injected into the floating gate by FN tunneling. As a result, the threshold value of the memory cell transistor MT changes to positive. That is, "0" data is written. In the example of FIG. 27, VPP2 is applied to word line WL0, with the result that the potential difference between the gate and channel of the memory cell transistor MT connected to bit line BL1 and word line WL0 is 18V. Therefore, electrons are injected into the floating gate of the memory cell transistor MT connected to bit line BL1 and word line WL0. The threshold value of the memory cell transistor MT into which electrons have been injected changes to positive, which means that "0" data has been written.

As described above, the data is written into one page of memory cell transistors simultaneously.

<Erase Operation>

Figure 28:
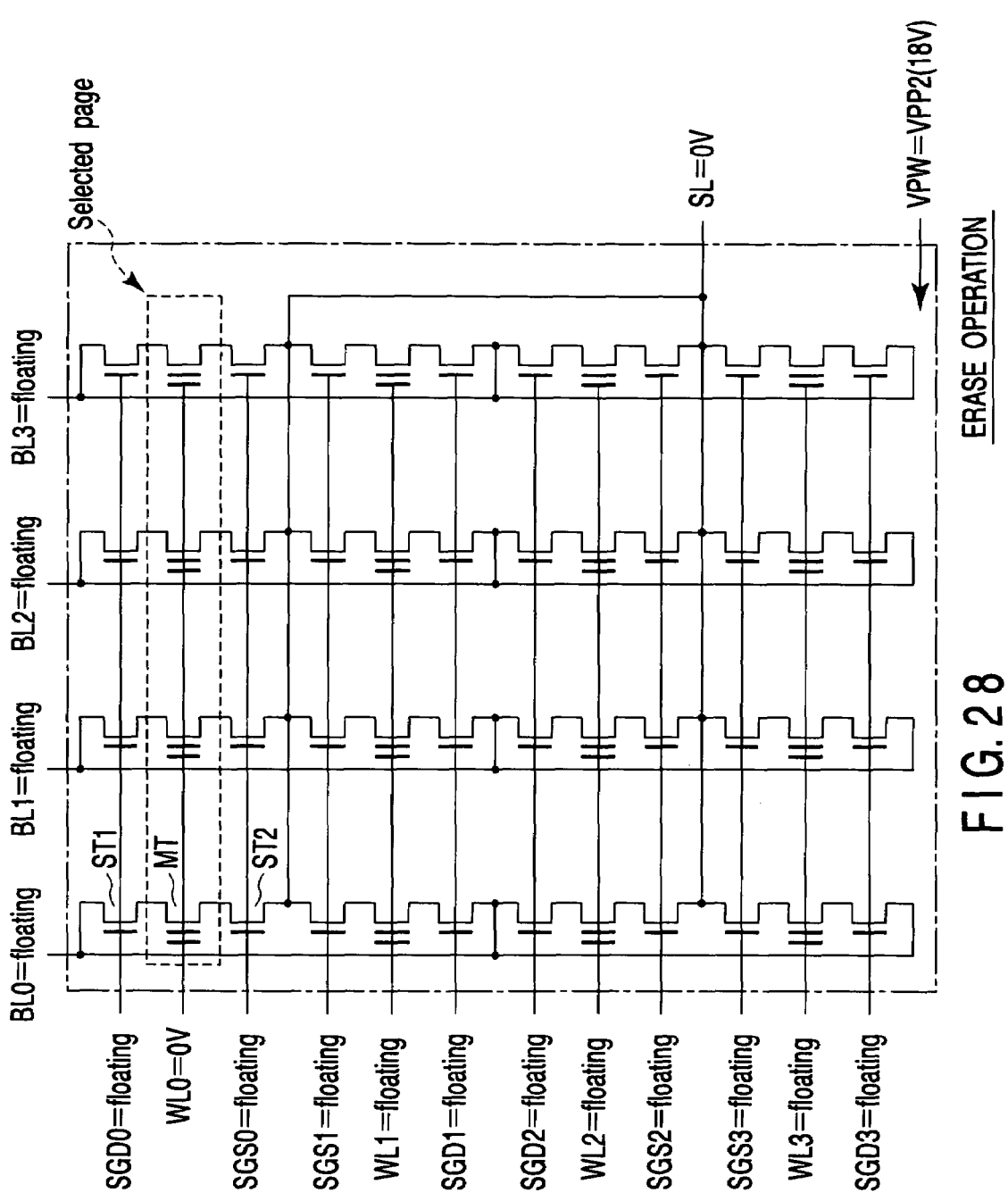
FIG. 28 is a circuit diagram of the memory cell array in an erase operation of the 3Tr-NAND flash memory according to the second embodiment.

Next, using FIG. 28, an erase operation will be explained. FIG. 28 is a circuit diagram of the memory cell array 10 of the 3Tr-NAND flash memory 3. For simplification, FIG. 28 shows a case where the number of prime cells is (4×4). Data is erased in pages simultaneously. An erase operation is carried out by pulling electrons out of the floating gate by FN tunneling. FIG. 28 shows a case where the data is erased from the memory cell transistors connected to word line WL0. The same holds true for a method of erasing the data from the redundancy cells RC.

Before erasing is done, all of the bit lines BL are brought into the floating state. In addition, the row decoder 170 puts all of the select gate lines SGD, SGS in the floating state. Then, the row decoder 170 not only selects any one of the word lines and applies 0V to the selected word line WL but also brings the unselected word lines WL into the floating state. In addition, the row decoder 170 applies VPP2 (18V) to the p-well region 202 in which memory cells have been formed. That is, as shown in FIG. 28, 0V is applied to the selected word line WL0 and the unselected word lines WL1 to WL3 are put in the floating state. Moreover, all of the select gate lines SGD0, SGS0, SGD1, SGS1 are brought into the floating state.

Then, the potential difference between the memory cell transistors MT connected to the selected word line WL and the well region 202 is 18V, causing the electrons in the floating gate to be pulled out into the p-well region 202. As a result, the data is erased from the memory cell transistors MT connected to the selected word line, with the result that the threshold value of the memory cell transistors MT becomes negative. That is, as shown in FIG. 28, electrons are pulled out of the floating gates of all the memory cell transistors MT connected to word line WL0 into the p-well region 202, thereby erasing the data.

In the memory cell transistors MT connected to the unselected word lines, the potentials on the word lines WL rise to about 18V because of coupling with the semiconductor substrate. As a result, electrons are not pulled out of the floating gates, with the result that the data is not erased. That is, as shown in FIG. 28, the potentials on the word lines WL1 to WL3 rise by coupling. As a result, the data is not erased from all of the memory cell transistors MT connected to word lines WL1 to WL3. In addition, the potentials on the select gate lines also rise to about 18V by coupling, which prevents voltage stress from being applied to the gate insulating films of the select transistors ST.

As described above, the data is erased simultaneously from the selected page. In the example of FIG. 28, while the data has been erased from (one page of) the memory cell transistors connected to one word line, the data may be erased simultaneously from the memory cell transistors connected to a plurality of word lines. In this case, the row decoder 170 applies 0V to a plurality of word lines.

<Read Operation>

Figure 29:
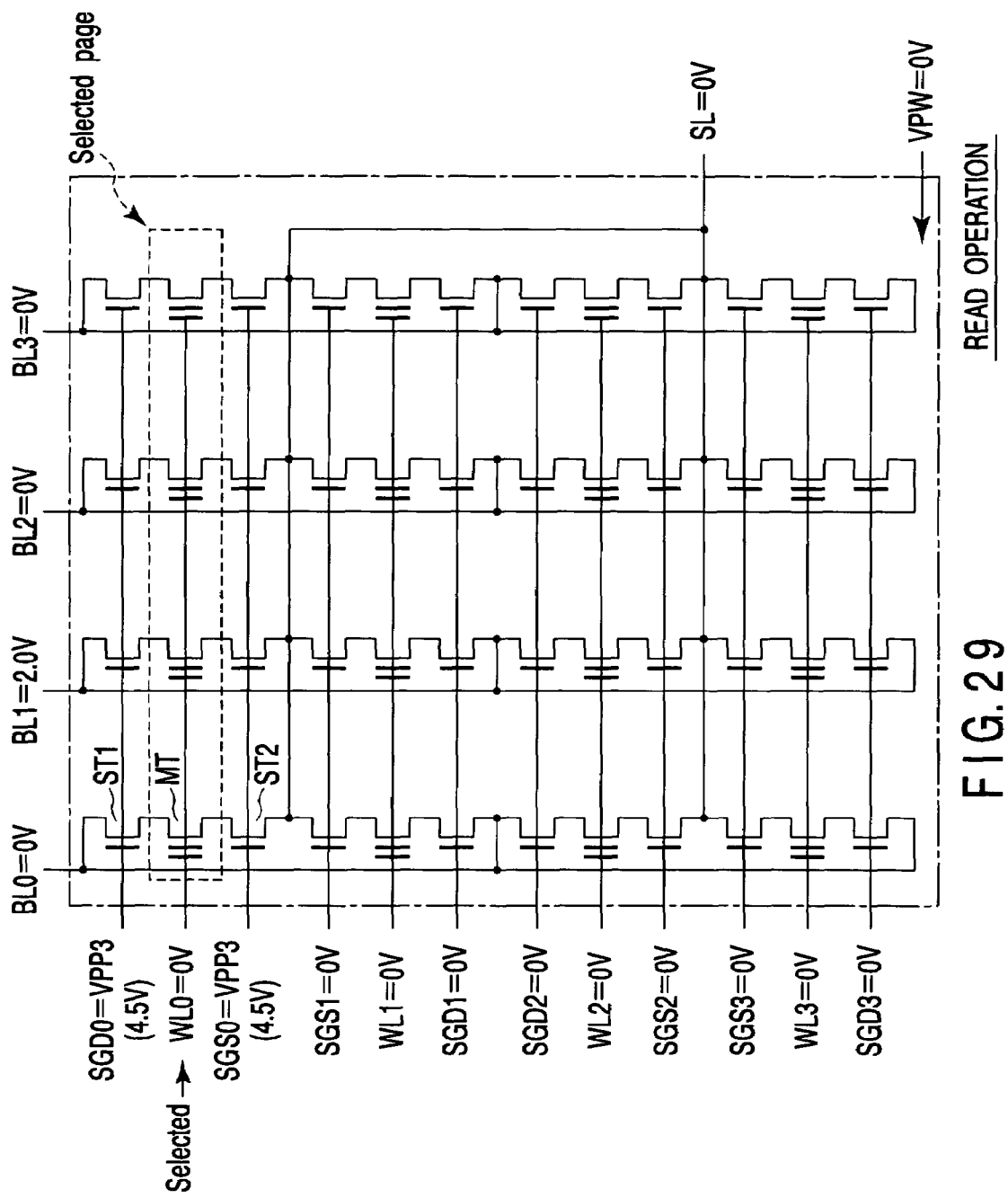
FIG. 29 is a circuit diagram of the memory cell array in a read operation of the 3Tr-NAND flash memory according to the second embodiment.

Using FIG. 29, a read operation will be explained. FIG. 29 is a circuit diagram of the memory cell array 10 of the 3Tr-NAND flash memory 3. For simplification, FIG. 29 shows a case where the number of memory cells is (4×4). FIG. 29 shows a case where the data is read from the memory cell transistor MT connected to bit line BL1 and word line WL0. The same holds true for a method of reading the data from the redundancy cells RC.

First, the row decoder 170 selects select gate lines SGD, SGS to which a memory cell to be read from is connected and applies VPP3 (e.g., 4.5V) to the selected select gate lines SGD, SGS. In addition, the row decoder 170 makes the other select gate lines SGD, SGS unselected and applies 0V to the unselected select gate lines SGD, SGS. As a result, the select transistors ST1, ST2 connected to the selected select gate lines SGD, SGS are turned on. Then, the row decoder 170 applies 0V to all of the word lines WL. That is, as shown in FIG. 29, VPP3 is applied to the selected select gate lines SGD0, SGS0 and 0V is applied to the unselected select gate lines SGD1 to SGD3, SGS1 to SGS3. As a result, the select transistors ST1, ST2 connected to the selected select gate lines SGD0, SGS0 are turned on. In addition, 0V is applied to all of the word lines WL0 to WL3.

Since the memory cell transistor MT has a negative threshold value if the data written in it is "1," the transistor MT is in the on state. Since the memory cell transistor MT has a positive threshold value if the data written in it is "0," the transistor MT is in the off state.

In addition, the precharge circuit 82 precharges the selected bit line BL to, for example, 2.0V. Then, if the data written in the memory cell transistor MT connected to the select transistors ST1, ST2 connected to the selected select gate lines SGD, SGS is "1," current flows from the bit line to the source line. On the other hand, if the data written in the memory cell transistor MT is "0," no current flows. In the example of FIG. 29, 2.0V is applied to the selected bit line BL1. Then, if the data written in the memory cell transistor MT connected to word line WL0 and the selected bit line BL1 is "1," current flows from bit line BL1 to the source line SL. On the other hand, if the data written in the memory cell transistor MT is "0," no current flows.

As described above, the bit line potential varying with the current flowing from the bit line to the source line is amplified by the sense amplifier, thereby reading the data. While the data has been read from one bit line in the example of FIG. 29, the potential may be applied to a plurality of bit lines, thereby reading the data from a plurality of memory cell transistors simultaneously.

A method of replacing a column in the prime cell array PCA with a column in the redundancy cell array RCA is the same as described in FIGS. 15 to 21 in the first embodiment. That is, only when the row address RA changes, the sense amplifier S/A_RD connected to the redundancy bit line BL_RD is activated and, in the other periods, is deactivated.

Even the above-described 3Tr-NAND flash memory can produce the effect in item (1) explained in the first embodiment.

Figure 30:
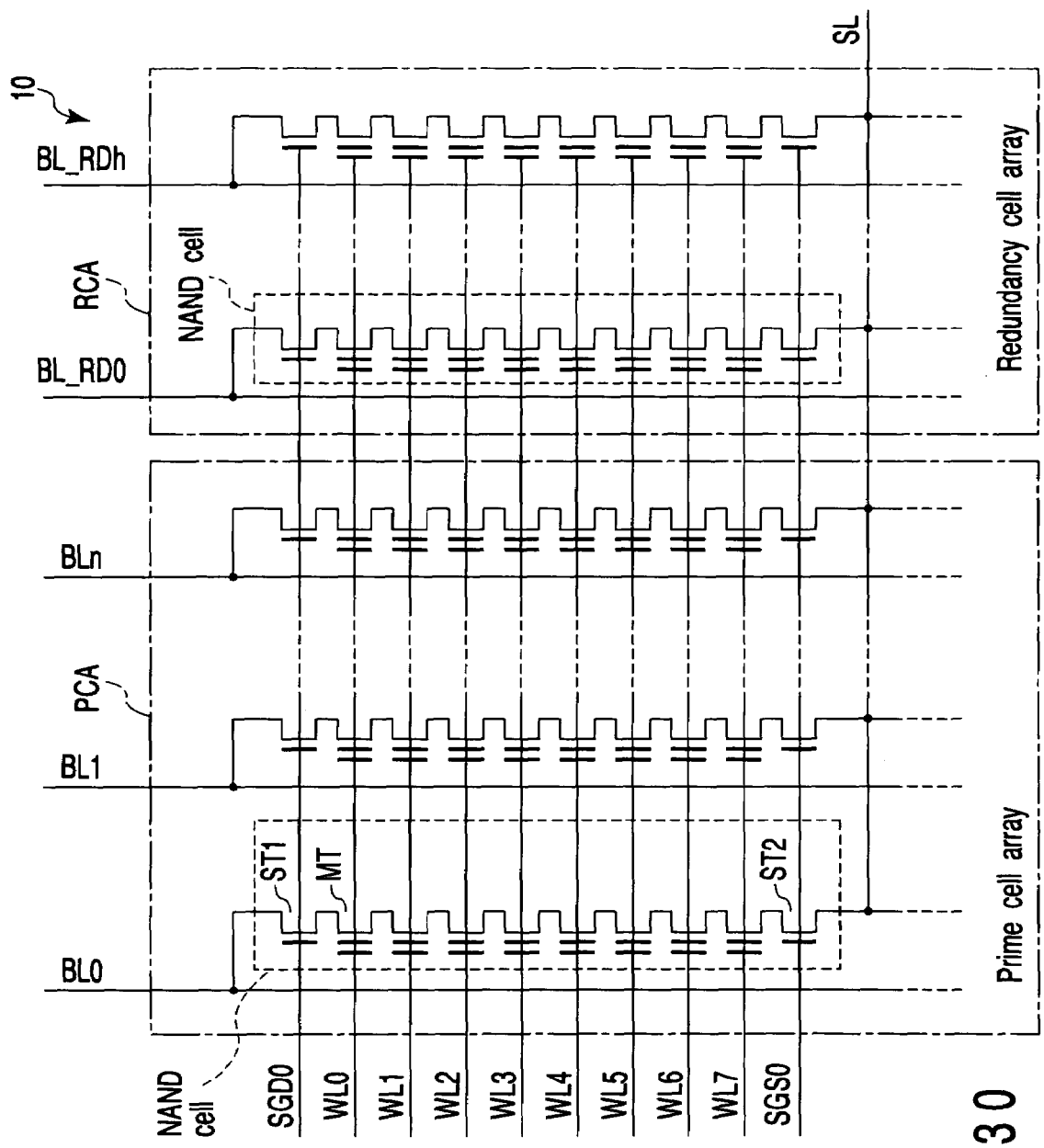
FIG. 30 is a circuit diagram of the memory cell array included in a NAND flash memory according to a third embodiment of the present invention.

Next, a semiconductor memory device according to a third embodiment of the present invention will be explained. The third embodiment is such that the first embodiment is applied to a NAND flash memory. Therefore, the configuration of the third embodiment is such that the memory cells in the first embodiment are replaced with NAND cells shown in FIG. 30. FIG. 30 is a circuit diagram of the memory cell array 10.

As shown in FIG. 30, each of the prime cell array PCA and the redundancy cell array RCA has a plurality of NAND cells arranged in a matrix. Each of the NAND cells includes eight memory cell transistors MT and select transistors ST1, ST2. A memory cell transistor MT has a stacked-gate structure that includes a floating gate formed on a semiconductor substrate with a gate insulating film interposed therebetween and a control gate formed on the floating gate with an inter-gate insulating film interposed therebetween. The number of memory cell transistors MT is not limited to 8 and may be 16 or 32. The number is illustrative and not restrictive. The adjoining ones of the memory cell transistors MT share their source and drain. They are arranged in such a manner that their current paths are connected in series between the select transistors ST1, ST2. The drain region at one end of the series connection of the memory cell transistors MT is connected to the source region of the select transistor ST1. The source region at the other end is connected to the drain region of the select transistor ST2. That is, a NAND cell is such that a plurality of memory cell transistors MT are used in a 3Tr-NAND flash memory.

The control gates of the memory cell transistors MT in a same row are connected commonly to any one of word lines WL0 to WLm. The gates of the select transistors ST1, ST2 in the same row are connected commonly to select gate lines SGD, SGS, respectively. Word lines WL0 to WLm and select gate lines SGS, SGD are connected to the row decoder 170. The drains of the select transistors ST1 in a same column in the prime cell array PCA are connected commonly to any one of bit lines BL0 to BLn. The drains of the select transistors ST1 in the same column in the redundancy cell array RCA are connected commonly to any one of redundancy bit lines BL_RD0 to BL_RDh. The bit lines and the redundancy bit lines are then connected to the write circuit 50 and column selector 70. The sources of the select transistors ST2 are connected equally to a source line SL and then connected to a source line driver 120. Both of the select transistors ST1, ST2 are not necessarily needed. Only one of them may be used, provided that it can select a NAND cell.

In the memory cell array 10 with the above configuration, a plurality of columns of NAND cells MC located at one end of the memory cell array 10 function as the redundancy cell array RCA. The redundancy cell array RCA share the word lines WL, select gate lines SGS, SGD with the prime cell array PCA, but have different bit lines from those of the prime cell array PCA.

Figure 31:
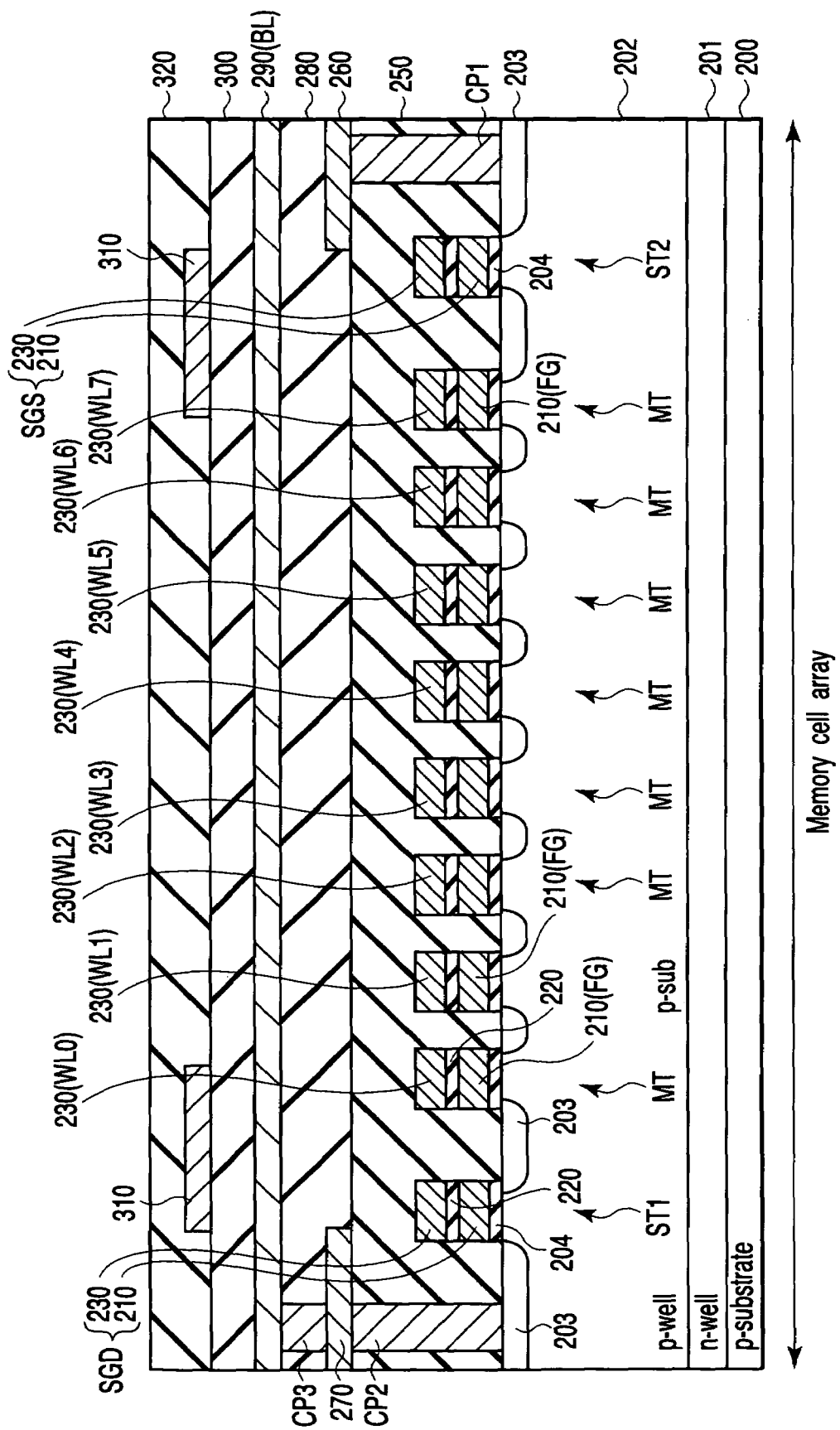
FIG. 31 is a sectional view, taken along a bit line, of the memory cell array included in the NAND flash memory according to the third embodiment.

FIG. 31 is a sectional view of a NAND cell taken along a bit line. As shown in FIG. 31, at the surface of the p-type semiconductor (silicon) substrate 200, an n-well region 201 is formed. At the surface of the n-well region 201, a p-well region 202 is formed. On the p-well region 202, a gate insulating film 204 is formed. On the gate insulating film 204, the gate electrodes of a memory cell transistor MT and select transistors ST1, ST2 are formed. Each of the gate electrodes of the memory cell transistor MT and select transistors ST1, ST2 includes a polysilicon layer 210 formed on the gate insulating film 204, an inter-gate insulating film 220 formed on the polysilicon layer 210, and a polysilicon layer 230 formed on the inter-gate insulating film 220. The inter-gate insulating film 220 is made of, for example, a silicon oxide film, or an ON film, NO film, or ONO film having a stacked structure of a silicon oxide film and a silicon nitride film. In a memory cell transistor MT, the polysilicon layers 210, which are separated from each other between adjacent element regions AA, function as floating gates (FG). The polysilicon layers 230 function as control gates (or word lines WL). The polysilicon layers 230 are connected to one another between element regions AA adjoining in the word line direction. In the select transistors ST1, ST2, a part of the inter-gate insulating film 220 is removed in a shunt region (not shown), which connects the polysilicon layers 210, 230 electrically. The polysilicon layers 210, 230 function as select gate lines SGD, SGS. In the select transistors ST1, ST2, the polysilicon layers 210 and polysilicon layers 230 are not separated from one another between element regions AA adjoining in the word line direction and are connected to one another.

At the surface of the p-well region 202 located between adjacent gate electrodes, impurity diffused layers 203 functioning as source-drain regions are formed. An impurity diffused layer 203 is shared by adjacent transistors. Specifically, an impurity diffused layer 203 between two adjacent select transistors ST1 functions as the drain region of the two select transistors ST1. An impurity diffused layer 203 between two adjacent select transistors ST2 functions as the source region of the two select transistors ST2. An impurity diffused layer 203 between two adjacent memory cell transistors MT functions as the source-drain region of the two memory cell transistors MT. Moreover, an impurity diffused layer 203 between a memory cell transistor MT and a select transistor ST1 adjoining each other functions as the drain region of the memory cell transistor MT and the source region of the select transistor ST1. An impurity diffused layer 203 between a memory cell transistor MT and a select transistor ST2 adjoining each other functions as the source region of the memory cell transistor MT and the drain region of the select transistor ST2.

Then, on the semiconductor substrate 200, an interlayer insulating film 250 is formed so as to cover the memory cell transistor MT and select transistors ST1, ST2. In the interlayer insulating film 250, a contact plug CP1 reaching the source region 203 of the select transistor ST2 is formed. On the interlayer insulating film 250, a metal wiring layer 260 connected to the contact plug CP1 is formed. The metal wiring layer 260 functions as a source line SL. Further in the interlayer insulating film 250, a contact plug CP2 reaching the drain region 203 of the select transistor ST1 is formed. On the interlayer insulating film 250, a metal wiring layer 270 connected to the contact plug CP2 is formed.

On the interlayer insulating film 250, an interlayer insulating film 280 is formed so as to cover the metal wiring layers 260, 270. In the interlayer insulating film 280, a contact plug CP3 reaching the metal wiring layer 270 is formed. On the interlayer insulating film 280, a metal wiring layer 290 connected equally to a plurality of contact plugs CP3 are formed. The metal wiring layer 290 functions as a bit line BL or a redundancy bit line BL_RD.

On the interlayer insulating film 280, an interlayer insulating film 300 is formed so as to cover the metal wiring layer 290. On the interlayer insulating film 300, metal wiring layers 310 are formed. The metal wiring layers 310, which are connected to the polysilicon layers 210 of the select transistors ST2, ST1 in a region (not shown), function as shunt wires for the select gate lines SGS, SGD. Then, on the interlayer insulating film 300, an interlayer insulating film 320 is formed so as to cover the metal wiring layers 310.

Even to the NAND flash memory configured as described above, the first embodiment can be applied. Therefore, the third embodiment produces the same effects as those of the second embodiment.

Next, a semiconductor memory device according to a fourth embodiment of the present invention will be explained. The fourth embodiment is such that a row in which there is a fault is replaced with a redundancy bit line in the first embodiment. Hereinafter, what differs from the first embodiment will be explained, particularly centering on a read operation.

Figure 32:
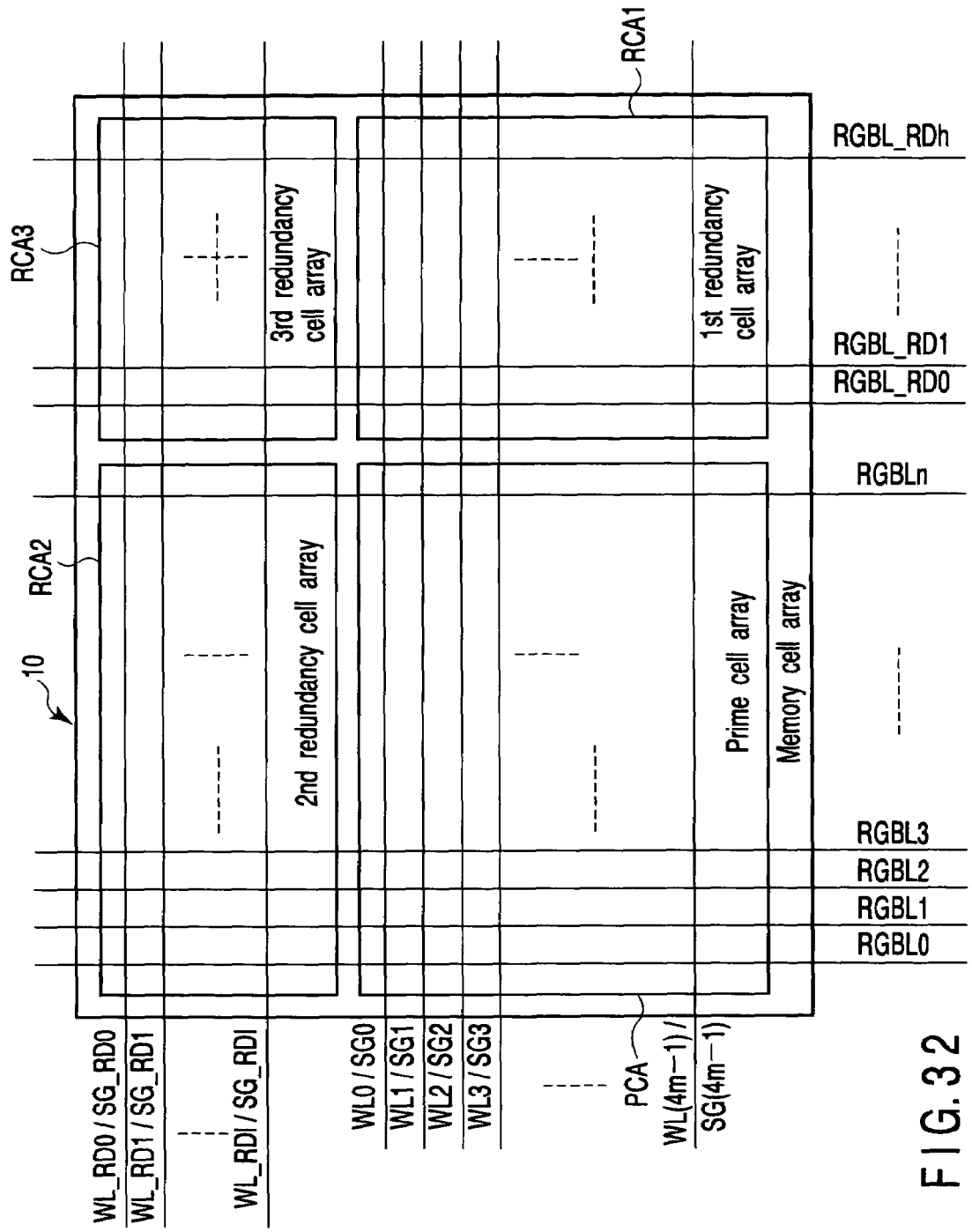
FIG. 32 is a block diagram of the memory cell array of a 2Tr flash memory according to a fourth embodiment of the present invention.

FIG. 32 is a circuit diagram of the memory cell array 10 of a 2Tr flash memory 3 according to the fourth embodiment. As shown in FIG. 32, the memory cell array 10 has the prime cell array PCA and a first to a third redundancy cell array RCA1 to RCA3. The configuration of the prime cell array PCA is the same as in the first embodiment. The prime cells PC are provided at the intersections of read global bit lines RGBL0 to RGBLn and word lines/select gate lines WL0/SG0 to WL(4m+3)/SG(4m+3).

The first redundancy cell array RCA1 replaces a column including a fault in the prime cell array PCA with a redundancy bit line. The first redundancy cell array RCA1, which is provided along a word line at one end of the memory cell array 10, includes a plurality of redundancy cells RC arranged in a matrix. The redundancy cells RC in the first redundancy cell array RCA1 are provided at the intersections of the word lines WL0 to WL(4m+3) and select gate lines SG0 to SG(4m+3) shared with the prime cell array PCA and the redundancy read global bit lines RGBL_RD0 to RGBL_RDh.

The second redundancy cell array RCA2 replaces a row including a fault in the prime cell array PCA with a redundancy word line/select gate line. The second redundancy cell array RCA2, which is provided along a bit line at one end of the memory cell array 10, includes a plurality of redundancy cells RC arranged in a matrix. The redundancy cells RC in the second redundancy cell array RCA2 are provided at the intersections of the read global bit lines RGBL0 to RGBLn shared with the prime cell array PCA and the redundancy word lines WL_RD0 to WL_RD1 and redundancy select gate lines SG_RD0 to SG_RD1 (l is a natural number).

The third redundancy cell array RCA3 replaces a row including a fault in the prime cell array PCA with a redundancy bit line. The third redundancy cell array RCA3 includes a plurality of redundancy cells RC arranged in a matrix. The redundancy cells RC in the third redundancy cell array RCA3 are provided at the intersections of the redundancy read global bit lines RGBL_RD0 to RGBL_RDh shared with the first redundancy cell array RCA1 and the redundancy word lines WL_RD0 to WL_RD1 and redundancy select gate lines SG_RD0 to SG_RD1 shared with the second redundancy cell array RCA2.

The prime cell array PCA and the first redundancy cell array RCA1 adjoining in the word line direction share the write column select lines WCSL and the read column select lines RCSL. Similarly, the second and third redundancy cell arrays RCA2, RCA3 adjoining in the word line direction share the write column select lines WCSL and the read column select lines RCSL. Moreover, the prime cell array PCA and the second redundancy cell array RCA2 adjoining in the bit line direction share the write global bit lines WGBL. The first redundancy cell array RCA1 and the third redundancy cell array RCA3 share the redundancy write global bit lines WGBL_RD (not shown). The write global bit lines WGBL and redundancy write global bit lines WGBL_RD are connected to the write circuit 50 as in the first embodiment. The configuration of the write circuit 50, switch group 60, and input buffer is as explained in FIG. 3 in the first embodiment.

Figure 33:
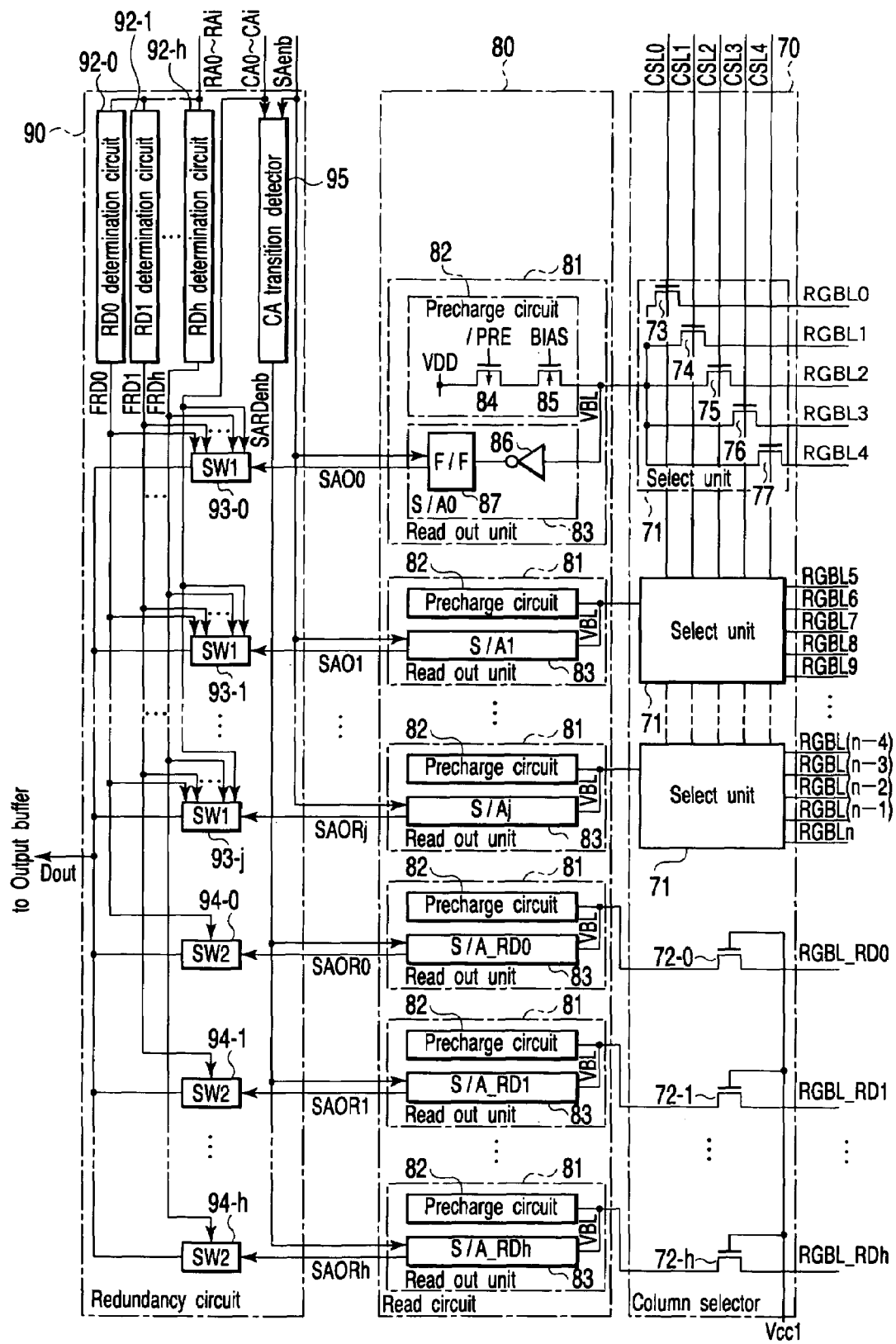
FIG. 33 is a circuit diagram of the column selector, read circuit, and redundancy circuit included in the 2Tr flash memory according to the fourth embodiment.

Read global bit lines RGBL0 to RGBLn and redundancy read global bit lines RGBL_RD0 to RGBL_RDh are connected via the column selector 70 to the read circuit 80 and are further connected to the redundancy circuit 90 as in the first embodiment. FIG. 33 is a circuit diagram of the column selector 70, read circuit 80, and redundancy circuit 90. Since the configuration of the column selector 70 and read circuit 80 is as explained in FIG. 4 in the first embodiment, explanation of them will be omitted.

The redundancy circuit 90 replaces a faulty cell in the prime cell array PCA with a redundancy cell RC in the third redundancy cell array RCA3. The redundancy circuit 90 includes a column address transition detector 95, redundancy determination circuits 92-0 to 92-h, and switch circuits 93-0 to 93-j, 94-0 to 94-h.

The column address transition detector 95 monitors the column address signal CA. When the column address signal CA changes, the column address transition detector 95 generates a sense amp enable signal SARDenb (makes the sense amp enable signal SARDenb high). The sense amp enable signal SARDenb is output in synchronization with the sense amp enable signal SAenb.

The redundancy determination circuits 92-0 to 92-h monitor the row address signal RA. In a read operation, when the row address RA indicates a word line/select gate line in which there is a fault, the redundancy determination circuit replaces the word line/select gate line with a redundancy read global bit line. Each of the read global bit lines RGBL_RD0 to RGBL_RDh in the third redundancy cell array RCA is allocated, in advance, a row to be replaced with. The redundancy determination circuits 92-0 to 92-i correspond to the redundancy word lines/select gate lines in a one-to-one correspondence. Each of the redundancy word lines/select gate lines holds a row address to be replaced with. When the row address signal RA input coincides with the row address held in one of the redundancy determination circuits 92-0 to 92-h, the redundancy determination circuit asserts (or makes high) the corresponding one of the control signals FRD0 to FRDh.

The switch circuits 93-0 to 93-j are provided for sense amplifiers S/A0 to S/Aj in a one-to-one correspondence. The column address signal CA and control signals FRD0 to FRDh are input to the switch circuits 93-0 to 93-j, respectively. If any one of the control signals FRD0 to FRDh is made high, all of the switch circuits 93-0 to 93-j are turned off. On the other hand, if all of the control signals FRD0 to FRDh are low and the column address signal CA coincides with a column (read global bit lines RGBL_RD0 to RGBL_RDn) connected to the corresponding one of the sense amplifiers S/A0 to S/Aj, the switch circuits 93-0 to 93-j are turned on. Any one of the switch circuits 93-0 to 93-j turned on transmits the output (SAO0 to SAOj) of the corresponding one of the sense amplifiers S/A0 to S/Aj to the output buffer 110.

The switch circuits 94-0 to 94-h are provided for sense amplifiers S/A_RD0 to S/A_RDh in a one-to-one correspondence. The control signals FRD0 to FRDh are input to the switch circuits 94-0 to 94-h, respectively. Then, if any one of the control signals FRD0 to FRDh is made high, the corresponding one of the switch circuits 94-0 to 94-h is turned on. Then, the switch circuit transmits the output (SAOR0 to SAORh) of the corresponding one of the sense amplifiers S/A_RD0 to S/A_RDh to the output buffer 110.

FIG. 34 is a circuit diagram of the column address transition detector 95 included in the redundancy circuit 90. As shown in FIG. 34, the column address transition detector 95 has the same configuration as that of the row address transition detector 91 explained in the first embodiment, except that bits CA0 to CAi in the column address signal CA are input to the detection units 160-0 to 160-i respectively in place of bits RA0 to RAi in the row address signal.

In the redundancy circuit 90 of FIG. 33, only the configuration to remedy a faulty cell in the prime cell array PCA with a redundancy cell RC in the third redundancy cell array RCA3 is shown. Therefore, to remedy a faulty cell with the first redundancy cell array RCA1, a redundancy circuit explained in the first embodiment is further provided.

The remaining configuration is the same as in the first embodiment, except that, when receiving a column address, the select gate decoder 30 selects a redundancy select gate line to be replaced with the column in the first clock cycle. The details will be described later.

Figure 35:
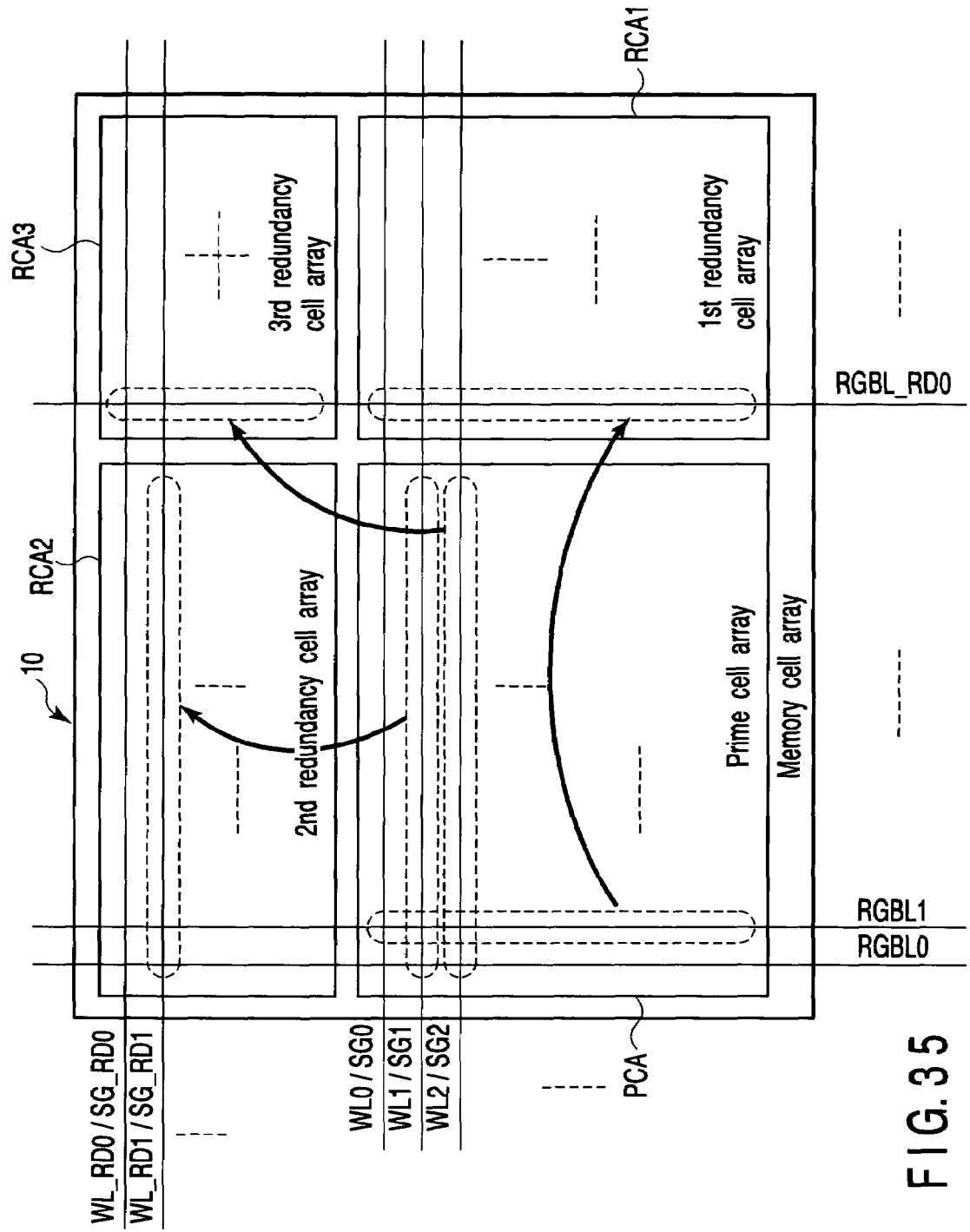
FIG. 35 is a block diagram of the memory cell array included in the 2Tr flash memory according to the fourth embodiment.

FIG. 35 is a block diagram of the memory cell array 10 to help explain the functions of the redundancy cell arrays RCA1 to RCA3. As shown in FIG. 35, the first redundancy cell array RCA1 remedies a faulty column in the prime cell array PCA. The second redundancy cell array RCA2 remedies a faulty row in the prime cell array PCA. Furthermore, the third redundancy cell array RCA3 remedies a faulty row in the prime cell array PCA with a redundancy column.

Hereinafter, a method of remedying a fault in the prime cell array PCA with the redundancy cell arrays RCA1 to RCA3 will be explained briefly.

First, a method of remedying a fault with the first redundancy cell array RCA1 will be explained. The remedying of a fault by the first redundancy cell array RCA1 is the same as in the first embodiment. Specifically, if a read global bit line RGBL including a fault has been selected in a read operation, the redundancy circuit 90 selects a redundancy read global bit line RGBL_RD in place of the read global bit line RCBL. In addition, if a write global bit line WGBL including a fault has been selected in a write operation, the redundancy circuit 90 selects a redundancy write global bit line WGBL_RD. In this case, no word line/select gate line is replaced with another line.

Next, a method of remedying a fault with the second redundancy cell array RCA2 will be explained. If a word line/select gate line including a fault has been selected in a read operation, the select gate decoder 30 selects a redundancy select gate line SG_RD in place of the select gate line SG. In this case, the selected read global bit line RGBL is not replaced with another line. On the other hand, in a write operation, the write decoder 20 selects a redundancy word line WL_RD in place of the word line WL. In this case, no word global bit line WGBL is replaced with another line.

Next, a method of remedying a fault with the third redundancy cell array RCA3 will be explained. If a read global bit line including a fault has been selected in a read operation, the select gate decoder 30 selects a redundancy select gate line SG_RD in place of the select gate line SG. Thereafter, when the word line/select gate line including a fault is selected, the redundancy circuit 90 selects a redundancy read global bit line RGBL_RD in place of the read global bit line RGBL. In a write operation, the write decoder 20 selects a redundancy word line WL_RD in place of the word line WL and further selects a redundancy write global bit line WGBL_RD in place of the write global bit line WGBL.

Figure 36:
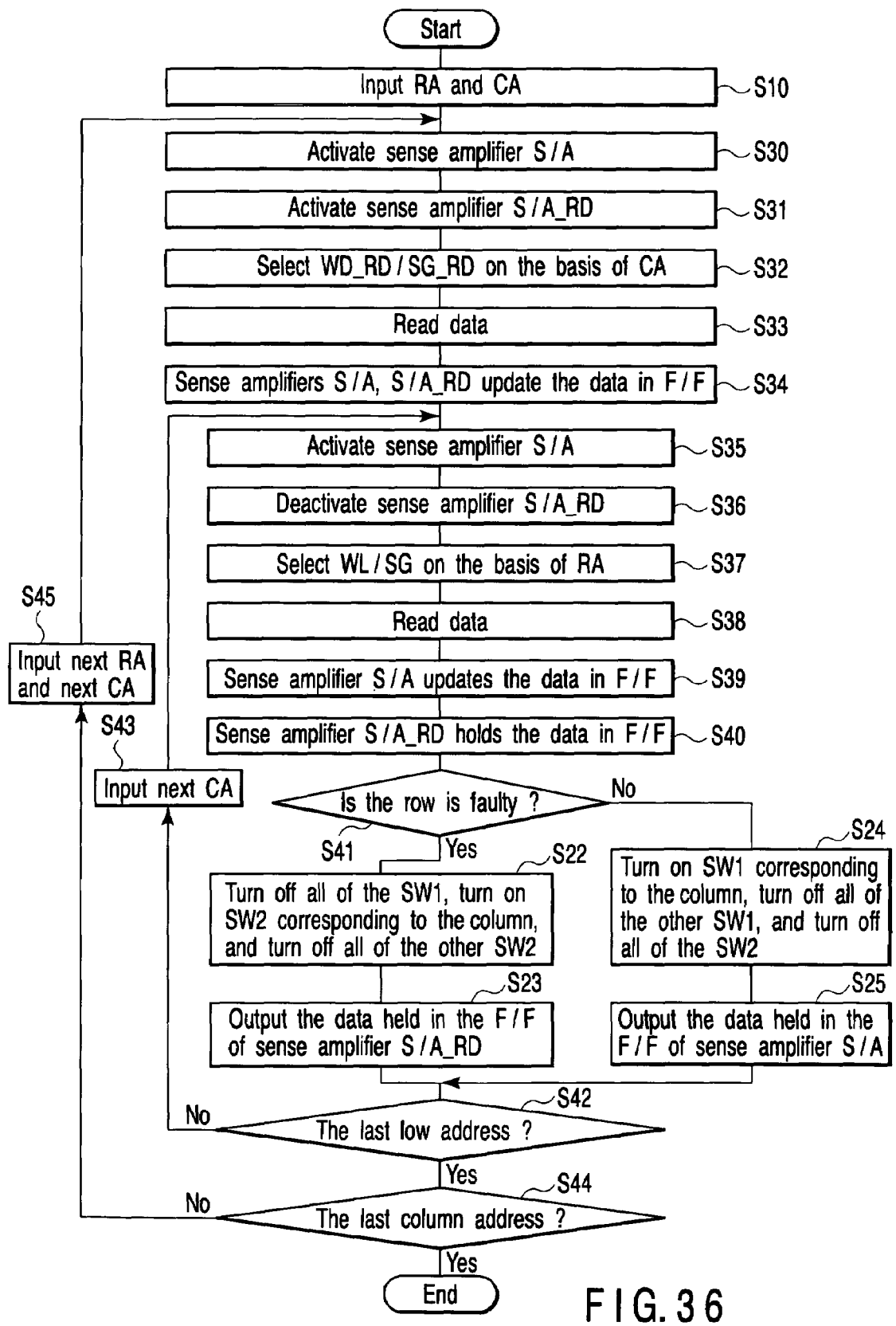
FIG. 36 is a flowchart for a read operation of the 2Tr flash memory according to the fourth embodiment.

Next, in the flash memory 3 with the above configuration, the operation from when the data is read out until the read-out data is output to the output buffer 110 will be explained. Explanation will be given, particularly centering on a case where, when a fault has occurred in a row in the prime cell array PCA, the faulty row is replaced with a column in the third redundancy cell array PCA3. FIG. 36 is a flowchart to help explain a read operation to a faulty column replacing operation. In this embodiment, explanation will be given about a case where the data is read consecutively by changing the row address, while leaving the column address unchanged.

As shown in FIG. 36, the CPU 2 supplies a row address signal RA and a column address signal CA to the flash memory 3 (step S10). The row address signal RA and column address signal CA are supplied to the address buffer 130, which then supplies the address signals RA, CA to the select gate decoder 30, column decoder 40, and redundancy circuit 90. The precharge circuit 82 of the read circuit 80 precharges the read global bit line selected by the column selector 70 and all of the redundancy read global bit lines.

When the potentials on the read global bit line and the redundancy read global bit lines have reached a precharge potential, the precharge circuit 82 is turned off. Instead, the sense amp enable signal SAenb goes high, which activates sense amplifiers S/A0 to S/Aj (step S30).

The column address transition detector 95 detects the presence or absence of a change in the column address signal CA and makes the sense amp enable signal SARDenb high, which activates sense amplifiers S/A_RD0 to S/A_RDh (step S31).

Then, on the basis of the column address signal CA, the select gate decoder 30 selects a redundancy select gate line SG_RD to be replaced with the read global bit line corresponding to the column address signal CA (step S32). For example, in FIG. 35, suppose read global bit line RGBL0 corresponds to the column address signal CA and a faulty cell connected to the bit line RGBL0 is to be replaced with redundancy word line WL_RD0 and redundancy select gate line SG_RD0 in the third redundancy cell array RCA3. Then, responding to the input of the column address signal CA, the select gate decoder 30 selects redundancy select gate line SG_RD0 first, not a select gate line SG in the prime cell array PCA.

Then, the data is read from the redundancy cell RC (step S33). A method of reading the data is the same as described above. In this step, the data is read from the redundancy cell RC in the second redundancy cell array RCA2 and the redundancy cell RC in the third redundancy cell array RCA. Sense amplifiers S/A0 to S/Aj, S/A_RD0 to S/A_RDh have been activated. Therefore, the data read from the second redundancy cell array RCA2 is amplified at sense amplifiers S/A0 to S/Aj. The amplified data is stored in the flip-flop 87. In addition, the data read from the third redundancy cell array RCA3 is amplified at sense amplifiers S/A_RD0 to S/A_RDh. The amplified data is stored in the flip-flop 87 (step S34).

The data read out in step S33 is not output to the output buffer 110 as a result of all of the switch circuits 93-0 to 93-j, 94-0 to 94-h being turned off.

In the next clock cycle after step S30 to step S34, the sense amp enable signal SAenb is made high again, which activates sense amplifiers S/A0 to S/Aj (step S35). However, since the column address signal CA remains unchanged, the column address transition detector 95 makes the sense amp enable signal SARDenb low, which deactivates sense amplifiers S/A_RD0 to S/A_RDh (step S36).

Then, on the row address RA, the select gate decoder 30 selects a select gate line SG in the prime cell array PCA (step S37) and reads the data from the prime cell array PCA (step S38). The data read from the prime cell array PCA onto the read global bit line RGBL is amplified at sense amplifiers S/A0 to S/Aj. The amplified data is newly stored in the flip-flop 87 (step S39). On the other hand, sense amplifies S/A_RD0 to S/A_RDh are in the deactivated state. Thus, the data in the flip-flops 87 of the sense amplifiers S/A_RD0 to S/A_RDh is not updated. That is, the flip-flops 87 in the sense amplifiers S/A_RD0 to S/A_RDh keep holding the data read in step S33 (step S40).

After step 840, the redundancy determination circuits 92-0 to 92-i determine whether the word line/select gate line selected in step S37 is a row including a fault (step S41).

If in step 841, it has been determined that the row has a fault and has to be replaced with a redundancy read global bit line, any one of the switch circuits 94-0 to 94-h connects the redundancy read global bit line to be replaced with the row to the output buffer 110. In addition, all of the switch circuits 93-0 to 93-j are turned off (step S22). As a result, the data held in any one of the sense amplifiers S/A_RD0 to S/A_RDh is output to the output buffer 110 (step S23).

On the other hand, if in step S41, it has been determined that the row is normal and need not be replaced with a redundancy read global bit line, all of the switch circuits 94-0 to 94-h are turned off. The switch circuits 93-0 to 93-j connect any one of the sense amplifiers S/A0 to S/Aj which holds the data read onto the corresponding read global bit line to the output buffer (step S24). As a result, the data held in any one of the sense amplifiers S/A0 to S/Aj is output to the output buffer 110 (step S25).

Then, it is determined whether the present row address is the last address at which reading is to be done for the column (step S42). If it is not the last column, the next row address is input, with the column address kept unchanged (step S43). Then, the processes from step S35 to step S25 are repeated. If it is the last row address, it is determined whether the present column address is the last column address at which reading is to be done (step S44). If it is the last column address, the read operation is completed. If it is not the last column address, the next column address at which reading is to be done is input and further the row address at which the data is to be read first at the column address is input (step S45). Then, the processes from step S10 to step S44 are repeated again.

Figure 37:
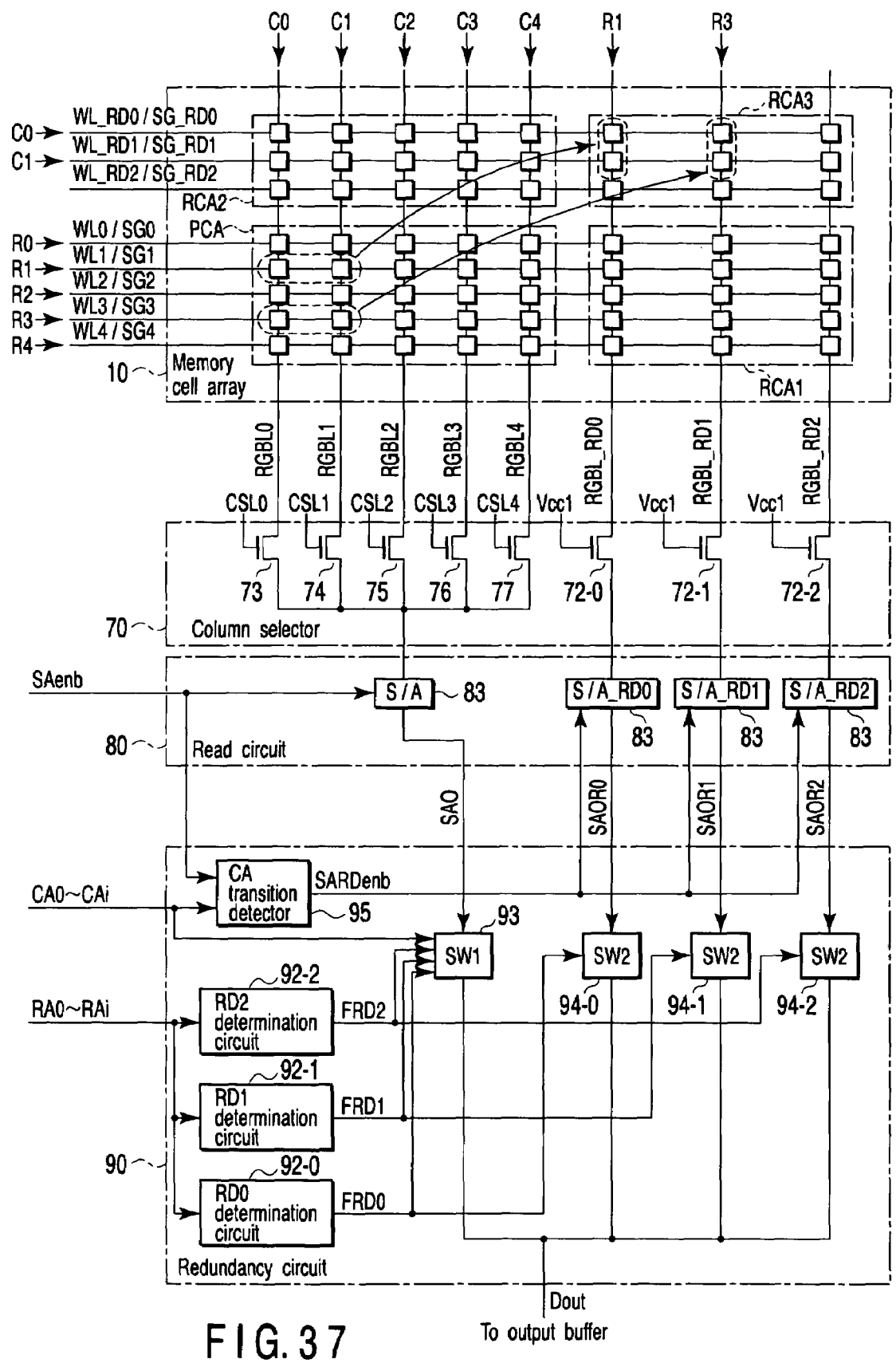
FIG. 37 is a circuit diagram of the memory cell array, column selector, read circuit, and redundancy circuit included in the 2Tr flash memory according to the fourth embodiment.

Referring to FIG. 37, the above operations will be explained in further detail, using concrete examples. FIG. 37 is a circuit diagram of a 2Tr flash memory according to the fourth embodiment. For the sake of simplicity, explanation will be given about a case where the number of word lines, the number of select gate lines, and the number of read global bit lines are each five and the number of redundancy global bit lines, the number of redundancy word lines, and the number of redundancy select gate lines are each three.

In the prime cell array PCA, suppose the column address signals CA=C0 to C4 correspond to read global bit lines RGBL0 to RGBL4 respectively, and the row address signals RA=R0 to R4 correspond to word lines/select gate lines WL0/SG0 to WL4/SG4 respectively. In the third redundancy cell array RCA3, suppose the row address signals RA=R1, R3 correspond to redundancy read global bit lines RGBL_RD0 to RGBL_RD1 respectively, and the column address signals CA=C0, C1 correspond to redundancy word lines/select gate lines WL_RD0/SG_RD0, WL_RD1/SG_RD1 respectively.

Specifically, the prime cell PC at the intersection of read global bit line RGBL0 and word line/select gate line WL1/SG1 is replaced with the redundancy cell RC at the intersection of redundancy read global bit line RGBL_RD0 and redundancy word line/select gate line WL_RD0/SG_RD0. In addition, the prime cell PC at the intersection of read global bit line RGBL0 and word line/select gate line WL3/SG3 is replaced with the redundancy cell RC at the intersection of redundancy read global bit line RGBL_RD1 and redundancy word line/select gate line WL_RD0/SG_RD0. Moreover, the prime cell PC at the intersection of read global bit line RGBL1 and word line/select gate line WL0/SG0 is replaced with the redundancy cell RC at the intersection of redundancy read global bit line RGBL_RD0 and redundancy word line/select gate line WL_RD1/SG_RD1. Furthermore, the prime cell PC at the intersection of read global bit line RGBL1 and word line/select gate line WL3/SG3 is replaced with the redundancy cell RC at the intersection of redundancy read global bit line RGBL_RD1 and redundancy word line/select gate line WL_RD1/SG_RD1. That is, word lines/select gate lines WL1/SG1, WL3/SG3 in the prime cell array PCA are replaced with redundancy read global bit lines RGBL_RD0, RGBL_RD1 in the third redundancy cell array RCA.

Figure 38:
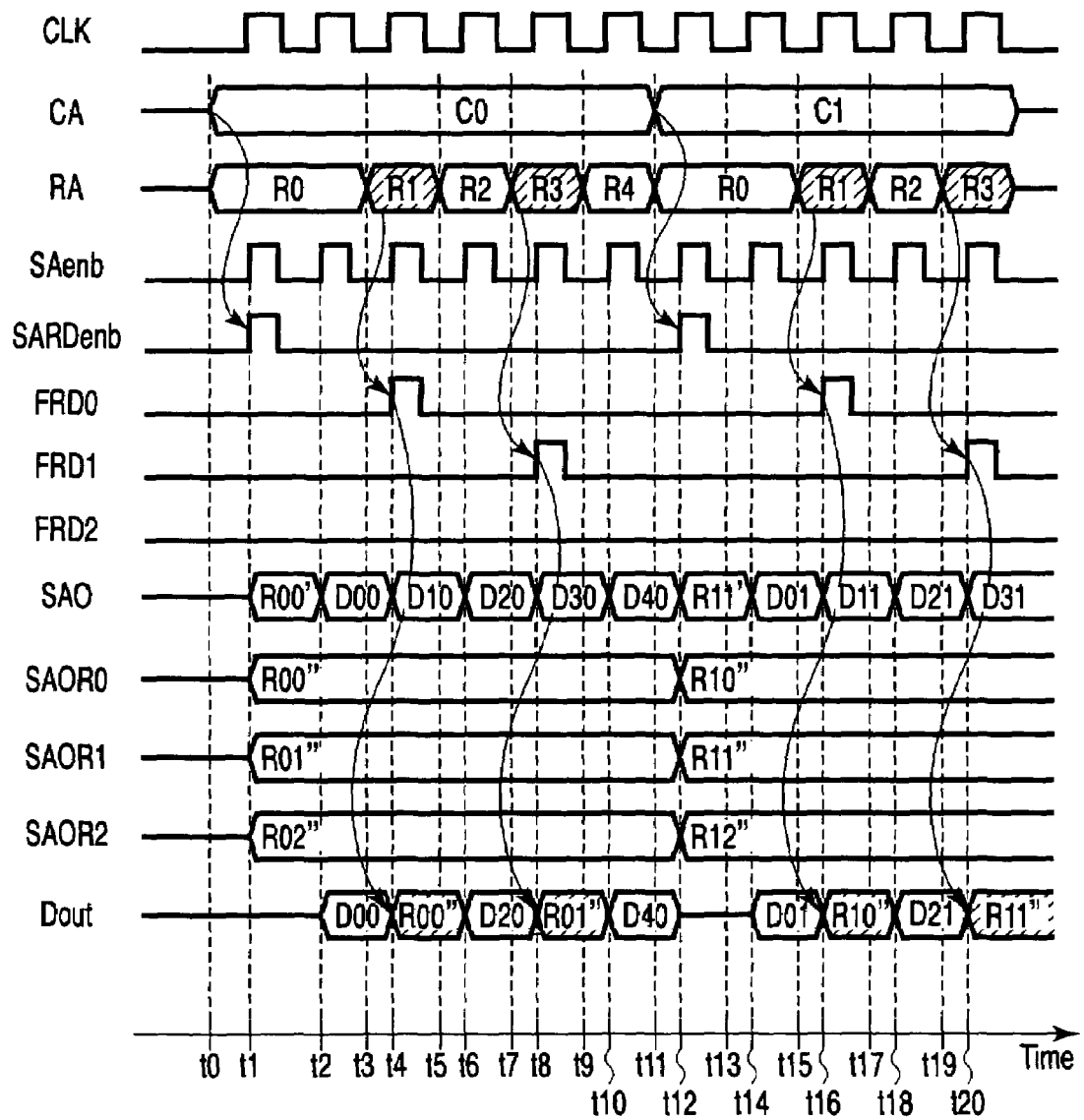
FIG. 38 is a timing chart for various signal in a read operation of the 2Tr flash memory according to the fourth embodiment.

Using FIG. 38, the operation of the flash memory with the above configuration will be explained. FIG. 38 is a timing chart for various signals.

Figure 39:
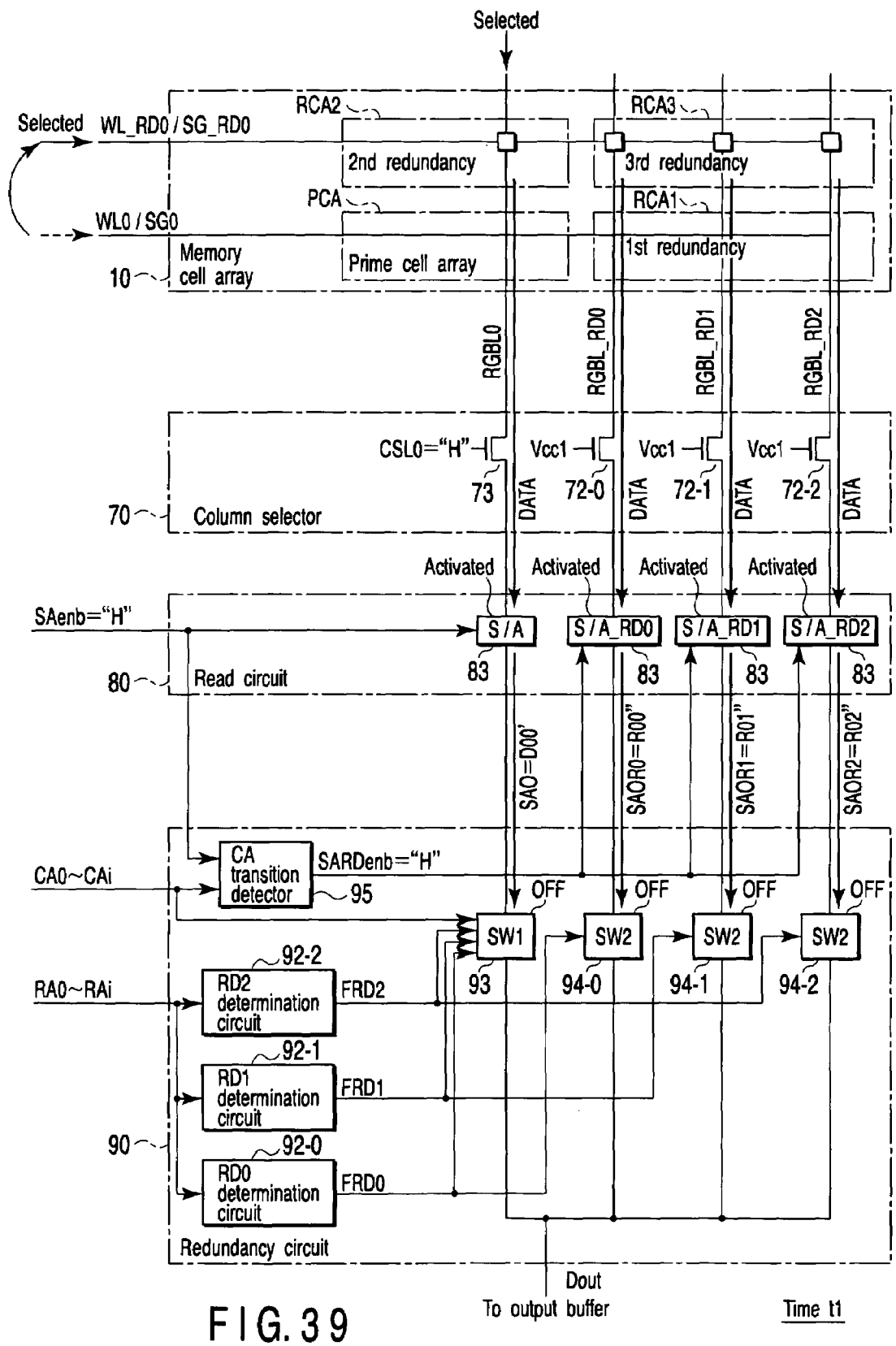
FIGS. 39 to 45 are circuit diagrams of the memory cell array, column selector, read circuit, and redundancy circuit in a read operation of the 2Tr flash memory according to the fourth embodiment.

As shown in FIG. 38, a row address signal RA, a column address signal CA, and a sense amp enable signal SAenb are input in synchronization with a clock signal CLK. First, at time t0, row address signal RA=R0 and column address signal CA=C0 are input (step S10). Then, at time t1, to start to read the data, the sense amp enable signal SAenb is made high, which activates the sense amplifier S/A (step S30). FIG. 39 shows the state of the flash memory at time t1. As shown in FIG. 39, the sense amp enable signal SAenb is made high and the column address signal CA is input at time t0, with the result that the column address transition detector 95 makes the sense amp enable signal SARDenb high. Accordingly, not only the sense amplifier S/A but also sense amplifiers S/A_RD0 to S/A/RD2 are activated (step S31). Then, the select decoder 30 selects select gate line SG0 to be replaced with the column corresponding to column address CA=C0 (step S32). Thus, the data is read from the prime cells PC and redundancy cells RC at the intersections of the redundancy word lines/select gate line WL_RD0/SG_RD0 and the read global bit lines RGBL0, redundancy read global bit lines RGBL_RD0 to RGBL_PD2 (step S33).

Then, the sense amplifier S/A not only amplifies data R00' read onto read global bit line RGBL0 and holds the amplified data in the flip-flop 87 but also outputs the amplified data as an output signal SA0. Similarly, the sense amplifiers S/A_RD0 to S/A_RD2 not only amplify data P00", R01", R02" read onto read global bit lines RGBL_RD0 to RGBL_RD2 respectively and hold the amplified data in the flip-flop 87 but also output the amplified data as output signals SAOR0 to SAOR2 (step S34).

However, at this time, the switch circuits 93, 94-0 to 94-2 are turned off, which prevents the signals SA0, SAOR0 to SAOR2 from being output to the output buffer 110.

Figure 40:
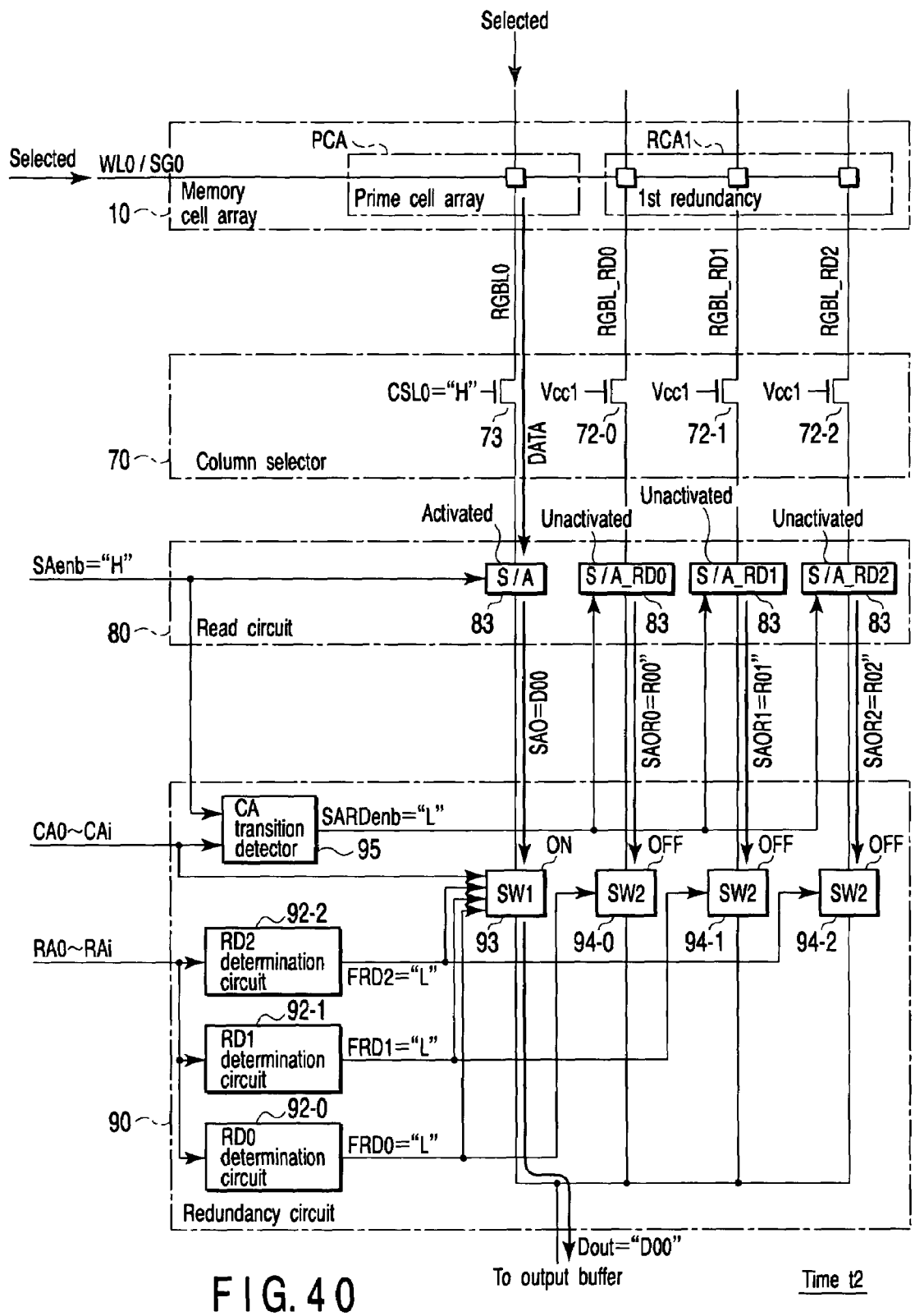

Next, at time t2, the sense amp enable signal SAenb is made high again, thereby activating the sense amplifier S/A (step S35). FIG. 40 shows the state of the flash memory at time t2. The column address signal CA and row address signal RA remain unchanged. Thus, the sense amp enable signal SAenb is made low, which deactivates sense amplifiers S/A_RD0 to S/A_RDh (step S36). Then, the select gate decoder 30 selects select gate line SG0 corresponding to row address RA=R0 (step S37). As a result, the data is read from the prime cell PC at the intersection of word line/select gate line WL0/SG0 and read global bit line RGBL0 (step S38).

Then, the sense amplifier S/A not only amplifies data D00 read onto read global bit line RGBL0 and holds the amplified data in the flip-flop 87 but also outputs the amplified data as an output signal SA0 (step S39). Since sense amplifiers S/A_RD0 to S/A_RD2 have been deactivated, the flip-flops 87 keep holding data R00", R01", R02" read at time t1 (step S40).

Since there is no fault in word line/select gate line WL0/SG0 corresponding to row address signal RA=R0 input at time t0 (step S41), all of the redundancy determination circuits 92-0 to 92-2 make control signals FRD0 to FRD2 low, respectively. Accordingly, the switch circuits 94-0 to 94-2 are turned off and switch circuit 93 is turned on (step S22). As a result, output signal SA0=D00 of the sense amplifier S/A is sent via the switch circuit 93 to the output buffer 110 (step S23).

Figure 41:
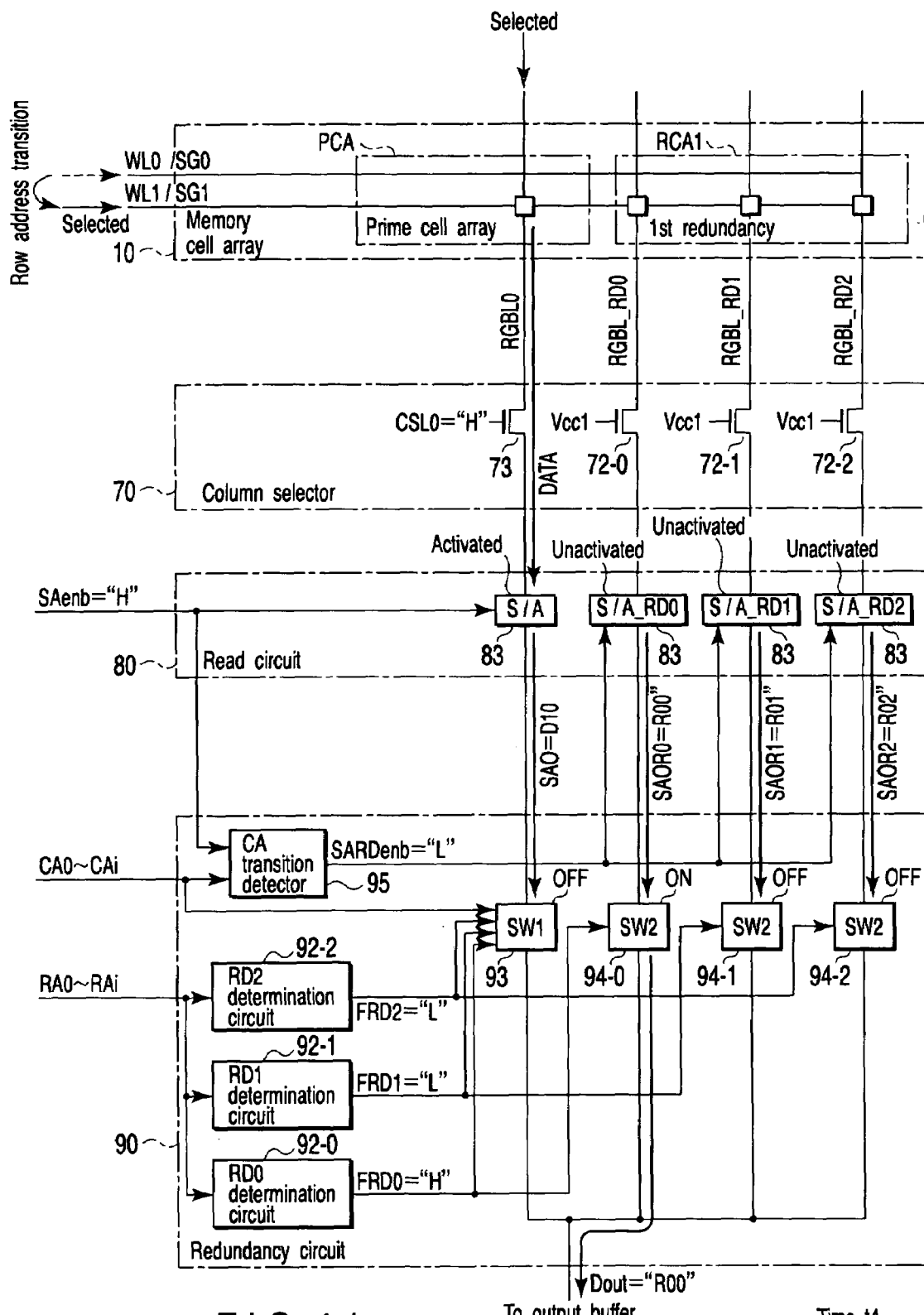

Next, at time t3, the row address signal RA changes from R0 to R1 (step S43). The column address signal CA remains at C0. Then, at time t4, the sense amp enable signal SAenb goes high, which activates the sense amplifier S/A (step S35). FIG. 41 shows the state of the flash memory at time t4. However, since the column address signal CA have made no change, the column address transition detector 95 makes the sense amp enable signal SARDenb low, which deactivates sense amplifiers S/A_RD0 to S/A_RD2 (step S36). Then, the select gate decoder 30 selects select gate line SG1 corresponding to row address RA=R1 (step S37). As a result, the data is read from the prime cell PC at the intersection of word line/select gate line WL1/SG1 and read global bit line RGBL0 (step S38).

Then, the sense amplifier S/A not only amplifies data D10 read onto read global bit line RGBL0 and holds the amplified data in the flip-flop 87, but also outputs the amplified data as an output signal SA0 (step S39). On the other hand, since sense amplifiers S/A_RD0 to S/A_RD2 have been deactivated, they keep holding data R00", R01", R02" read at time t1, respectively (step S40). Therefore, output signals SAO0 to SAO2 remain at R00", R01", R02," respectively.

There is a fault in word line/select gate line WL1/SG1 corresponding to row address signal RA=R1 input at time t3 (step S41). This is the row to be replaced with redundancy read global bit line RGBL_RD0. Thus, the redundancy determination circuit 92-0 makes control signal FRD0 high. The control signals FRD1, FRD2 output from the other redundancy determination circuits 92-1, 92-2 are low. When control signal FRD0 goes high, this turns off the switch circuit 93 and turns on the switch circuit 94-0 (step S24). The switch circuits 94-1, 94-2 remain off. When the switch circuit 94-0 is turned on, this causes read-out data SAOR0=R00" held in sense amplifier S/A_RD0 to be sent to the output buffer 110 (step S25).

Next, at time t5, the row address signal RA changes from R1 to R2. At this time, the switch circuits 94-0 to 94-2 are turned off and the switch circuit 93 is turned on, which causes data D20 read onto read global bit line RGBL0 to be sent to the output buffer 110. This is the same as in FIG. 40.

Figure 42:
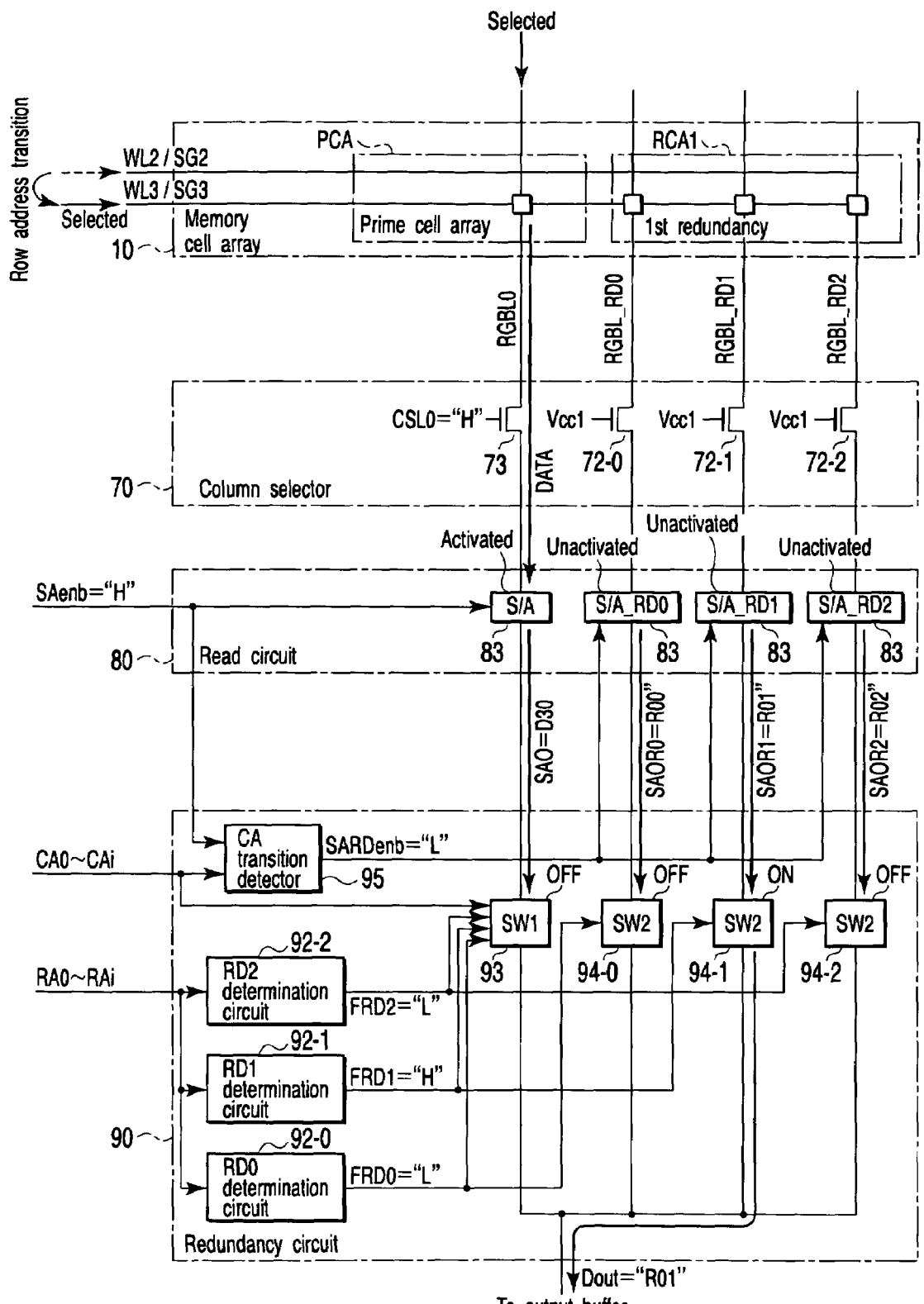

Next, at time t7, the row address signal RA changes from R2 to R3. At this time, the switch circuit 94-1 is turned on and the switch circuit 93 is turned off. This is shown in FIG. 42. Therefore, instead of data D30 read onto read global bit line RGBL0, data SAOR1=R01" held in sense amplifier S/A_RD1 is sent to the output buffer 110.

Next, at time t9, the row address signal RA changes from R3 to R4. At this time, the switch circuits 94-0 to 94-2 are turned off and the switch circuit 93 is turned on, which causes data D40 read onto read global bit line RGBL0 to be sent to the output buffer 110. This is the same as in FIG. 40.

Figure 43:
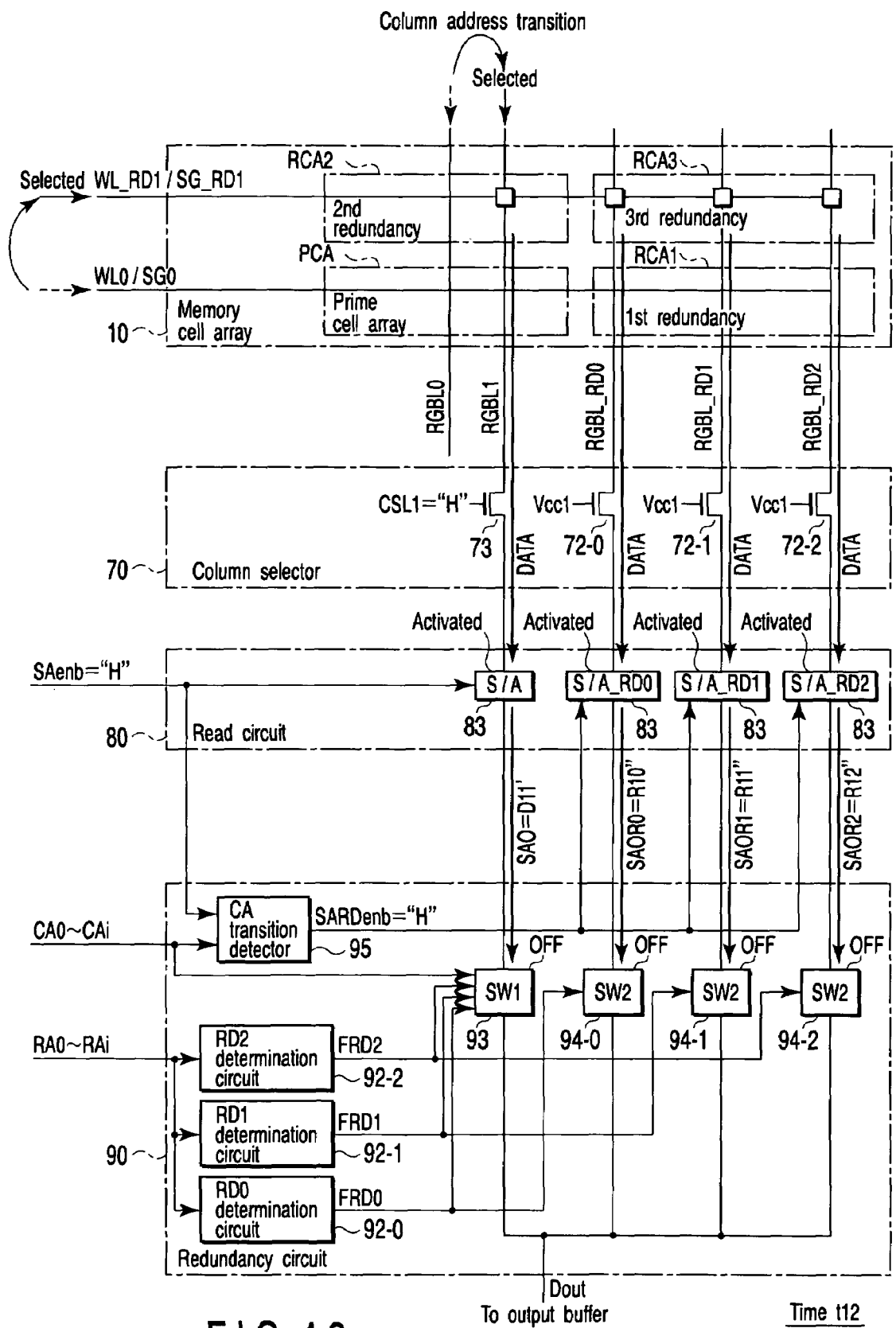

Next, at time t11, not only does the row address RA changes from R4 to R0, but also the column address signal CA changes from C0 to C1 (step S45). Then, at time t12, the sense amp enable signal SAenb is made high, which activates the sense amplifier S/A (step S30). FIG. 43 shows the state of the flash memory at time t12. As shown in FIG. 43, the sense amp enable signal SAenb is made high and the column address signal CA changes at time T11, with the result that the column address transition detector 95 makes the sense amp enable signal SARDenb high. Therefore, not only the sense amplifier S/A but also sense amplifiers S/A_RD0 to S/A_RD2 are activated (step S31). The select gate decoder 30 selects redundancy word line/select gate line WL_RD1/SG_RD1 to be replaced with read global bit line RGBL1 (step S32). As a result, the data is read from the prime cells PC and redundancy cells RC at the intersections of the redundancy word line/select gate line WL_RD1/SG_RD1 and the read global bit line RGBL1 and redundancy read global bit line RGBL_RD0 to RGBL_RD2 (step S33).

Then, the sense amplifier S/A not only amplifies data R11" read onto read global bit line RGBL1 and holds the amplified data in the flip-flop 87, but also outputs the amplified data as an output signal SA0. Similarly, the sense amplifiers S/A_RD0 to S/A_RD2 not only amplify data R10", R11", R12" read onto redundancy read global bit lines RGBL_RD0 to RGBL_RD2 respectively and hold the amplified data in the flip-flops 87 but also output the amplified data as output signals SAOR0 to SAOR2 (step S34).

However, at this time, the switch circuits 93, 94-0 to 94-2 are turned off, which prevents the signals SA0, SAOR0 to SAOR2 from being output to the output buffer.

Figure 44:
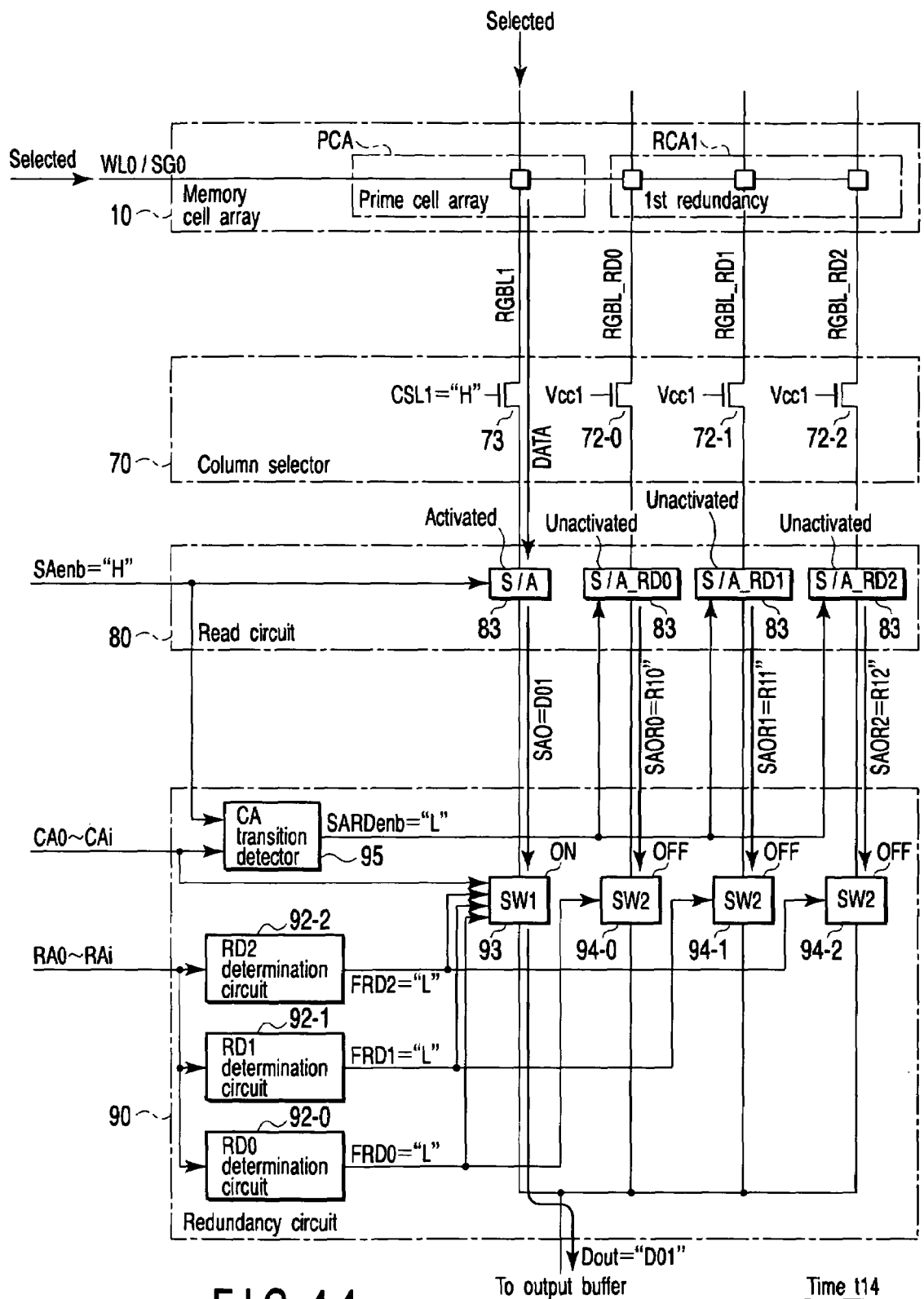

Next, at time t14, the sense amp enable signal SAenb is made high again, which activates the sense amplifier S/A (step S35). FIG. 44 shows the state of the flash memory at time t14. The column address signal CA and row address signal RA remain unchanged. Thus, the sense amp enable signal SAenb is made low, which deactivates sense amplifiers S/A_RD0 to S/A_RDh (step S36). Then, the select gate decoder 30 selects select gate line SG0 corresponding to row address RA R0 (step S37). As a result, the data is read from the prime cell PC at the intersection of word line/select gate line WL0/SG0 and read global bit line RGBL1 (step S38).

Then, the sense amplifier S/A not only amplifies data D01 read onto read global bit line RGBL1 and holds the amplified data in the flip-flop 87 but also outputs the amplified data as an output signal SA0 (step S39). Since sense amplifiers S/A_RD0 to S/A_RD2 have been deactivated, the flip-flops 87 keep holding data R10", R11", R12" read at time t1 (step S40).

Since there is no fault in word line/select gate line WL0/SG0 corresponding to row address signal RA=R0 input at time t11 (step S41), all of the redundancy determination circuits 92-0 to 92-2 make control signals FRD0 to FRD2 low, respectively. Accordingly, the switch circuits 94-0 to 94-2 are turned off and switch circuit 93 is turned on (step S22). As a result, output signal SA0=D01 of the sense amplifier S/A is sent via the switch circuit 93 to the output buffer 110 (step S23).

Figure 45:
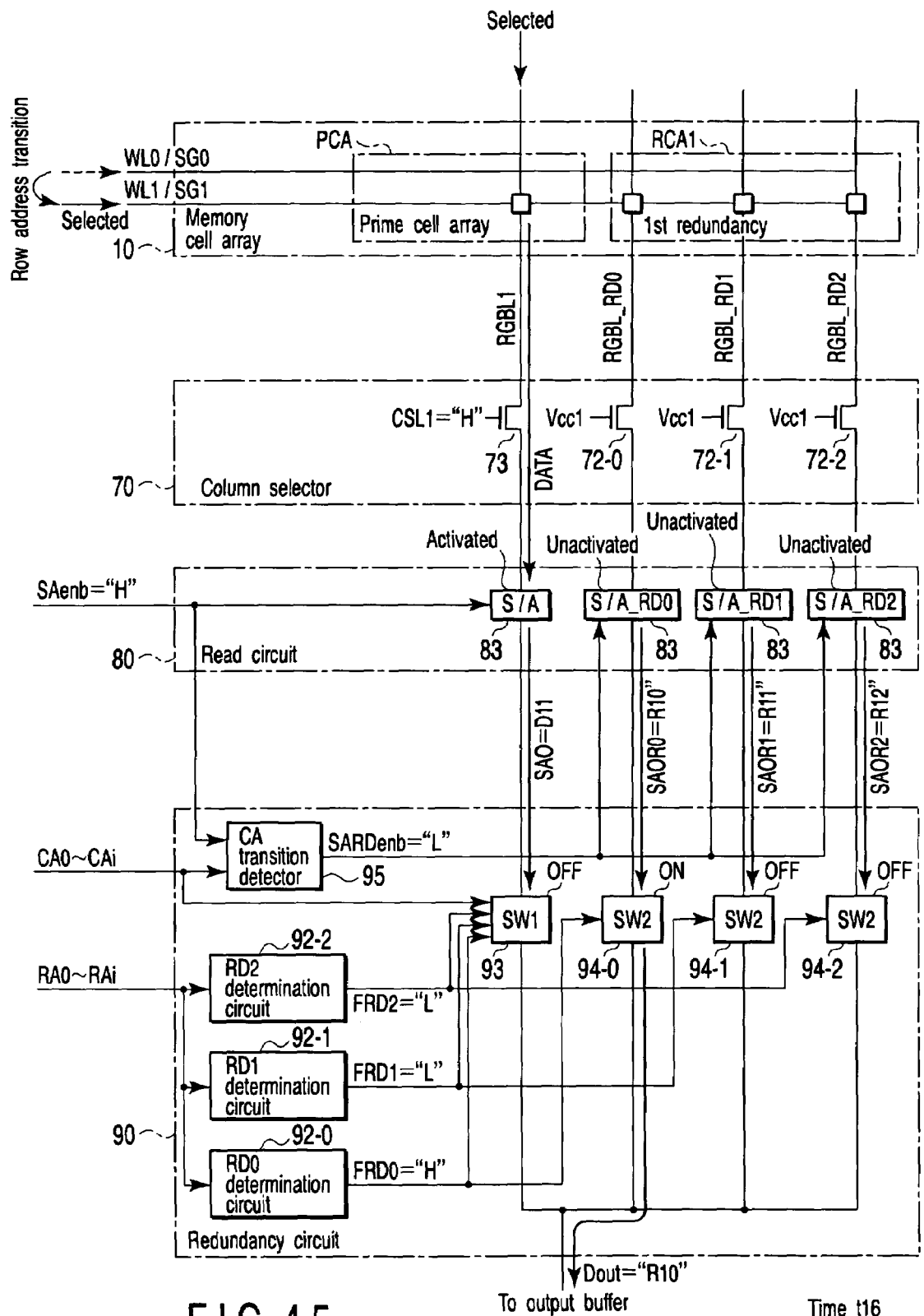

Next, at time t15, the row address signal RA changes from R0 to R1 (step S43). The column address signal CA remains at C1. Then, at time t16, the sense amp enable signal SAenb goes high, which activates the sense amplifier S/A (step S35). FIG. 45 shows the state of the flash memory at time t16. However, since the column address signal CA have made no change, the column address transition detector 95 makes the sense amp enable signal SARDenb low, which deactivates sense amplifiers S/A_RD0 to S/A_RD2 (step S36). Then, the select gate decoder 30 selects select gate line SG1 corresponding to row address RA=R1 (step S37). As a result, the data is read from the prime cell PC at the intersection of word line/select gate line WL1/SG1 and read global bit line RGBL1 (step S38).

Then, the sense amplifier S/A not only amplifies data D11 read onto read global bit line RGBL1 and holds the amplified data in the flip-flop 87 but also outputs the amplified data as an output signal SA0 (step S39). On the other hand, since sense amplifiers S/A_RD0 to S/A_RD2 have been deactivated, they keep holding data R10", R11", R12" read at time t14, respectively (step S40). Therefore, output signals SAO0 to SAO2 remain at R10", R11", R12".

There is a fault in word line/select gate line WL1/SG1 corresponding to row address signal RA=R1 input at time t15 (step S41). This is the row to be replaced with redundancy read global bit line RGBL_RD0. Thus, the redundancy determination circuit 92-0 makes control signal FRD0 high. The control signals FRD1, FRD2 output from the other redundancy determination circuits 92-1, 92-2 are low. When control signal FRD0 goes high, this turns off the switch circuit 93 and turns on the switch circuit 94-0 (step S24). The switch circuits 94-1, 94-2 remain off. When the switch circuit 94-0 is turned on, this causes read-out data SAOR0=R10" held in sense amplifier S/A_RD0 to be sent to the output buffer 110 (step S25).

Since the operations from this point on are the same as described above, a detailed explanation will not be given. When the column address signal CA changes, the column address transition detector 95 makes the sense amp enable signal SARDenb high, which activates sense amplifiers S/A_RD0 to S/A_RD2. However, at another time that the column address does not change, the sense amp enable signal SARDenb is made low, which deactivates sense amplifiers S/A_RD0 to S/A_RD2.

In this way, the read operation is carried out.

As described above, the flash memory according to the fourth embodiment produces the effects in item (1) to item (5) explained in the first embodiment. Hereinafter, the effect in item (1) in the fourth embodiment will be explained.

(1) The power consumption in a read operation can be decreased.

The flash memory according to the fourth embodiment includes the column address transition detector 95. In a read operation, only when the column address transition detector 95 detects a change in the column address CA, the sense amplifier S/A_RD is activated. Therefore, as described in FIG. 22 in the first embodiment, the frequency of activation of the sense amplifier S/A_RD can be reduced more remarkably than the frequency at which the sense amplifier S/A_RD is activated each time reading is done. As a result, the power consumption of the read operation 80 can be reduced.

As in the fourth embodiment, when a row in the prime cell array PCA is replaced with a column in the redundancy cell array RCA, it is necessary to read the data from the prime cells at the intersections of redundancy word lines and redundancy bit lines immediately after the column address is input. Therefore, as in the period between time t1 to time t2 in FIG. 38, a dead cycle unusable for reading might occur. However, when there is a fault in the prime cell corresponding to the first row address, the data read from a redundancy cell in that cycle can be used and therefore no dead cycle takes place.

While in the fourth embodiment, the explanation has been given using a 2Tr flash memory as an example, the present embodiment may, of course, be applied to a 3Tr-NAND flash memory explained in the second embodiment and a NAND flash memory explained in the third embodiment.

Figure 46:
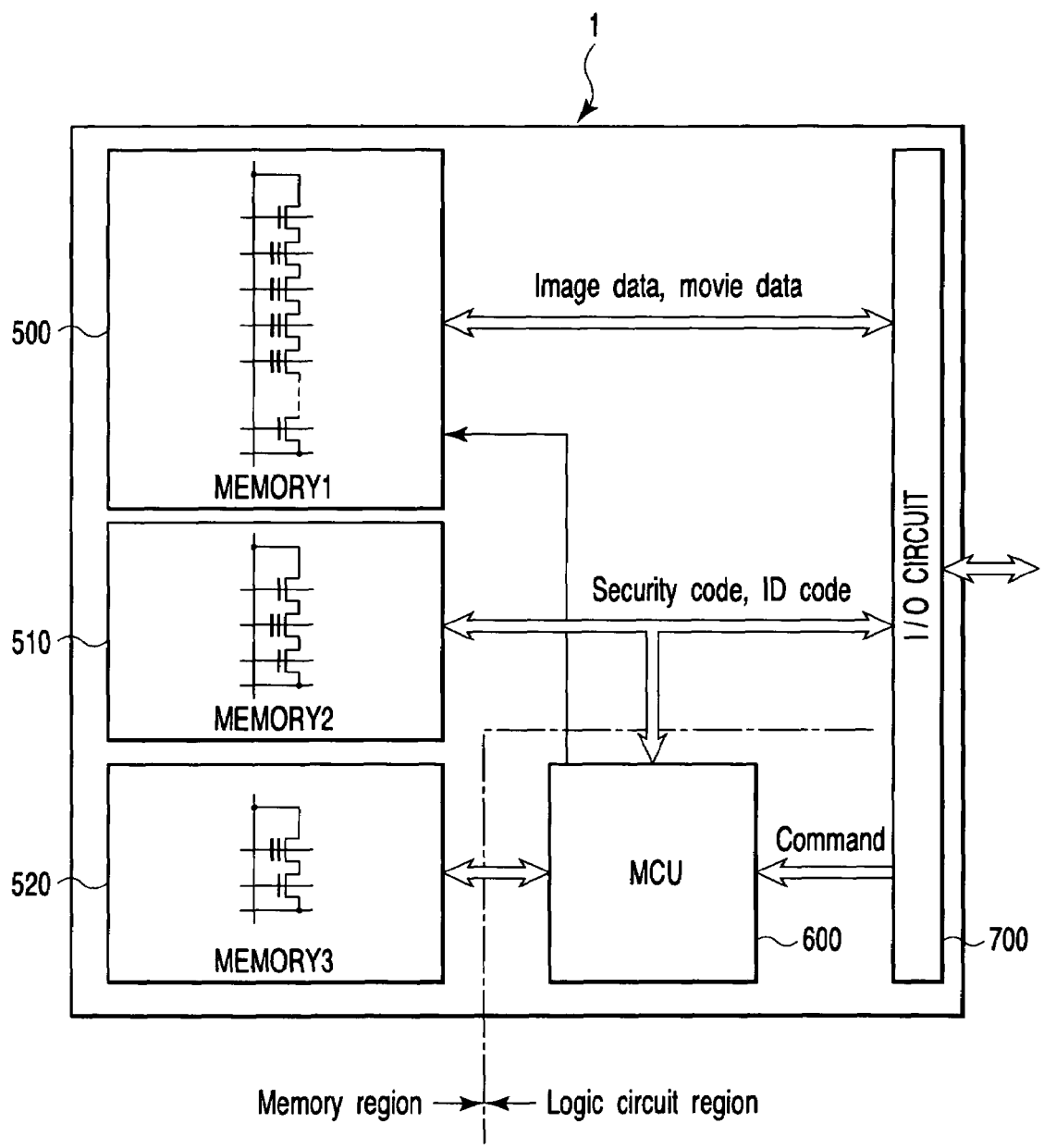
FIG. 46 is a block diagram of a system LSI according to a fifth embodiment of the present invention.

Next, a semiconductor memory device according to a fifth embodiment of the present invention will be explained. The fifth embodiment is related to an LSI in which a flash memory explained in each of the first to fifth embodiments is mounted on a single chip. FIG. 46 is a block diagram of a system LSI according to the fifth embodiment.

As shown in FIG. 46, a system LSI 1 comprises a NAND flash memory 500, a 3Tr-NAND flash memory 510, a 2Tr flash memory 520, an MCU 600, and an I/O circuit 700 formed on a single semiconductor substrate.

The NAND flash memory 500 is used as a storage memory for storing image data or video data. The configuration of the NAND flash memory is as explained in the third embodiment.

The 3Tr-NAND flash memory 510 holds an ID code for accessing the LSI 1 and a security code. The configuration of the 3Tr-NAND flash memory 510 is as explained in the second embodiment.

The 2Tr flash memory 520 holds program data for the MCU 600 to operate. The configuration of the 2Tr flash memory 520 is as explained in the first and fourth embodiments.

The MCU 600 does processing on the basis of the program read from the 2Tr flash memory 520, in response to various commands externally input. At this time, the MCU 600 accesses the 2Tr flash memory 520 directly without intervention of an SRAM (Static Random Access Memory) or the like. The processing done by the MCU 600 includes the compression or decompression of the data input to the NAND flash memory 500 and control of an external device. In addition, the MCU 600 reads specific data from the 3Tr-NAND flash memory 510, when the data held in the NAND flash memory 500 is accessed from the outside. Then, the MCU 600 checks the read-out data against the externally input ID code and security data. If they coincide with each other, the MCU 600 permits access to the NAND flash memory 500. When access to the NAND flash memory 500 is permitted, the data in the NAND flash memory 500 is accessed from the outside (host). Specifically, the MCU 600 triggers the NAND flash memory 500 in response to the command received from the outside, thereby reading (or writing) the data.

The I/O circuit 700 controls the exchange of signals between the LSI 1 and the outside.

Figure 47:
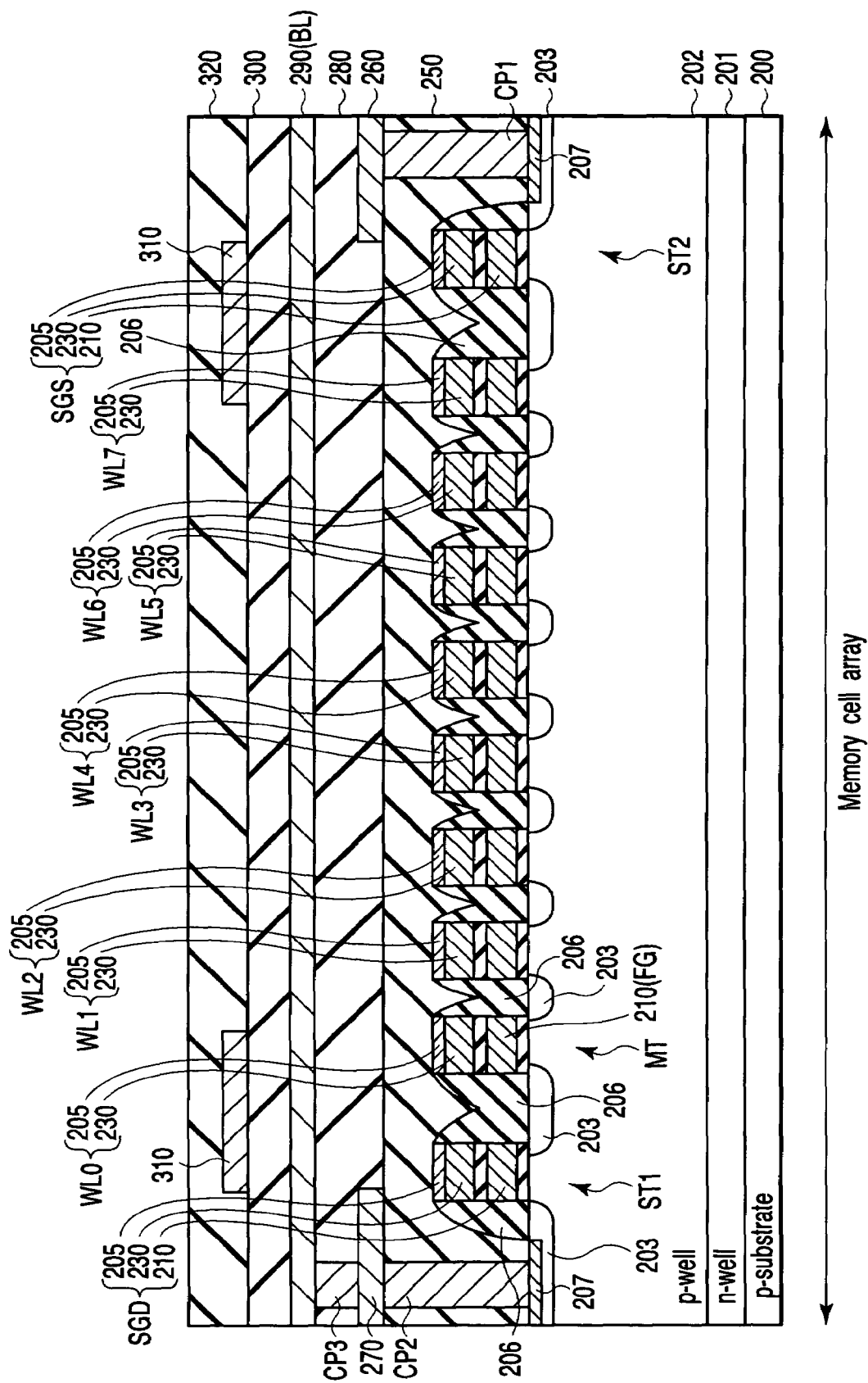
FIG. 47 is a sectional view, taken along a bit line, of a NAND flash memory according to the fifth embodiment.
Figure 48:
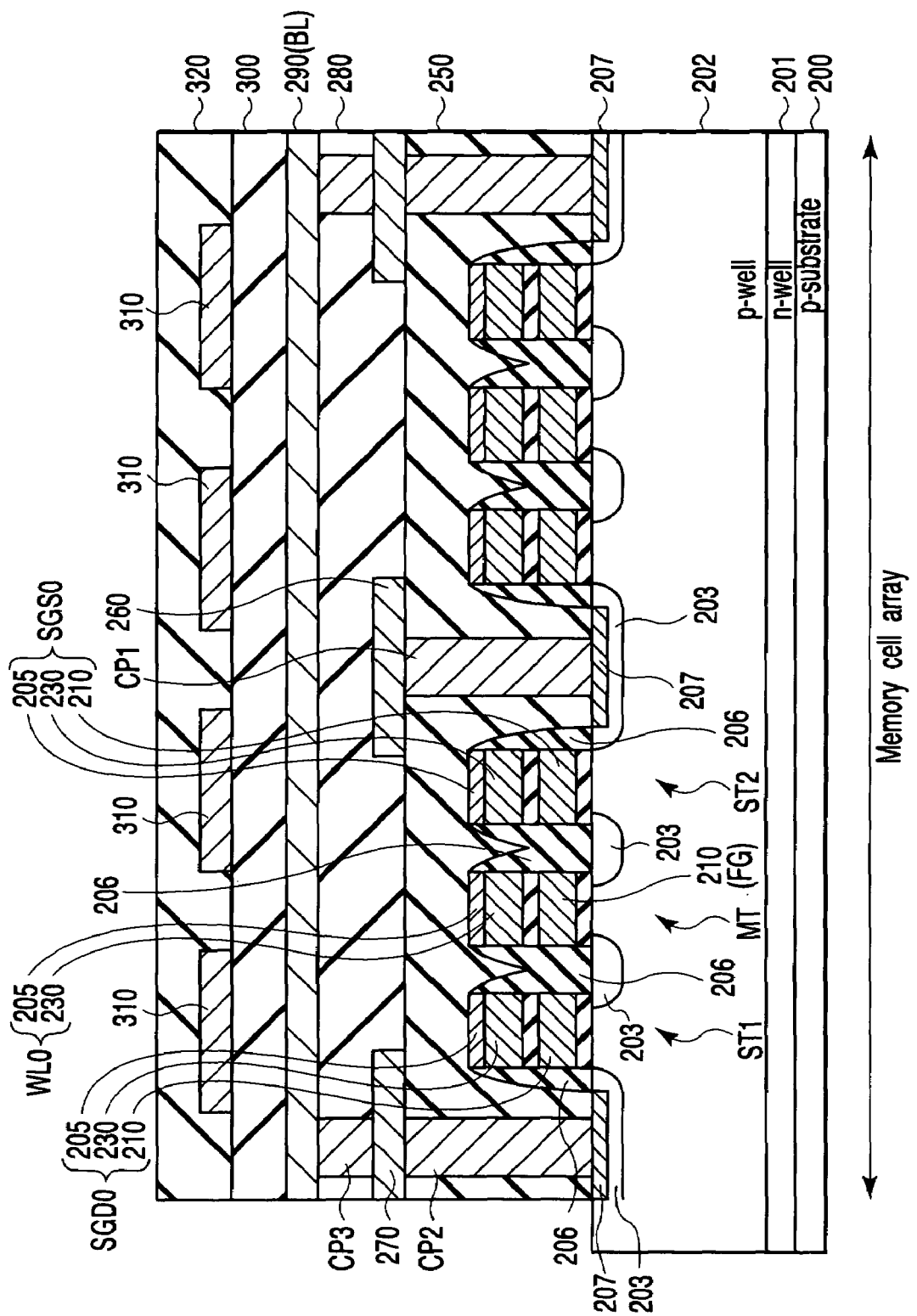
FIG. 48 is a sectional view, taken along a bit line, of a 3Tr-NAND flash memory according to the fifth embodiment.

FIGS. 47 to 49 are sectional views taken along a bit line, showing the configurations of the three semiconductor memories 500, 510, 520 included in the LSI 1, respectively.

<NAND Flash Memory>

The sectional structure of the memory cell array 10 of the NAND flash memory 500 is basically as explained in the fifth embodiment. As shown in FIG. 47, at the surfaces of the polysilicon layer 230 and impurity diffused layer 203, silicide layers 205, 207 may be formed respectively and a sidewall insulating film 206 may be formed on the sidewalls of the stacked gate. In a memory cell transistor MT, the polysilicon layer 230 and silicide layer 205 function as a control gate (or a word line WL).

The silicide layer 207 is formed at the surface of the drain region 203 of a select transistor ST1 and at the surface of the source region 203 of a select transistor ST2. No silicide layer is formed in the source and drain regions 203 of the memory cell transistor MT, in the source region 203 of the select transistor ST1, and in the drain region 203 of the select transistor ST2. The region between the stacked gates of adjacent memory cell transistors MT and the region between the stacked gates of the memory cell transistor MT and select transistors ST1, ST2 are filled with the sidewall insulating film 206. Thus, the top of the source and drain regions of the memory cell transistor MT, the top of the source region of the select transistor ST1, and the top of the drain region of the select transistor ST2 are covered with the sidewall insulating film 206.

<3Tr-NAND Flash Memory>

As shown in FIG. 48, on the polysilicon layer 230 and at the surface of the impurity diffused layer 203, silicide layers 205, 207 may be formed respectively. Then, a sidewall insulating film 206 may be formed on the sidewalls of the stacked gate. In a memory cell transistor MT, the polysilicon layer 230 and silicide layer 205 function as a control gate (or word line WL). No silicide layer is formed in the source and drain regions 203 of the memory cell transistor MT, in the source region 203 of the select transistor ST1, and in the drain region 203 of the select transistor ST2. The region between the stacked gates of the memory cell transistor MT and select transistors ST1, ST2 is filled with the sidewall insulating film 206. Thus, the top of the source and drain regions of the memory cell transistor MT, the top of the source region of the select transistor ST1, and the top of the drain region of the select transistor ST2 are covered with the sidewall insulating film 206.

<2Tr Flash Memory>

As shown in FIG. 49, on the polysilicon layer 230 and at the surface of the impurity diffused layer 203, silicide layers 205, 207 may be formed respectively. Then, a sidewall insulating film 206 may be formed on the sidewalls of the stacked gate. In a memory cell transistor MT, the polysilicon layer 230 and silicide layer 205 function as a control gate (or word line WL). No silicide layer is formed in the source region 203 of the memory cell transistor MT and in the drain region 203 of the select transistor ST. The region between the stacked gates of the memory cell transistor MT and select transistor ST is filled with the sidewall insulating film 206. Thus, the top of the source region of the memory cell transistor MT and the top of the drain region of the select transistor ST are covered with the sidewall insulating film 206.

As described above, the system LSI of this embodiment produces not only the effects in items (1) to item (5) explained in the first to fourth embodiments but also the effects described below.

(6) It is possible to embed a plurality of types of flash memories in a single chip, while suppressing the manufacturing cost.

With the configuration of the sixth embodiment, the memory cell transistors MT and select transistors ST1, ST2, ST included in the NAND flash memory 500, 3Tr-NAND flash memory 510, and 2Tr flash memory 520 are formed in the same processes. That is, the individual MOS transistors are formed in the same oxidizing process, film-forming process, impurity implanting process, photolithographic etching process. As a result, the gate insulating film, intergate insulating film, the floating gates and control gates of the memory cell transistors MT, and the select gates of the select transistors are the same in the three flash memories 500, 510, 520. In such a manufacturing method, the memory cell arrays of the three flash memories can be formed by the number of processes required to form a single flash memory. Therefore, the manufacturing cost of a system LSI including three types of semiconductor memories can be reduced.

(7) The performance of the system LSI can be made higher.

The system LSI of the sixth embodiment has the NAND flash memory 500, 3Tr-NAND flash memory 510, and 2Tr flash memory 520 as described above.

Unlike the NAND flash memory 500 and 3Tr-NAND flash memory 510, the 2Tr flash memory 520 uses a positive voltage (VPP=12V) and a negative voltage (VBB1=−7V, VBB2=−8V) in a write and an erase operation. That is, the potential difference applied across the gate insulating film of the MOS transistor used in the row decoder is 12V, −7V or −8V. Therefore, the gate insulating film of the MOS transistors used in the row decoder included in the 2Tr flash memory 520 may be thinner than that of the MOS transistors used in the row decoders included in the NAND flash memory 500 and 3Tr-NAND flash memory 510. Thus, the row decoder of the 2Tr flash memory can be made more compact. In addition, the operating speed of the row decoder can be made faster than that of the row decoders in the NAND flash memory 500 and 3Tr-NAND flash memory 510.

In this embodiment, the program data for the MCU 600 to operate is stored in the 2Tr flash memory 520. Thus, the 2Tr flash memory can operate at high speed as described above. The data can be read directly from the 2Tr flash memory 520 without the intervention of the MCU 600 or RAM. As a result; a RAM or the like is not needed, which helps simplify the configuration of the system LSI and improve the operating speed.

In addition, the 3Tr-NAND flash memory 510 holds an ID code and a security code. These code data are not so large in the amount of data, but are frequently changed and updated. Thus, the memory to hold the code data is required to operate at some high speed. In this respect, the 3Tr-NAND flash memory 510 uses a smaller erase unit than that in the NAND flash memory 500 and can rewrite the data in pages. Therefore, it can be said that the 3Tr-NAND flash memory 510 is the preferable semiconductor memory to hold the code data.

A conventional LSI including a NAND flash memory requires the following controller to prevent rewriting from concentrating on a specific block. The controller converts addresses input in ware leveling or logic form into physical addresses or, when a block malfunctions, determines the block to be faulty and performs control to prevent the faulty block from being used. In the sixth embodiment, however, such a controller is not needed. The reason is that the 2Tr flash memory 520 is caused to hold a firmware program to control the blocks in the NAND flash memory 500 and the MCU 600 is caused to perform such control. The MCU 600 performs the control in an interval of time between its original jobs (such as the process of controlling an external device or the process of computing the data input to the NAND flash memory 500). Of course, when the comparison of the capacity of the MCU 600 with the amount of work the MCU 600 has to process has shown that the amount of work has exceeded the capacity, a hardware sequencer or the like may be provided to control the NAND flash memory 500.

As described above, in a flash memory according to the embodiments, to remedy a faulty bit line with a redundancy bit line, a row address transition detector is provided. Only when the row address signal changes, the sense amplifier connected to the corresponding redundancy bit line is activated. In addition, to remedy a faulty word line with a redundancy bit line, a column address transition detector is provided. Only when the column address signal changes, the sense amplifier connected to the corresponding redundancy bit line is activated. Therefore, the power consumption of the flash memory can be reduced without activating uselessly the sense amplifiers connected to the redundancy bit lines.

Figure 50:
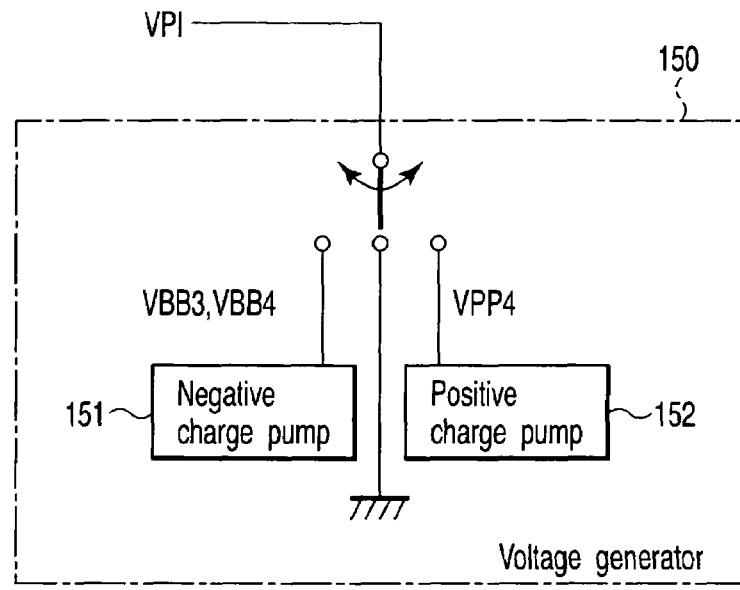
FIG. 50 is a block diagram of the voltage generator included in a flash memory according to a modification of the first to fifth embodiments.
Figure 51:
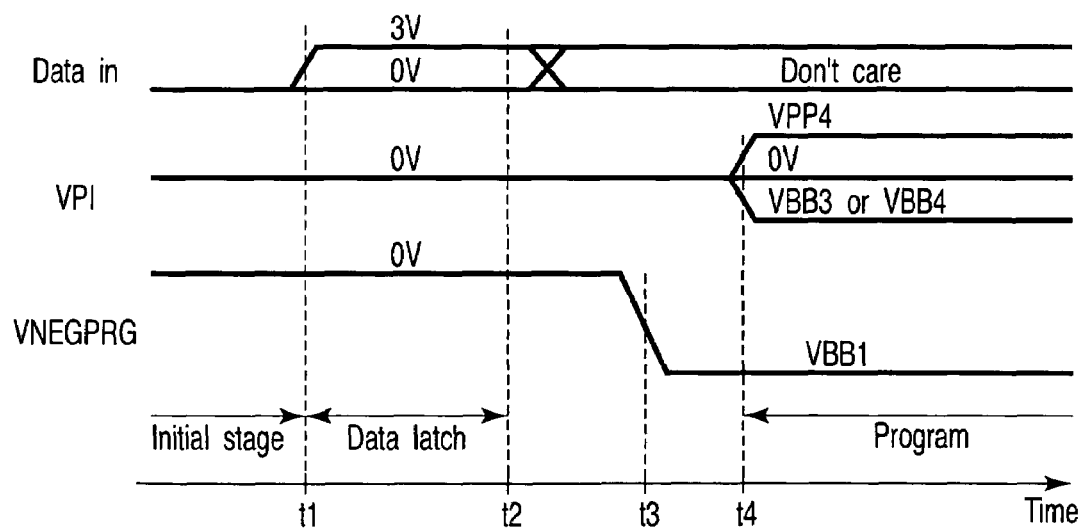
FIG. 51 is a timing chart for various signals in a write operation of the flash memory according to the modification of the first to fifth embodiments.

Furthermore, in the 2Tr flash memory according to each of the first and fourth embodiments, 0V has been used as the write inhibit voltage VPI. However, not only 0V but also a positive voltage or a negative voltage may be used as the write inhibit voltage VPI. FIG. 50 shows a circuit configuration in such a case. FIG. 51 is a timing chart for VPI.

As shown in FIG. 50, the voltage generator 150 includes a charge pump circuit 151 which generates a negative potential and a charge pump circuit 152 which generates a positive potential. The charge pump circuit 151 generates the negative potentials VBB3, VBB4. The charge pump circuit 152 generates the positive potential VPP4. Then, a switch connects the output nodes of these voltages and the ground potential node to VPI node suitably, which enables the voltage most suitable for the situation to be used as the write inhibit voltage VPI.

Moreover, while in the 2Tr flash memory of the embodiments, the bit lines have been hierarchized, the present invention is not limited to this. However, when the bit lines are hierarchized, it is desirable that the write global bit lines should be set to 0V in a read operation. Therefore, in a read operation, it is desirable that the write circuit 50 should be in the initial state. Putting the write circuit in the initial state enables the potential on the write global bit lines to be set to 0V. Setting the write global bit lines to 0V protects the read global bit lines from noise in a read operation, which enables the read operation to be made more stable. Therefore, the operation reliability of the flash memory can be improved.

Figure 52:
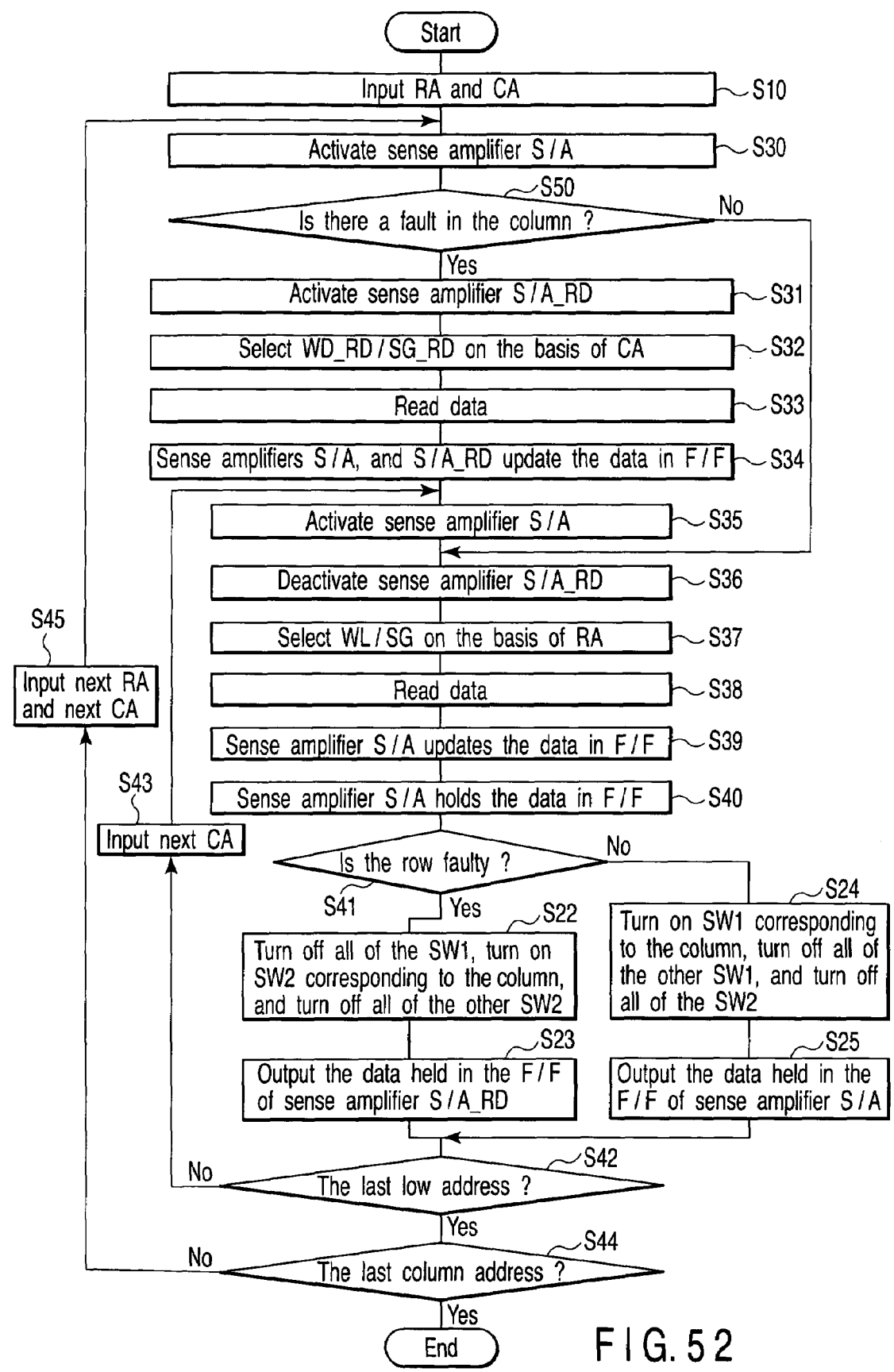
FIG. 52 is a flowchart for a read operation of a flash memory according to a modification of the fourth embodiment.

Furthermore, in the fourth embodiment, a process as shown in FIG. 52 may be carried out. Specifically, after the sense amplifier S/A is activated in step S30, it is determined whether there is a fault in any one of the prime cells connected to the read global bit line corresponding to the input column address. If there is a fault, control is passed to step S31, since the row has to be replaced with a redundancy bit line. Conversely, if there is no fault, it is not necessary to replace the row with a redundancy bit line. Therefore, in this case, control is passed to step S36. With this method, when a column without a fault is sensed, the sense amplifier S/A_RD is always deactivated, which decreases the power consumption more and prevents a dead cycle from occurring.

While in the above embodiments, a flash memory has been used as an example, the present invention may be applied to other ordinary semiconductor memory devices, including DRAM and MRAM.

Next, an application of the flash memory will be explained. FIG. 53 shows an example of a memory card. As shown in FIG. 53, the memory card 900 includes a flash memory 3 (3Tr-NAND flash memory, NAND flash memory, or 2Tr flash memory) explained in the above embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Another exemplary implementation is shown in FIG. 54. The memory card shown in FIG. 54 differs from the memory card presented in FIG. 53 in that the memory card of FIG. 54 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 55:
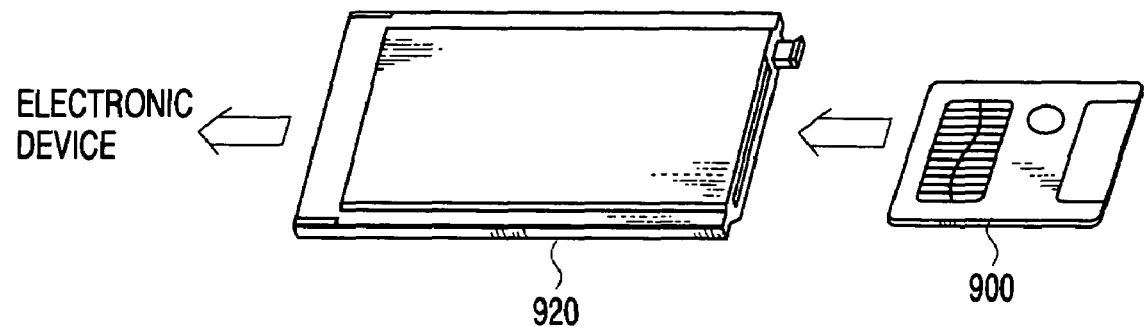
FIG. 55 shows an outer appearance of a memory card including a flash memory according to the first to fifth embodiments and a card holder.

FIG. 55 shows another application. As shown in FIG. 55, the memory card 900 is inserted into a cardholder 920, which is then connected to electronic equipment (not shown). The cardholder 920 may have a part of the function of the controller 910.

Figure 56:
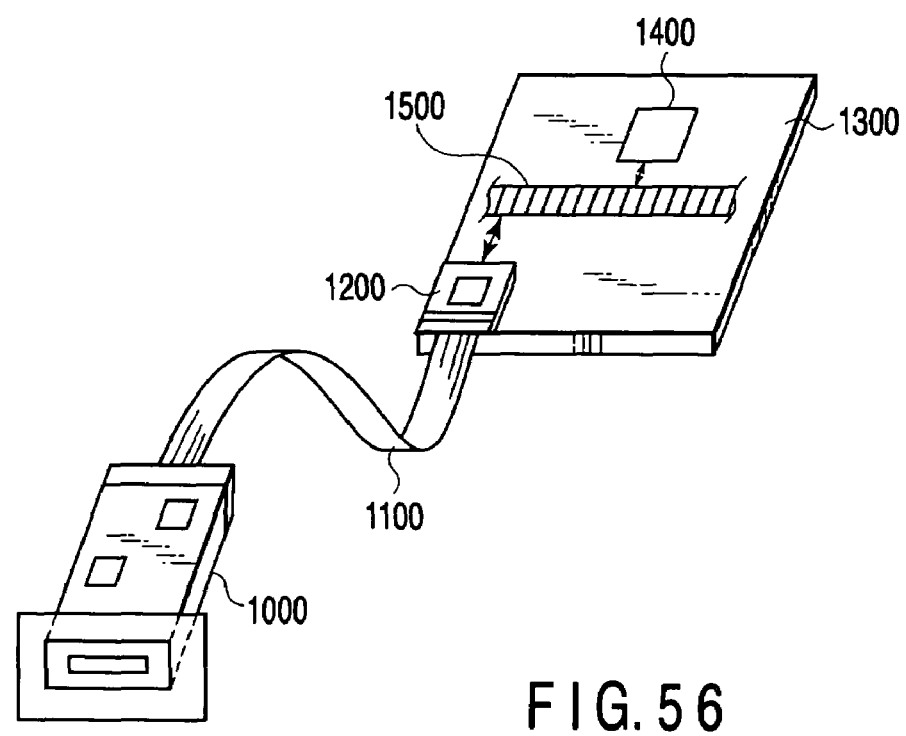
FIG. 56 shows an outer appearance of a connection unit which connects with a memory card including a flash memory according to the first to fifth embodiments.

FIG. 56 shows another application. As shown in FIG. 56, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 57:
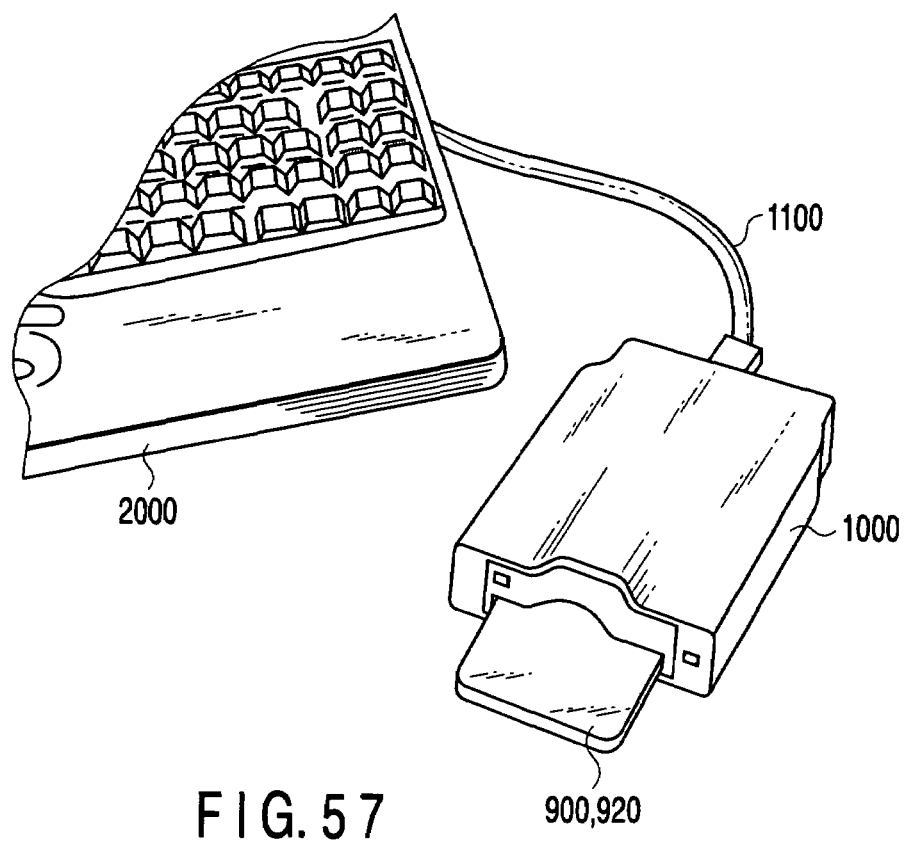
FIG. 57 shows an outer appearance of a connection unit which connects with a memory card including a flash memory according to the first to fifth embodiments.

FIG. 57 shows another application. The memory card 900 or the cardholder 920 in which the memory card 900 has been inserted is inserted into the connection unit 1000. The connection unit 1000 is connected to a personal computer 2000 via the connection cable 1100.

Figure 58:
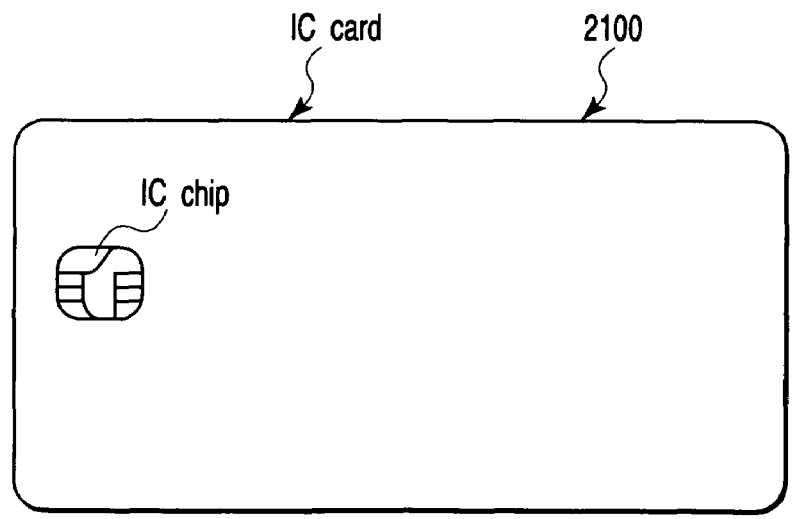
FIG. 58 shows an outer appearance of an IC card including a flash memory according to the first to fifth embodiments.
Figure 59:
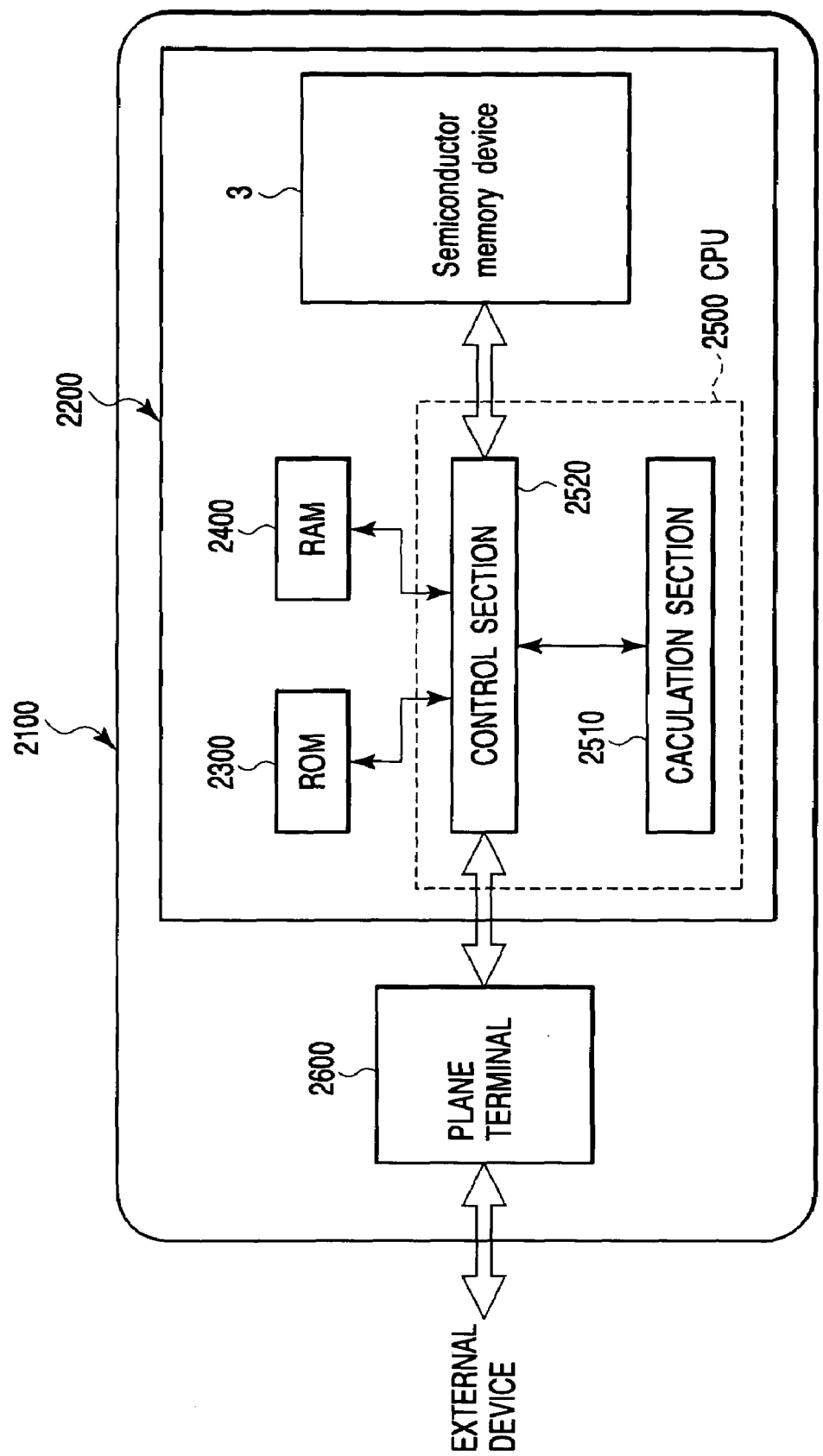
FIG. 59 is a block diagram of an IC card including a flash memory according to the first to fifth embodiments.

FIGS. 58 and 59 show another application. As shown in FIGS. 58 and 59, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device which remedies a fault by replacing a column in a memory cell array with a redundancy bit line, the semiconductor memory device comprising:
    a row address transition detector which detects a change in a row address signal for selecting the row direction of the memory cell array, the redundancy bit line being sensed only when a change in the row address signal is detected by the row address transition detector.

2. The semiconductor memory device according to claim 1, further comprising a determination circuit which determines whether to replace the column in the memory cell array with the redundancy bit line, on the basis of a column address signal for selecting a column direction of the memory cell array.

3. The semiconductor memory device according to claim 1, further comprising a holding circuit which holds the result of sensing the redundancy bit line,
    wherein the operation of reading data from the memory cell array is carried out in synchronization with a clock signal, and
    when the row address signal is constant for a period of cycles of the clock signal, the redundancy bit line is sensed only for a part of the period of cycles including the first cycle after the input of the row address signal, and
    the holding circuit continues holding the result of sensing in the part of the period until the row address signal is changed.

4. The semiconductor memory device according to claim 1, further comprising redundancy sense amplifiers which are provided for the redundancy bit lines in a one-to-one correspondence and amplify the data read from the redundancy cells connected to the redundancy bit lines,
    wherein the row address transition detector activates the redundancy sense amplifier only when detecting a change in the row address signal.

5. The semiconductor memory device according to claim 4, further comprising:
    sense amplifiers which are provided for the bit lines in a one-to-one correspondence and which amplify the data read from the memory cells connected to the bit lines;
    a determination circuit which determines whether to replace the data read into the sense amplifiers with the data read into the redundancy sense amplifiers; and a switch circuit which, on the basis of the result of the determination at the determination circuit, reads the data from either the sense amplifier or the redundancy sense amplifier.

6. The semiconductor memory device according to claim 5, wherein the row address transition detector includes
flip-flops which are provided for the bits in the row address signal in a one-to-one correspondence and store the respective bits in the row address signal,
first logic circuits which are provided for the bits in the row address signal in a one-to-one correspondence and which carry out the exclusive-OR operation of each bit in the row address signal with the output of the corresponding one of the flip-flops,
a second logic circuit which carries out the OR operation of the outputs of the first logic circuits, and
a third logic circuit which carries out the AND operation of a sense amp enable signal for enabling the sense amplifier with the second logic circuit.

7. The semiconductor memory device according to claim 5, wherein the determination circuit compares the column address signal with a faulty column address and, if they coincide with each other, controls the switch circuit so as to select the outputs of the redundancy sense amplifiers and, if they do not coincide with each other, controls the switch circuit so as to select the outputs of the sense amplifiers.

8. The semiconductor memory device according to claim 1, wherein the memory cell array has a plurality of memory cells provided in a matrix,
each of the memory cells includes a first MOS transistor which has a charge accumulation layer and a control gate and a second MOS transistor having a drain connected to the first MOS transistor and has data written into it by injecting electrons into the charge accumulation layer by FN tunneling, and
the semiconductor memory device further comprises word lines each of which connects commonly the control gates of the first MOS transistors in a same row, and
select gate lines each of which connects commonly the gates of the second MOS transistors in a same row.

9. A semiconductor memory device comprising:
a memory cell array including a plurality of memory cells arranged in a matrix, each of which includes a first MOS transistor having a charge accumulation layer and a control gate and a second MOS transistor having a drain connected to a source of the first MOS transistor;
bit lines each of which electrically connects commonly the drains of the first MOS transistors in a same column;
a redundancy cell array which includes a plurality of redundancy cells, each including a third MOS transistor having a charge accumulation layer and a control gate and a fourth MOS transistor having a drain is connected to a source of the first MOS transistor, and which replaces a faulty column in the memory cell;
redundancy bit lines each of which electrically connects commonly the drains of the third MOS transistors in a same column;
word lines each of which connects commonly the control gates of the first and third MOS transistors in a same row;
select gate lines each of which connects commonly the gates of the second and fourth MOS transistors in a same row;
redundancy sense amplifiers which are provided for the redundancy bit lines in a one-to-one correspondence and amplify the data read from the redundancy cells; and
a row address transition detector which detects a change in a row address signal for selecting the row direction of the memory cell array and activates the redundancy sense amplifier only when the row address signal changes.

10. The semiconductor memory device according to claim 9, further comprising a determination circuit which determines whether to replace a column in the memory cell array with the redundancy bit line, on the basis of a column address signal for selecting the column direction of the memory cell array.

11. The semiconductor memory device according to claim 9, further comprising a holding circuit which holds the result of sensing the redundancy bit line,
wherein the operation of reading data from the memory cell array is carried out in synchronization with a clock signal, and
when the row address signal is constant for a period of cycles of the clock signal, the redundancy bit line is sensed only in a part of the period of cycles including the first cycle after the input of the row address signal, and
the holding circuit continues holding the result of sensing in the part of the period until the row address signal is changed.

12. The semiconductor memory device according to claim 9, further comprising:
sense amplifiers which are provided for the bit lines in a one-to-one correspondence and which amplify the data read from the memory cells connected to the bit lines;
a determination circuit which determines whether to replace the data read into the sense amplifiers with the data read into the redundancy sense amplifiers; and
a switch circuit which, on the basis of the result of the determination at the determination circuit, reads the data from either the sense amplifiers or the redundancy sense amplifiers.

13. The semiconductor memory device according to claim 12, wherein the row address transition detector includes
flip-flops which are provided for the bits in the row address signal in a one-to-one correspondence and store the respective bits in the row address signal,
first logic circuits which are provided for the bits in the row address signal in a one-to-one correspondence and which carry out the exclusive-OR operation of each bit in the row address signal with the output of the corresponding one of the flip-flops,
a second logic circuit which carries out the OR operation of the outputs of the first logic circuits, and
a third logic circuit which carries out the AND operation of a sense amp enable signal for enabling the sense amplifiers with the second logic circuit.

14. The semiconductor memory device according to claim 12, wherein the determination circuit compares the column address signal with a faulty column address and, if they coincide with each other, controls the switch circuit so as to select the outputs of the redundancy sense amplifiers and, if they do not coincide with each other, controls the switch circuit so as to select the outputs of the sense amplifiers.

15. A semiconductor memory device which remedies a fault by replacing a row in a memory cell array with a redundancy bit line, the semiconductor memory device comprising:

a column address transition detector which detects a change in a column address signal for selecting the column direction of the memory cell array, the redundancy bit line being sensed only when a change in the column address signal is detected by the column address transition detector.

16. The semiconductor memory device according to claim 15, further comprising redundancy sense amplifiers which are provided for the redundancy bit lines in a one-to-one correspondence and amplify the data read from the redundancy cells connected to the redundancy bit line, wherein the column address transition detector activates the redundancy sense amplifier only when detecting a change in the column address signal.

17. The semiconductor memory device according to claim 15, further comprising a determination circuit which determines whether to replace a row in the memory cell array with the redundancy bit line, on the basis of a row address signal for selecting the row direction of the memory cell array.

18. The semiconductor memory device according to claim 15, further comprising a holding circuit which holds the result of sensing the redundancy bit line, wherein the operation of reading data from the memory cell array is carried out in synchronization with a clock signal, and when the column address signal is constant for a period of cycles of the clock signal, the redundancy bit line is sensed only in a part of the period of cycles including the first cycle after the input of the column address signal, and the holding circuit continues holding the result of sensing in the part of the period until the column address signal is changed.

19. A memory card comprising a semiconductor memory device recited in claim 1.

20. The memory card according to claim 19, further comprising a control device which controls the semiconductor memory device.

* * * * *